US012787542B2

(12) United States Patent
Yamazaki et al.

(10) Patent No.: US 12,787,542 B2
(45) Date of Patent: Nov. 3, 2026

(54) LIGHT-EMITTING ELEMENT, DISPLAY APPARATUS, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Shingo Eguchi, Atsugi (JP); Hideki Uochi, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 292 days.

(21) Appl. No.: 18/271,350

(22) PCT Filed: Jan. 6, 2022

(86) PCT No.: PCT/IB2022/050073
§ 371 (c)(1),
(2) Date: Jul. 7, 2023

(87) PCT Pub. No.: WO2022/153144
PCT Pub. Date: Jul. 21, 2022

(65) Prior Publication Data
US 2024/0306423 A1 Sep. 12, 2024

(30) Foreign Application Priority Data
Jan. 14, 2021 (JP) ................................ 2021-004491
Jan. 14, 2021 (JP) ................................ 2021-004502

(51) Int. Cl.
*H05B 33/22* (2006.01)
*H10K 50/115* (2023.01)
(Continued)

(52) U.S. Cl.
CPC ........... *H10K 59/12* (2023.02); *H10K 50/115* (2023.02); *H10K 50/826* (2023.02); *H10K 50/844* (2023.02); *H10K 50/858* (2023.02)

(58) Field of Classification Search
CPC ............ G02F 1/136286; G02F 1/1365; G02F 1/1347; G02F 1/13452; G02F 1/13458
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 104037357 A 9/2014
CN 109509765 A 3/2019
(Continued)

OTHER PUBLICATIONS

International Search Report (Application No. PCT/IB2022/050073) dated May 17, 2022.
(Continued)

*Primary Examiner* — Donald L Raleigh
(74) *Attorney, Agent, or Firm* — Husch Blackwell LLP

(57) ABSTRACT

Provided is a novel light-emitting element. The light-emitting element includes an anode, an EL layer over the anode, and a cathode over the EL layer; a first layer is adjacent to a side surface of the EL layer, and a first portion is adjacent to the side surface of the first layer. The EL layer and the first portion are adjacent to each other with the first layer therebetween. A refractive index of the first portion is lower than a refractive index of the first layer. An angle θ between a bottom surface and the side surface of the EL layer is larger than 90°.

7 Claims, 27 Drawing Sheets

(51) Int. Cl.

| | |
|---|---|
| ***H10K 50/826*** | (2023.01) |
| ***H10K 50/844*** | (2023.01) |
| ***H10K 50/858*** | (2023.01) |
| ***H10K 59/12*** | (2023.01) |

(56) References Cited

U.S. PATENT DOCUMENTS

| | | | | |
|---|---|---|---|---|
| 7,091,658 | B2 | 8/2006 | Ito et al. | |
| 7,274,140 | B2 | 9/2007 | Ito et al. | |
| 7,399,991 | B2 | 7/2008 | Seo et al. | |
| 9,716,208 | B2 * | 7/2017 | Dozen | H10H 20/01 |
| 10,334,692 | B2 | 6/2019 | Kikuchi | |
| 10,368,418 | B2 | 7/2019 | Kikuchi | |
| 10,553,657 | B2 | 2/2020 | Managaki | |
| 10,700,140 | B2 | 6/2020 | Lim et al. | |
| 11,284,483 | B2 | 3/2022 | Kikuchi | |
| 11,678,550 | B2 | 6/2023 | Kato | |
| 11,968,754 | B2 | 4/2024 | Kikuchi | |
| 12,096,671 | B2 | 9/2024 | Kato | |
| 12,324,064 | B2 | 6/2025 | Kikuchi | |
| 2002/0072139 | A1 | 6/2002 | Kashiwabara | |
| 2003/0232563 | A1 | 12/2003 | Kamiyama et al. | |
| 2004/0183436 | A1 | 9/2004 | Ito et al. | |
| 2006/0261729 | A1 | 11/2006 | Ito et al. | |
| 2011/0148290 | A1 | 6/2011 | Oota | |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 * | 3/2015 | Sato | H10K 59/122<br>438/34 |
| 2015/0076476 | A1 | 3/2015 | Odaka et al. | |
| 2016/0172595 | A1 | 6/2016 | Malinowski et al. | |
| 2016/0276418 | A1 * | 9/2016 | Xu | H10K 59/879 |
| 2016/0315133 | A1 | 10/2016 | Sato | |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2019/0067394 | A1 | 2/2019 | Cheon et al. | |
| 2019/0165058 | A1 | 5/2019 | Managaki et al. | |
| 2020/0203662 | A1 * | 6/2020 | Mollard | H10K 59/876 |
| 2025/0008802 | A1 | 1/2025 | Kato | |

FOREIGN PATENT DOCUMENTS

| | | | |
|---|---|---|---|
| EP | 3496176 | A | 6/2019 |
| JP | 2000-036385 | A | 2/2000 |
| JP | 2000-113981 | A | 4/2000 |
| JP | 2000-113982 | A | 4/2000 |
| JP | 2002-324673 | A | 11/2002 |
| JP | 2003-059663 | A | 2/2003 |
| JP | 2003-157973 | A | 5/2003 |
| JP | 2004-288447 | A | 10/2004 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-123527 | A | 7/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-102153 | A | 6/2019 |
| JP | 2019-179696 | A | 10/2019 |
| JP | 2020-160305 | A | 10/2020 |
| KR | 2019-0038143 | A | 4/2019 |
| KR | 2019-0066359 | A | 6/2019 |
| WO | WO-2014/148263 | | 9/2014 |
| WO | WO 2015/184712 | A1 | 12/2015 |
| WO | WO 2018/087625 | A1 | 5/2018 |
| WO | WO 2019/066285 | A2 | 4/2019 |
| WO | WO-2020/004086 | | 1/2020 |

OTHER PUBLICATIONS

Written Opinion (Application No. PCT/IB2022/050073) dated May 17, 2022.

Zakhidov, A. et al., "Orthogonal Processing: A new Strategy for Organic Electronics," Chemical Science, Apr. 7, 2011, vol. 2, No. 6, pp. 1178-1182.

Malinowski, P. et al., "High Resolution Photolithography for Direct View Active Matrix Organic Light-Emitting Diode Augmented Reality Displays," Journal of the Society for Information Display, Apr. 2, 2018, vol. 26, No. 3, pp. 128-136.

Malinowski, P. et al., "Photolithographic Patterning of Organic Photodetectors with a Non-Fluorinated Photoresist System," Organic Electronics, Jul. 12, 2014, vol. 15, No. 10, pp. 2355-2359.

Malinowski, P. et al., "Multicolor 1250 ppi OLED Arrays Patterened by Photolithography," SID Digest '16: SID International Symposium Digest of Technical Papers, May 22, 2016, vol. 47, No. 1, pp. 1009-1012.

Papadopoulos, N. et al., "AMOLED Displays with In-Pixel Photodetector," Liquid Crystals and Display Technology, Jul. 9, 2020, pp. 1-19.

Ke, T. et al., "Technology Developments in High-Resolution FMM-free OLED and BEOL IGZO TFTs for Power-Efficient Microdisplays," SID Digest '21: SID International Symposium Digest of Technical Papers, May 1, 2021, vol. 52, No. 1, pp. 127-130.

Malinowski, P. et al., "Integration of Additional Functionalities into the Frontplane of AMOLED Displays," SID Digest '20: SID International Symposium Digest of Technical Papers, Aug. 1, 2020, vol. 51, No. 1, pp. 646-649.

Malinowski, P. et al., "Organic Photolithography for Displays with Integrated Fingerprint Scanner," SID Digest '19: SID International Symposium Digest of Technical Papers, May 29, 2019, vol. 50, No. 1, pp. 1007-1010.

Ke, T. et al., "Island and Hole Fabrication on OLED Stack for High-Resolution Sensor in Display Application", IDW '20: Proceedings of the 27th International Display Workshops, Dec. 9, 2020, vol. 27, pp. 902-905.

Gather, M, et al., "Solution-Processed Full-Color Polymer-OLED Displays Fabricated by Direct Photolithography," SID Digest '06: SID International Symposium Digest of Technical Papers, Jun. 1, 2006, vol. 37, No. 1, pp. 909-911.

Malinowski, P. et al., "Photolithography as Enabler of AMOLED Displays Beyond 1000 ppi," SID Digest '17: SID International Symposium Digest of Technical Papers, May 1, 2017, vol. 48, No. 1, pp. 623-626.

* cited by examiner

FIG. 18A
Intermediate state
New crystalline phase
| Amorphous | Crystalline | Crystal |
| --- | --- | --- |
| ・completely amorphous | ・CAAC<br>・nc<br>・CAC<br>excluding single crystal and poly crystal | ・single crystal<br>・poly crystal |
FIG. 18B
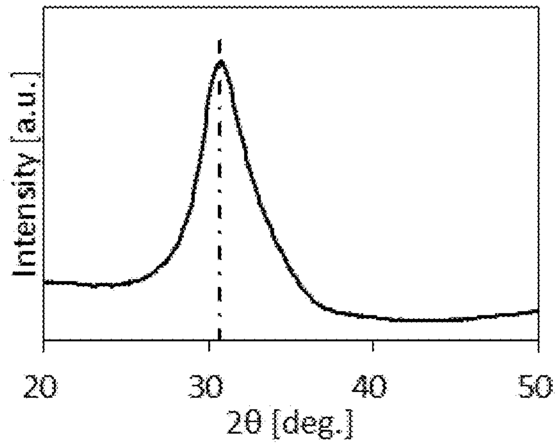
FIG. 18C
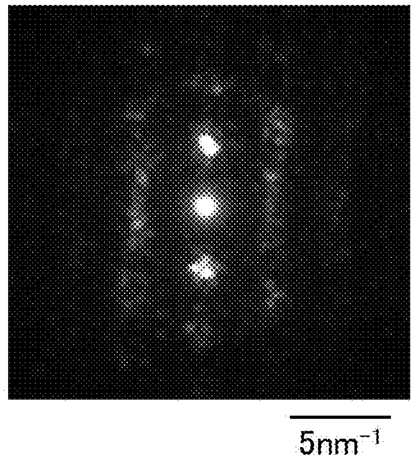

LIGHT-EMITTING ELEMENT, DISPLAY APPARATUS, AND ELECTRONIC DEVICE

This application is a 371 of international application PCT/IB2022/050073 filed on Jan. 6, 2022, which is incorporated herein by reference.

TECHNICAL FIELD

One embodiment of the present invention relates to a light-emitting element, a display apparatus, and an electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

An active-matrix display apparatus where a transistor for driving a display element is provided in each pixel is known as a display apparatus. For example, an active-matrix liquid crystal display apparatus (also referred to as a "liquid crystal display") that uses a liquid crystal element as a display element, an active-matrix light-emitting display apparatus (also referred to as an "organic EL display") that uses a light-emitting element such as an organic EL element as a display element, and the like are known.

An organic EL display is a self-luminous display apparatus, and thus has a wider viewing angle and higher responsiveness than a liquid crystal display. In addition, an organic EL display does not need a backlight, which makes it easy to achieve a reduction in weight, thickness, power consumption, or the like of the display apparatus and leads to an active research in recent years. An organic EL element functioning as a pixel has a structure where an anode and a cathode overlap with each other with a light-emitting layer therebetween. Furthermore, in an organic EL display, a partition is provided between adjacent pixels to prevent electric interference between adjacent light-emitting layers (Patent Document 1).

In the case where an organic EL layer such as a light-emitting layer is formed using a low molecular material, a method performed by a vacuum evaporation method using a metal mask is known (Patent Document 2).

REFERENCES

Patent Documents

[Patent Document 1] Japanese Published Patent Application No. 2014-123527
[Patent Document 2] Japanese Published Patent Application No. 2003-157973

SUMMARY OF THE INVENTION

Problems to be Solved by the Invention

A partition (also referred to as an "embankment" or a "bank") provided between pixels offers effects such as an improvement in display quality and a reduction in power consumption of a display apparatus. By contrast, a certain amount of partition is needed to obtain a sufficient effect, which has made a reduction in area occupied by the partition difficult, and made an improvement in pixel aperture ratio, an increase in resolution, a reduction in size, and the like difficult.

In addition, a metal mask is inferior to a resist mask in the size accuracy; thus, formation of a light-emitting layer for each pixel with the use of a metal mask has had a difficulty in achieving an improvement in pixel aperture ratio, an increase in resolution, and the like. Furthermore, a metal mask has a problem of being easily deformed by influence of heat generated by an evaporation source.

An object of one embodiment of the present invention is to provide a display apparatus, a semiconductor device, or the like having favorable display quality. Another object is to provide a highly reliable display apparatus, semiconductor device, or the like. Another object is to provide a display apparatus, a semiconductor device, or the like with low power consumption. Another object is to provide a lightweight display apparatus, semiconductor device, or the like. Another object is to provide a display apparatus, a semiconductor device, or the like with high productivity. Another object is to provide a novel display apparatus, semiconductor device, or the like.

Note that the description of these objects does not preclude the existence of other objects. One embodiment of the present invention does not need to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention is a light-emitting element including an anode, an EL layer over the anode, a cathode over the EL layer, a first layer adjacent to a side surface of the EL layer, and a first portion adjacent to the side surface of the EL layer with the first layer therebetween, in which an angle θ between a bottom surface and the side surface of the EL layer is larger than 90°, and a refractive index of the first portion is lower than a refractive index of the first layer.

The angle θ is preferably larger than 90° and smaller than or equal to 135°.

The first portion may contain a Group 18 element, nitrogen, oxygen, or fluorine.

Another embodiment of the present invention is a display apparatus including a plurality of the light-emitting elements and a plurality of transistors. In the case where the light-emitting elements have functions of emitting light from a cathode side, the display apparatus functions as a top-emission display apparatus.

Another embodiment of the present invention is an electronic device including the display apparatus and at least one of an antenna, a battery, and a sensor.

Effect of the Invention

One embodiment of the present invention can provide a display apparatus, a semiconductor device, or the like having favorable display quality. Alternatively, a highly reliable display apparatus, semiconductor device, or the like can be provided. Alternatively, a display apparatus, a semiconductor device, or the like with low power consumption can be provided. Alternatively, a lightweight display apparatus, semiconductor device, or the like can be provided. Alternatively, a display apparatus, a semiconductor device, or the like with high productivity can be provided. Alternatively, a novel display apparatus, semiconductor device, or the like can be provided.

Note that the description of these effects does not preclude the existence of other effects. One embodiment of the present invention does not have to have all these effects. Note that other effects will be apparent from the description of the specification, the drawings, the claims, and the like and other effects can be derived from the description of the specification, the drawings, the claims, and the like.

BRIEF DESCRIPTION OF THE DRAWINGS

FIG. 18A is a diagram showing classifications of crystal structures. FIG. 18B is a diagram showing an XRD spectrum of a CAAC-IGZO film. FIG. 18C is a diagram showing nanobeam electron diffraction patterns of a CAAC-IGZO film.

FIG. 19A and FIG. 19B1 to FIG. 19B5 are diagrams illustrating structure examples of a display apparatus.

MODE FOR CARRYING OUT THE INVENTION

Figure 1A:
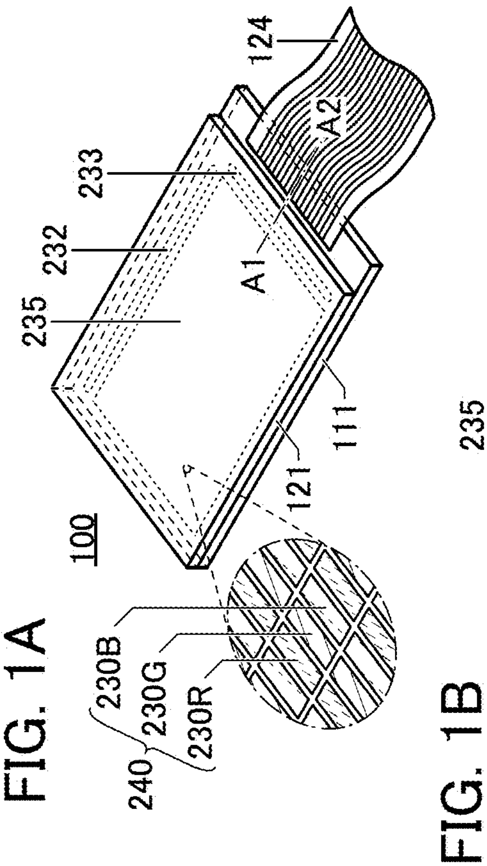
FIG. 1A and FIG. 1B are diagrams illustrating a structure example of a display apparatus.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves may be semiconductor devices or may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order.". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In addition, in this specification and the like, as a "resistor," a circuit element, a wiring, or the like having a resistance value higher than 0Ω can be used, for example. Therefore, in this specification and the like, a "resistor" sometimes includes a wiring having a resistance value, a transistor in which current flows between its source and drain, a diode, and a coil. Thus, the term "resistor" can be replaced with the term such as "resistance", "load", or "region having a resistance value"; conversely, the term "resistance", "load", or "region having a resistance value" can be replaced with the term such as "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^9$Ω.

In the case where a wiring is used as a resistor, the resistance value is sometimes determined depending on the length of the wiring. Alternatively, a conductor with resistivity different from that of a conductor used as a wiring is sometimes used as a resistor. Alternatively, the resistance value is sometimes determined by doping a semiconductor with an impurity.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit configuration, the device structure, or the like. Furthermore, a terminal, a wiring, or the like can be referred to as a "node."

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In addition, in this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A," for example. The description "current is input to element A" can be rephrased as "current is output from element A", for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. Furthermore, for example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relation between components with reference to drawings. The positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

The term "adjacent" or "proximity" in this specification and the like does not necessarily mean a state where a plurality of components are directly in contact with each other. For example, the expression "electrode B adjacent to insulating layer A" means not only a state where the insulating layer A and the electrode B are in direct contact with each other but also a state where a space or another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film," "layer," or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term such as "electrode," "wiring," or "terminal" does not limit the function of a component. For example, an "electrode" is used as part of a wiring in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In addition, in this specification and the like, the term such as "wiring," "signal line," or "power supply line" can be interchanged with each other depending on the case or the situation. For example, the term "wiring" can be changed into the term "signal line" in some cases. As another example, the term "wiring" can be changed into the term "power supply line" or the like in some cases. Conversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can be sometimes changed into the term such as "signal" depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, Group 15 elements, and the like.

In this specification and the like, a switch has a function of controlling whether current flows or not by being in a conduction state (an on state) or a non-conduction state (an off state). Alternatively, a switch has a function of selecting and changing a current path. For example, an electrical switch or a mechanical switch can be used. That is, a switch can be any element capable of controlling current, and is not limited to a particular element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (Micro Electro Mechanical Systems) technology. Such a switch includes an electrode that can be moved mechanically, and operates by controlling conduction and non-conduction with movement of the electrode.

In this specification, "parallel" indicates a state where two straight lines are placed at an angle larger than or equal to −10° and smaller than or equal to 10°. Thus, the case where the angle is larger than or equal to −5° and smaller than or equal to 5° is also included. In addition, "approximately parallel" or "substantially parallel" indicates a state where two straight lines are placed at an angle larger than or equal to −30° and smaller than or equal to 30°. Moreover, "perpendicular" indicates a state where two straight lines are placed at an angle larger than or equal to 80° and smaller than or equal to 100°. Thus, the case where the angle is larger than or equal to 85° and smaller than or equal to 95° is also included. Furthermore, "approximately perpendicular" or "substantially perpendicular" indicates a state where two straight lines are placed at an angle larger than or equal to 60° and smaller than or equal to 120°.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor or a metal oxide semiconductor in some cases. That is, when a channel of a transistor that has at least one of an amplifying function, a rectifying function, and a switching function is formed in a metal oxide, the metal oxide can be referred to as an oxide semiconductor or a metal oxide semiconductor. Furthermore, when an "OS transistor" is described, it can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the diagrams in some cases. Furthermore, hatching or the like is omitted for easy understanding of drawings, in some cases.

In addition, in the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification character such as "A", "a", "_1", "[i]", or "[m,n]" is sometimes added to the end of each reference numeral. For example, a plurality of pixels 230 are described as a pixel 230R, a pixel 230G, and a pixel 230B in some cases. In other words, in the case where matters that are common to the pixel 230R, the pixel 230G, and the pixel 230B are described or in the case where the pixels do not need to be distinguished from one another, "pixel 230" is simply used, in some cases.

In this specification and the like, a device using a metal mask or a fine metal mask an FMM (fine metal mask) is referred to as an MM (metal mask) structure in some cases. In this specification and the like, a device not using a metal mask or an FMM is referred to as an MML (metal maskless) structure in some cases. A display apparatus having an MML structure is fabricated without using a metal mask and thus has higher flexibility in designing the pixel arrangement, the pixel shape, and the like than a display apparatus having an FMM structure or an MM structure.

Note that in the method for fabricating a display apparatus having an MML structure, an island-shaped EL layer is formed not by using a pattern of a metal mask but by processing after formation of an EL layer over an entire surface. Accordingly, a high-resolution display apparatus or a display apparatus with a high aperture ratio, which has been difficult to be formed so far, can be obtained. Moreover, EL layers can be formed separately for the respective colors, enabling a display apparatus to perform extremely clear display with high contrast and high display quality. Provision of a sacrifice layer over an EL layer can reduce damage on the EL layer during a fabrication process of the display apparatus and increase the reliability of a light-emitting device.

In the case where a display apparatus is formed using a fine metal mask (FMM) structure, the pixel arrangement structure or the like is limited in some cases. Here, the FMM structure is described below.

For the FMM structure, a metal mask (also referred to as an FMM) which is provided with an opening portion so that EL is deposited by evaporation in a desired region at the time of EL evaporation is set to be opposed to a substrate. After that, EL evaporation is performed in the desired region through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. There is a method in which EL evaporation is performed while a certain level of tension is applied to the FMM; thus, the weight and strength of the FMM are important parameters.

Therefore, the pixel arrangement structure with an FMM needs to be designed under certain restrictions and the above-described parameters and the like need to be considered. By contrast, the display apparatus of one embodiment of the present invention is fabricated using an MML structure and thus offers an excellent effect such as higher flexibility in the pixel arrangement structure or the like than the FMM structure. This structure is highly compatible with a flexible device or the like, for example; thus, one or both of a pixel and a driver circuit can have a variety of circuit arrangements.

Embodiment 1

A display apparatus 100 of one embodiment of the present invention will be described with reference to drawings.

<<Structure Example>>

FIG. 1A is a schematic perspective view of the display apparatus 100. The display apparatus 100 has a structure in which a substrate 111 and a substrate 121 are bonded to each other. The display apparatus 100 includes a display region 235, a peripheral circuit region 232, a peripheral circuit region 233, and the like. FIG. 1 illustrates an example in which an FPC 124 is mounted on the display apparatus 100. Thus, the structure illustrated in FIG. 1A can be regarded as a display module including the display apparatus 100 and the FPC 124.

The peripheral circuit region 232 and the peripheral circuit region 233 include circuits for supplying signals to the display region 235. The circuits included in the peripheral circuit region 232 and the peripheral circuit region 233 are collectively referred to as "peripheral driver circuit" in some cases. Examples of the circuits included in the peripheral driver circuit include a scan line driver circuit and a signal line driver circuit.

Part or the whole of the peripheral driver circuit may be mounted as an IC (integrated circuit). For example, an IC including part or the whole of the peripheral driver circuit may be provided over the substrate 111 by a COG (Chip On Glass) method, a COF (Chip on Film) method, or the like. The IC may be mounted on the FPC 124 by a COF method or the like.

A signal and power to be supplied to the display region 235, the peripheral circuit region 232, and the peripheral circuit region 233 are input from the outside through the FPC 124.

FIG. 1A also illustrates an enlarged view of part of the display region 235. In the display region 235, a plurality of pixels 240 are arranged in a matrix. The pixels 240 include a pixel 230R, a pixel 230G, and a pixel 230B. As described above, in the case where matters that are common to the pixel 230R, the pixel 230G, and the pixel 230B are described or in the case where these three pixels do not need to be distinguished from each other, "pixel 230" is simply used in this specification and the like, in some cases.

[Cross-Sectional Structure Example]

Figure 1B:
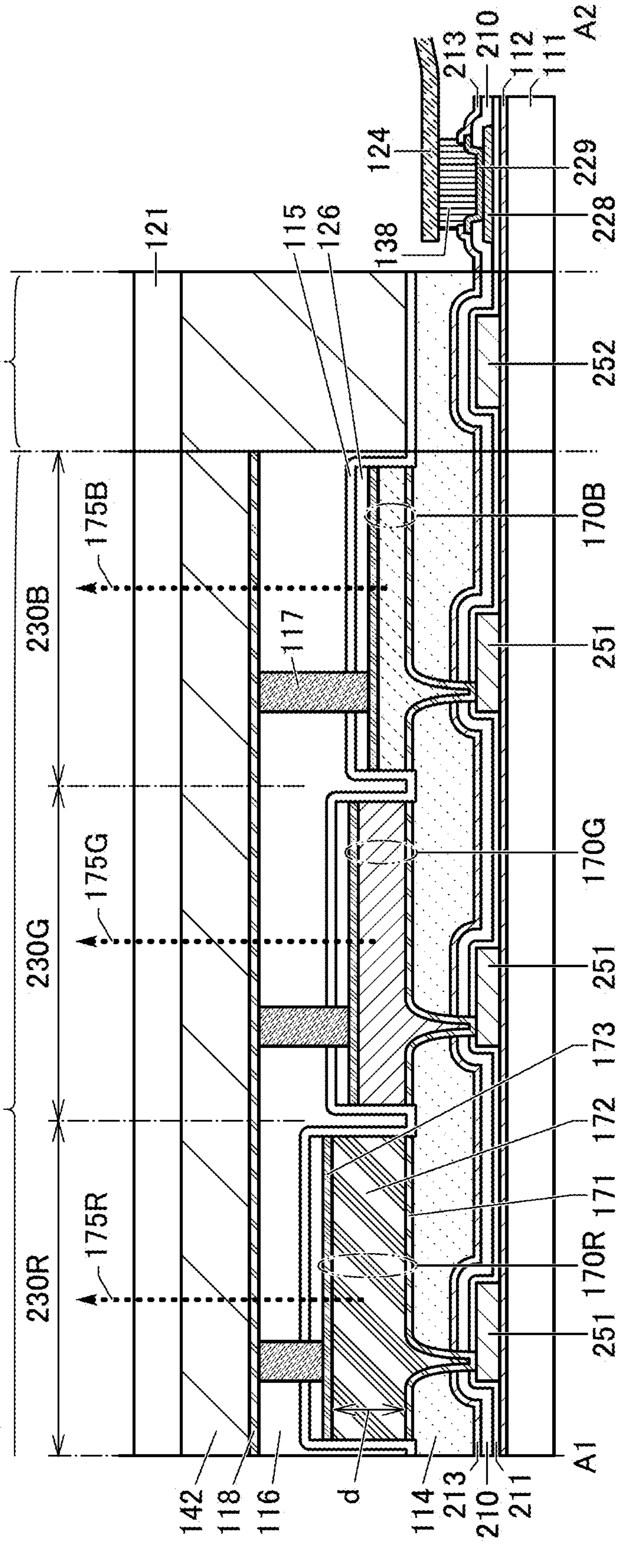

FIG. 1B is a cross-sectional view of a portion indicated by dashed-dotted line A1-A2 in FIG. 1A. FIG. 1B illustrates cross sections of part of the display region 235, part of the peripheral circuit region 233, and part of a region including the FPC 124.

The pixel 230R, the pixel 230G, and the pixel 230B each include a light-emitting element 170 as a display element. The light-emitting element 170 includes an electrode 171 functioning as an anode, an EL layer 172, and an electrode 173 functioning as a cathode. In FIG. 1B, the light-emitting element 170 included in the pixel 230R is illustrated as a light-emitting element 170R, the light-emitting element 170 included in the pixel 230G is illustrated as a light-emitting element 170G, and the light-emitting element 170 included in the pixel 230B is illustrated as a light-emitting element 170B.

Note that in this specification and the like, the electrode 171, the EL layer 172, and the electrode 173 included in the light-emitting element 170R are referred to as an electrode 171R, an EL layer 172R, and an electrode 173R, respectively, in some cases. The electrode 171, the EL layer 172, and the electrode 173 included in the light-emitting element 170G are referred to as an electrode 171G, an EL layer 172G, and an electrode 173G, respectively, in some cases. The electrode 171, the EL layer 172, and the electrode 173 included in the light-emitting element 170B are referred to as an electrode 171B, an EL layer 172B, and an electrode 173B, respectively, in some cases.

The light-emitting element 170R has a function of emitting light 175R. The light-emitting element 170G has a function of emitting light 175G. The light-emitting element 170B has a function of emitting light 175B. The light 175R is red light, the light 175G is green light, and the light 175B is blue light, for example.

The pixel 230R, the pixel 230G, and the pixel 230B each include a transistor 251 for driving the display element. The transistor 251 is a transistor controlling current flowing to the light-emitting element 170 (also referred to as a driving transistor).

The peripheral circuit region 232 and the peripheral circuit region 233 each include a plurality of transistors. FIG. 1B illustrates a transistor 252 as an example of the transistors included in the peripheral circuit region 233.

The display apparatus 100 includes the transistor 251, the transistor 252, the light-emitting element 170, and the like between the substrate 111 and the substrate 121. The substrate 111 and the substrate 121 overlap with each other with an adhesive layer 142 therebetween.

As the adhesive layer 142, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component resin may be used. An adhesive sheet or the like may be used.

The transistor 251 and the transistor 252 are each provided over the substrate 111 with an insulating layer 112 therebetween. The transistor 251 and the transistor 252 are covered with an insulating layer 210 and an insulating layer 213. An insulating layer 114 is provided over the insulating layer 213. The insulating layer 114 preferably functions as a planarization layer. Note that "planarization layer" refers to a layer having a surface whose unevenness due to the formation surface is reduced.

Note that the number of insulating layers covering the transistors is not limited and may be one or two or more. A material through which impurities such as water and hydrogen do not easily diffuse is preferably used for at least one of the insulating layers covering the transistors. Thus, such an insulating layer can function as a barrier film. Such a structure can effectively inhibit diffusion of the impurities into the transistors from the outside, and can achieve a highly reliable display apparatus.

In the pixel 230, the electrode 171 is provided over the insulating layer 114. The electrode 171 is electrically connected to one of a source and a drain of the transistor 251 through an opening portion provided in the insulating layer 114.

The EL layer 172 is provided over the electrode 171, and the electrode 173 is provided over the EL layer 172. The electrode 173 has a region overlapping with the electrode 171 with the EL layer 172 therebetween. A protective layer 126 is provided over the electrode 173. Furthermore, an insulating layer 115 covering the light-emitting element 170 and the protective layer 126 is provided. The insulating layer 115 preferably covers a side surface of the light-emitting element 170. The insulating layer 115 is preferably formed using a material through which hydrogen and moisture do not easily pass.

An insulating layer 116 is provided over the insulating layer 115. The insulating layer 116 preferably functions as a planarization layer. A conductive layer 118 is provided over the insulating layer 116. The conductive layer 118 is electrically connected to the electrode 173 through an electrode 117 provided to be embedded in the insulating layer 116, the insulating layer 115, and the protective layer 126. The conductive layer 118 is electrically connected to a plurality of the electrodes 173 and functions as a common electrode.

The display apparatus 100 illustrated in FIG. 1B includes an electrode 228 and an electrode 229. The electrode 228 is provided over an insulating layer 211. The electrode 229 is electrically connected to the electrode 228 through an opening portion provided in the insulating layer 210.

The FPC 124 is electrically connected to the electrode 229 through a connection layer 138. The electrode 229 is electrically connected to the peripheral driver circuit.

As the connection layer 138, an anisotropic conductive film (ACF), an anisotropic conductive paste (ACP), or the like can be used.

The light-emitting element 170 is, for example, a top-emission light-emitting element. In the case where the light-emitting element 170 is a top-emission light-emitting element, the electrode 171 has a function of reflecting visible light and the electrode 173 has a function of transmitting visible light. Thus, the light 175 is emitted from the electrode 173 side. The conductive layer 118 also has a function of transmitting visible light.

The EL layer 172 includes at least a light-emitting layer. The EL layer 172 may further include, as a layer other than the light-emitting layer, a layer containing a substance with a high hole-injection property, a substance with a high hole-transport property, a hole-blocking material, an electron-blocking material, a substance with a high electron-transport property, a substance with a high electron-injection property, an electron-blocking material, a substance with a bipolar property (a substance with a high electron-transport property and a high hole-transport property), or the like.

The emission color of the light-emitting element 170 can be white, red, green, blue, cyan, magenta, yellow, or the like depending on the material of the EL layer 172.

As a method for achieving color display, there are a method in which the light-emitting element 170 whose emission color is white is combined with a coloring layer (color filter) and a method in which the light-emitting element 170 with a different emission color is provided in each pixel. The former method is more productive than the latter method. By contrast, the latter method, which requires separate formation of the EL layer 172 pixel by pixel, is less productive than the former method. However, the latter method can provide higher color purity of the emission color than the former method.

In the latter method, the color purity can be further increased when the light-emitting element 170 has a microcavity structure. In order that the light-emitting element 170 may have a microcavity structure, a product of a distance d between the electrode 171 and the electrode 173 and a refractive index n of the EL layer 172 (optical distance) is set to m times as large as ½ of a wavelength λ (m is an integer greater than or equal to 1). Accordingly, the distance d can be obtained by Formula 1.

[Formula 1]

$$d = m\frac{\lambda}{2n} \quad (1)$$

According to Formula 1, in the light-emitting element 170 having the microcavity structure, the distance d is determined in accordance with the wavelength (emission color) of the light 175 (the light 175R, the light 175G, and the light 175B). The distance d corresponds to the thickness of the EL layer 172. Thus, the EL layer 172G is provided to have a larger thickness than the EL layer 172B, and the EL layer 172R is provided to have a larger thickness than the EL layer 172G, in some cases.

Note that to be exact, the distance d is a distance from a reflection region in the electrode 171 functioning as a reflective electrode to a reflection region in the electrode 173 functioning as a transflective electrode. However, it is sometimes difficult to determine the exact position of the reflection region in each of the electrode 171 and the electrode 173. In that case, it is assumed that the effect of the microcavity can be obtained sufficiently with a certain position in each of the electrode 171 and the electrode 173 being supposed as the reflective region.

The light-emitting element 170 includes a hole-transport layer, a hole-transport layer, a light-emitting layer, an electron-transport layer, an electron-injection layer, and the like. Note that a specific structure example of the light-emitting element 170 will be described in another embodiment. In order to increase the extraction efficiency of the light 175 in the microcavity structure, the optical distance from the electrode 171 functioning as a reflective electrode to the light-emitting layer is preferably set to an odd multiple of $\lambda/4$. In order to achieve this optical distance, the thicknesses of the layers in the light-emitting element 170 are preferably adjusted as appropriate.

In the case where the light 175 is emitted from the electrode 173 side, the reflectance of the electrode 173 is preferably higher than the transmittance thereof. The transmittance of the light 175 of the electrode 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the electrode 173 is set low (the reflectance is set high), the effect of the microcavity can be enhanced.

Either a low molecular compound or a high molecular compound can be used for the EL layer 172, and an inorganic compound may also contained. The layers included in the EL layer 172 can each be formed by a method such as an evaporation method (including a vacuum evaporation method), a transfer method, a printing method, an inkjet method, or a coating method.

The EL layer 172 may contain an inorganic compound such as quantum dots. For example, when used for the light-emitting layer, the quantum dots can function as a light-emitting material.

Color display can be achieved when the luminance of the light 175 (the light 175R, the light 175G, and the light 175B) is controlled for each pixel. The emission color hues combined to achieve color display may be not only a combination of red, green, and blue but also a combination of yellow, cyan, and magenta. The emission color hues to be combined with each other may be set as appropriate in accordance with the purpose, the uses, or the like.

[Substrate]

There is no particular limitation on a material used for the substrate 111 and the substrate 121. The material is determined in accordance with the purpose in consideration of whether it has a light-transmitting property, heat resistance high enough to withstand heat treatment, or the like. For example, a glass substrate of barium borosilicate glass, aluminosilicate glass, or the like; a ceramic substrate; a quartz substrate; a sapphire substrate; or the like can be used. Alternatively, a semiconductor substrate, a flexible substrate, an attachment film, a base film, or the like may be used.

Examples of the semiconductor substrate include a semiconductor substrate using silicon, germanium, or the like as a material and a compound semiconductor substrate using silicon carbide, silicon germanium, gallium arsenide, indium phosphide, zinc oxide, or gallium oxide as a material. For the semiconductor substrate, a single-crystal semiconductor or a polycrystalline semiconductor may be used.

In order to increase the flexibility of the display apparatus 100, a flexible substrate, an attachment film, a base film, or the like may be used as the substrate 111 and the substrate 121.

As the materials of the flexible substrate, the attachment film, the base film, and the like, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used.

When the above-described material is used for the substrate, a lightweight display apparatus can be provided. Furthermore, when the above-described material is used for the substrate, a shock-resistant display apparatus can be provided. Moreover, when the above-described material is used for the substrate, a display apparatus that is less likely to be broken can be provided.

The flexible substrate used as the substrate 111 and the substrate 121 preferably has a lower coefficient of linear expansion because deformation due to an environment is inhibited. For the flexible substrate used as the substrate 111 and the substrate 121, for example, a material whose coefficient of linear expansion is lower than or equal to $1\times10^{-3}$/K, lower than or equal to $5\times10^{-5}$/K, or lower than or equal to $1\times10^{-5}$/K is used. In particular, aramid is suitable for the flexible substrate because of its low coefficient of linear expansion.

[Conductive Layer]

As a conductive material that can be used for the gate, the source, and the drain of the transistor and conductive layers such as various wirings and electrodes included in the display apparatus, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing the above metal element as a component; an alloy containing the above metal elements in combination; or the like can be used. Alternatively, a semiconductor typified by polycrystalline silicon containing an impurity element such as phosphorus, or silicide such as nickel silicide may be used. There is no particular limitation on the formation method of the conductive material, and a variety of formation methods such as an evaporation method, a CVD method, a sputtering method, and a spin coating method can be employed.

As the conductive material that can be used for the conductive layer, a conductive material containing oxygen, such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added, can be used. Moreover, a conductive material containing nitrogen, such as titanium nitride, tantalum nitride, or tungsten nitride, can be used. In addition, a stacked-layer structure in which a conductive material containing oxygen, a conductive material containing nitrogen, and a material containing the above-described metal element are combined as appropriate can be used.

The conductive material that can be used for the conductive layer may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure including a titanium layer, an aluminum layer stacked over the titanium layer, and a titanium layer formed thereover can be given. An aluminum alloy containing one or more elements selected from titanium, tantalum, tungsten, molybdenum, chromium, neodymium, and scandium may be used as the conductive material.

In the case where the light-emitting element 170 is a top-emission light-emitting element, the electrode 171 is preferably formed using a conductive material that effectively reflects light emitted by the EL layer 172. Note that the structure of the electrode 171 is not limited to a single-layer structure and may be a stacked-layer structure of a plurality of layers. For example, in the case where the electrode 171 is used as an anode, a layer in contact with the EL layer 172 may be a layer with a light-transmitting property containing indium tin oxide or the like, and a layer having high reflectance (e.g., aluminum, an alloy containing aluminum, or silver) may be provided in contact with the layer.

As a conductive material that reflects visible light, for example, a metal material such as aluminum, gold, platinum, silver, nickel, tungsten, chromium, molybdenum, iron, cobalt, copper, or palladium or an alloy containing these metal materials can be used. Lanthanum, neodymium, germanium, or the like may be added to the above metal material or alloy. Alternatively, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium may be used. An alloy containing silver and copper is preferable because of its high heat resistance. Furthermore, a metal film or an alloy film may be stacked with a metal oxide film. For example, when a metal film or a metal oxide film is stacked to be in contact with an aluminum alloy film, oxidation of the aluminum alloy film can be inhibited. Other examples of the metal film or the metal oxide film include titanium and titanium oxide. Alternatively, as described above, a conductive film with a light-transmitting property and a film containing a metal material may be stacked. For example, a stacked-layer film of silver and an indium tin oxide or a stacked-layer film of an indium tin oxide (ITO) and an alloy of silver and magnesium can be used.

As a conductive material with a light-transmitting property, a conductive oxide such as indium oxide, indium tin oxide, indium zinc oxide, zinc oxide, or zinc oxide to which gallium is added, or graphene can be used. Alternatively, as the conductive material with a light-transmitting property, an oxide conductor can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. Note that in the case of using the metal material or the alloy material (or the nitride thereof), the thickness is set small enough to have a light-transmitting property. A stacked-layer film of the above materials can be used as a conductive layer. For example, a stacked-layer film of indium tin oxide and an alloy of silver and magnesium, or the like is preferably used for increased conductivity. They can also be used for conductive layers such as a variety of wirings and electrodes that constitute the display apparatus, and conductive layers (conductive layers functioning as a pixel electrode or a common electrode) included in the display element.

Here, an oxide conductor, which is one kind of metal oxide, is described. In this specification and the like, an oxide conductor may be referred to as OC (Oxide Conductor). For example, oxygen vacancies are formed in a metal oxide, and then hydrogen is added to the oxygen vacancies, so that a donor level is formed in the vicinity of the conduction band. As a result, the conductivity of the metal oxide is increased, so that the metal oxide becomes a conductor. The metal oxide having become a conductor can be referred to as an oxide conductor. Oxide semiconductors generally have a visible-light-transmitting property because of their large energy gap. Meanwhile, an oxide conductor is a metal oxide having a donor level in the vicinity of the conduction band. Therefore, the influence of absorption due to the donor level is small in the oxide conductor, and the oxide conductor has a visible-light-transmitting property comparable to that of an oxide semiconductor.

[Insulating Layer]

For each of the insulating layers, a single layer or a stack layer of materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. A material in which a plurality of materials selected from an oxide material, a nitride material, an oxynitride material, and a nitride oxide material are mixed may be used.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

It is particularly preferable that the insulating layer 113 and the insulating layer 213 be formed using an insulating material through which impurities do not easily pass. For example, a single layer or a stacked layer of an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Examples of the insulating material through which impurities do not easily pass include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material through which impurities do not easily pass is used for the insulating layer 113, impurity diffusion from the substrate 111 side can be inhibited, and the reliability of the transistor can be improved. When the insulating material through which impurities do not easily pass is used for the insulating layer 213, impurity diffusion from the insulating layer 114 side can be inhibited, and the reliability of the transistor can be improved.

The insulating layer that can function as a planarization layer can be formed using an organic material having heat resistance, such as polyimide, an acrylic resin, a benzocyclobutene-based resin, polyamide, or an epoxy resin. Other than the above organic materials, it is also possible to use a low dielectric constant material (a low-k material), a siloxane-based resin, PSG (phosphosilicate glass), BPSG (borophosphosilicate glass), or the like. Note that a plurality of insulating layers formed of these materials may be stacked.

Note that the siloxane-based resin corresponds to a resin including a Si—O—Si bond formed using a siloxane-based material as a starting material. In the siloxane-based resin, an organic group (e.g., an alkyl group or an aryl group), a fluoro group, or the like may be used as a substituent. In addition, the organic group may include a fluoro group.

CMP treatment may be performed on a surface of the insulating layer. By the CMP treatment, unevenness of the sample surface can be reduced, and coverage with an insulating layer and a conductive layer to be formed later can be increased.

[Transistor]

There is no particular limitation on the structure of the transistor included in the display apparatus of one embodiment of the present invention. For example, a planar transistor may be used, or a staggered transistor may be used. Alternatively, the transistor structure may be either a top-gate structure or a bottom-gate structure. Gate electrodes may be provided above and below a channel.

A transistor included in a peripheral driver circuit and a transistor included in a pixel circuit may have the same structure or different structures. All the transistors included in the peripheral driver circuit may have the same structure or may use the combination of two or more kinds of structures. Similarly, all the transistors included in the pixel circuit may have the same structure or may use the combination of two or more kinds of structures.

[Semiconductor Material]

There is no particular limitation on the crystallinity of a semiconductor material used for the semiconductor layer of the transistor. Either an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

For example, silicon, germanium, or the like can be used as a semiconductor material used for the semiconductor layer of the transistor. Alternatively, a compound semiconductor such as silicon carbide, gallium arsenide, a metal oxide, or a nitride semiconductor, an organic semiconductor, or the like can be used.

For example, polycrystalline silicon (polysilicon), amorphous silicon, or the like can be used as a semiconductor material used for the transistor. Furthermore, an oxide semiconductor, which is a kind of metal oxide, can be used as a semiconductor material used for the transistor.

<Metal Oxide>

Here, a metal oxide that can be used as an oxide semiconductor is described.

The metal oxide that can be used as an oxide semiconductor preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, magnesium, cobalt, and the like. Note that a combination of two or more of the above elements may be used as the element M.

Note that in this specification and the like, a metal oxide containing nitrogen is also collectively referred to as a metal oxide in some cases. A metal oxide containing nitrogen may be called a metal oxynitride.

<Classification of Crystal Structures>

First, the classification of the crystal structures of an oxide semiconductor will be described with reference to FIG. 18A. FIG. 18A is a diagram showing the classification of crystal structures of an oxide semiconductor, typically IGZO (a metal oxide containing In, Ga, and Zn).

As shown in FIG. 18A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. Moreover, the term "Crystal" includes single crystal and poly crystal.

Note that the structures in the thick frame in FIG. 18A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 18B shows an XRD spectrum, which is obtained by GIXD (Grazing-Incidence XRD) measurement, of a CAAC-IGZO film classified into "Crystalline". The horizontal axis represents 2θ [deg.], and the vertical axis represents Intensity [a.u.]. Note that a GIXD method is also referred to as a thin film method or a Seemann-Bohlin method. The XRD spectrum that is shown in FIG. 18B and obtained by GIXD measurement may be hereinafter simply referred to as an XRD spectrum in this specification. The CAAC-IGZO film in FIG. 18B has a composition in the neighborhood of In:Ga:Zn=4:2:3 [atomic ratio]. The CAAC-IGZO film in FIG. 18B has a thickness of 500 nm.

As shown in FIG. 18B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 18B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 18C shows a diffraction pattern of the CAAC-IGZO film. FIG. 18C shows a diffraction pattern obtained by NBED in which an electron beam is incident in the direction parallel to the substrate. The CAAC-IGZO film in FIG. 18C has a composition in the neighborhood of In:Ga:Zn=4:2:3 [atomic ratio]. In the nanobeam electron diffraction method, electron diffraction is performed with a probe diameter of 1 nm.

As shown in FIG. 18C, a plurality of spots indicating c-axis alignment are observed in the diffraction pattern of the CAAC-IGZO film.

<Structure of Oxide Semiconductor>

Oxide semiconductors might be classified in a manner different from that in FIG. 18A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In an In-M-Zn oxide (the element M is one or more kinds selected from aluminum, gallium, yttrium, and tin), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<Structure of Oxide Semiconductor>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility (μ), and favorable switching operation can be achieved.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be obtained. In addition, a transistor having high reliability can be obtained.

An oxide semiconductor having a low carrier concentration is preferably used for a channel formation region of the transistor. For example, the carrier concentration in an oxide semiconductor in the channel formation region is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentrations obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor that is obtained by SIMS is set lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor that is obtained by SIMS is set lower than $5\times10^{19}$ atoms/$cm^3$, preferably set lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the channel formation region of the oxide semiconductor is preferably reduced as much as possible. Specifically, the hydrogen concentration in the channel formation region of the oxide semiconductor that is obtained by SIMS is set lower than $1\times10^{20}$ atoms/$cm^3$, preferably lower than $5\times10^{19}$ atoms/$cm^3$, further preferably lower than $1\times10^{19}$ atoms/$cm^3$, still further preferably lower than $5\times10^{18}$ atoms/$cm^3$, and yet still further preferably lower than $1\times10^{18}$ atoms/$cm^3$.

When an oxide semiconductor with sufficiently reduced impurities is used for a channel formation region of a transistor, stable electrical characteristics can be given.

<Other Semiconductor Materials>

A semiconductor material that can be used for a semiconductor layer of a transistor is not limited to the above metal oxides. A semiconductor material that has a band gap (a semiconductor material that is not a zero-gap semiconductor) may be used for the semiconductor layer. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For a semiconductor layer of a transistor, a transition metal chalcogenide functioning as a semiconductor is preferably used, for example. Specific examples of the transition metal chalcogenide which can be used for the semiconductor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Modification Example 1

Figure 2:
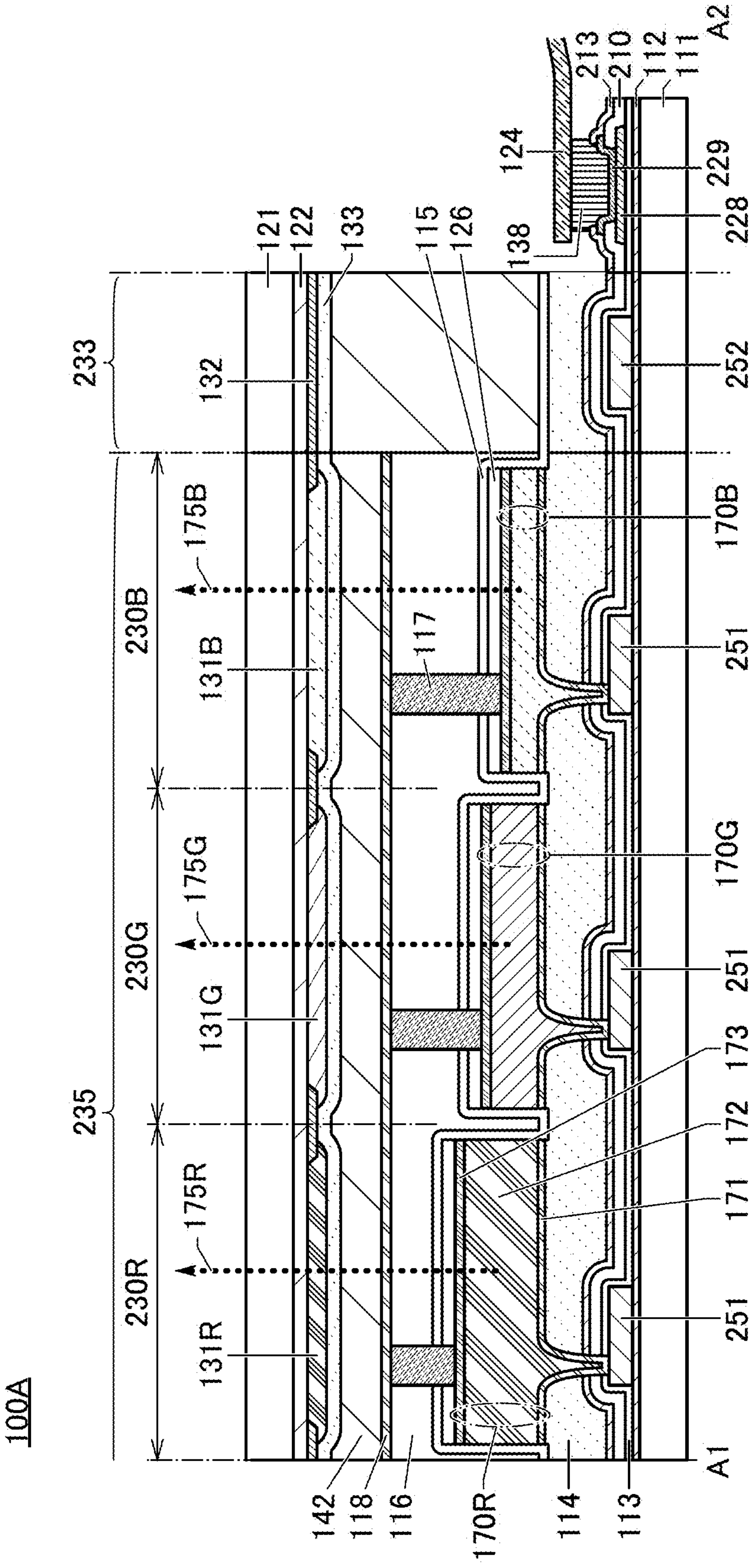
FIG. 2 is a diagram illustrating a structure example of a display apparatus.

FIG. 2 illustrates a cross section of a display apparatus 100A, which is a modification example of the display apparatus 100. In the display apparatus 100A, the substrate 121 is provided with an insulating layer 122, a coloring layer 131 (a coloring layer 131R, a coloring layer 131G, and a coloring layer 131B), a light-blocking layer 132, an insulating layer 133, and the like. The insulating layer 133 may function as a planarization layer.

The coloring layer 131R has a function of transmitting a red color gamut, the coloring layer 131G has a function of transmitting a green color gamut, and the coloring layer 131B has a function of transmitting a blue color gamut. In the case of providing the coloring layer 131 and the light-blocking layer 132, a region where the coloring layer 131 and the light-blocking layer 132 overlap with each other is formed in a peripheral portion of the coloring layer 131.

The coloring layer 131R has a region overlapping with the light-emitting element 170R, the coloring layer 131G has a region overlapping with the light-emitting element 170G, and the coloring layer 131B has a region overlapping with the light-emitting element 170B. When the coloring layer 131 and the light-emitting element 170 are provided to overlap with each other, the color purity of the light 175 can be increased.

Modification Example 2

Figure 3:
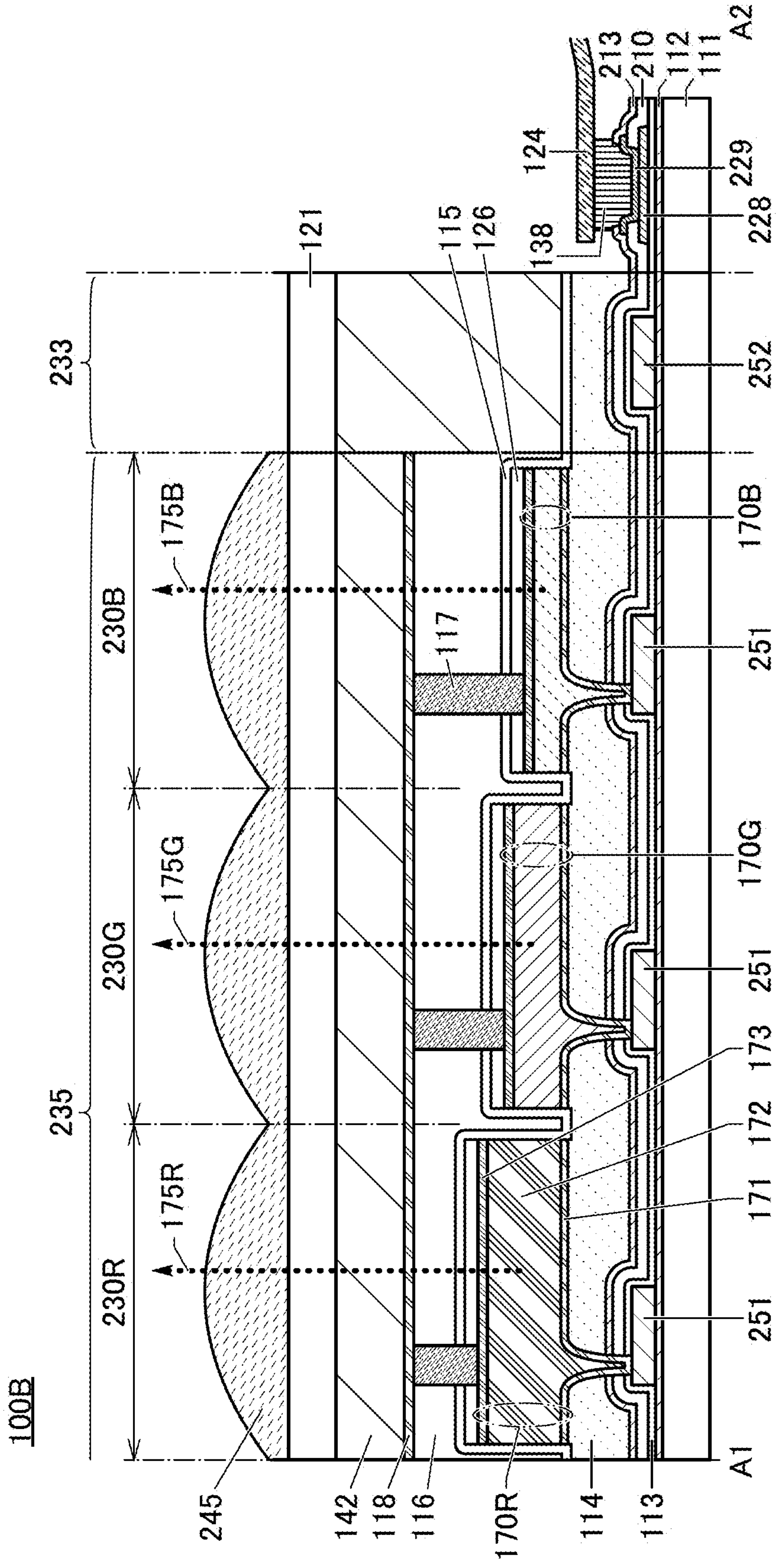
FIG. 3 is a diagram illustrating a structure example of a display apparatus.

FIG. 3 illustrates a cross section of a display apparatus 100B, which is a modification example of the display apparatus 100. The display apparatus 100B includes a microlens array 245 overlapping with the display apparatus 100. The light 175 emitted from the light-emitting element 170 is condensed by the microlens array 245. This can increase the light extraction efficiency of the display apparatus.

Modification Example 3

Figure 4:
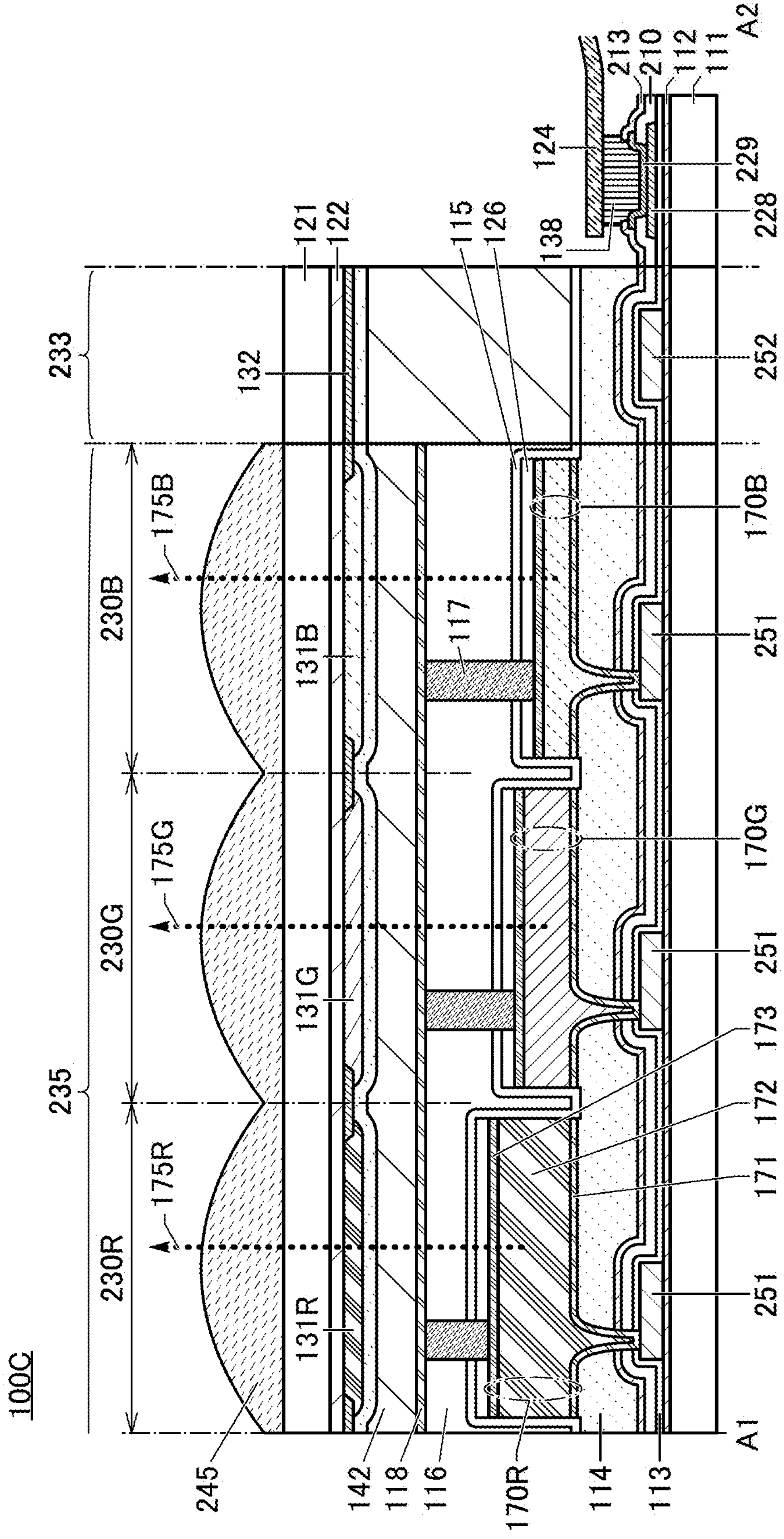
FIG. 4 is a diagram illustrating a structure example of a display apparatus.

FIG. 4 illustrates a cross section of a display apparatus 100C, which is a modification example of the display apparatus 100. The display apparatus 100C has a structure in which the display apparatus 100A and the display apparatus 100B are combined. The use of both the coloring layer 131 and the microlens array 245 can achieve a display apparatus with higher display quality.

Modification Example 4

Figure 5:
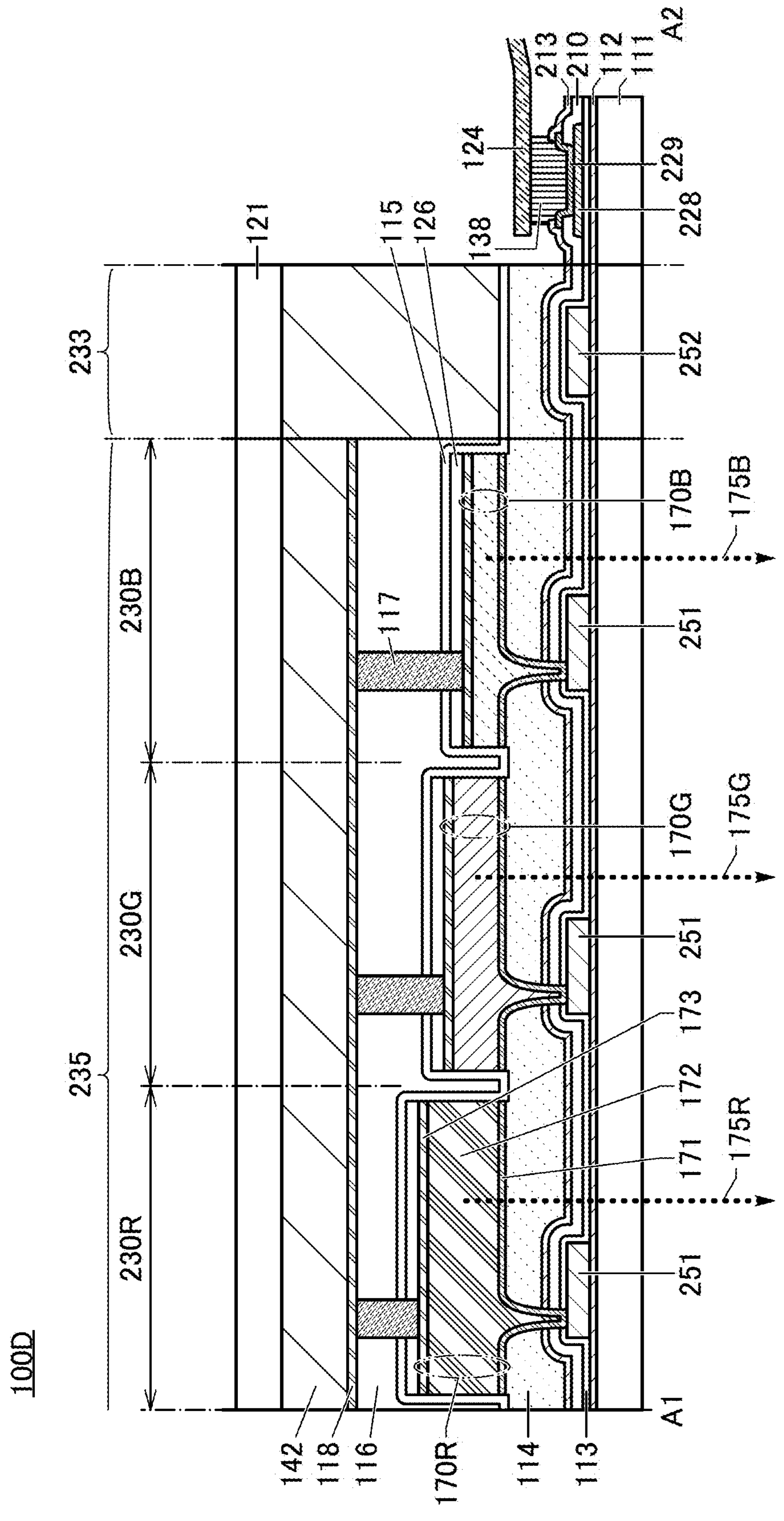
FIG. 5 is a diagram illustrating a structure example of a display apparatus.

The display apparatus 100 is not limited to a top-emission display apparatus and may be a bottom-emission display apparatus. FIG. 5 illustrates a cross section of a display apparatus 100D, which is a modification example of the display apparatus 100. The display apparatus 100D is a bottom-emission display apparatus including the light-emitting element 170 of a bottom-emission type.

The light-emitting element 170 with a bottom-emission structure includes the electrode 171 formed using a conductive material that transmits visible light and the electrode 173 formed using a conductive material that reflects visible light.

Note that the light-emitting element 170 can be a light-emitting element with a dual-emission structure. In the case where the light-emitting element 170 is a light-emitting element with a dual-emission structure, both the electrode 171 and the electrode 173 are formed using a conductive material that transmits visible light.

Modification Example 5

Figure 6:
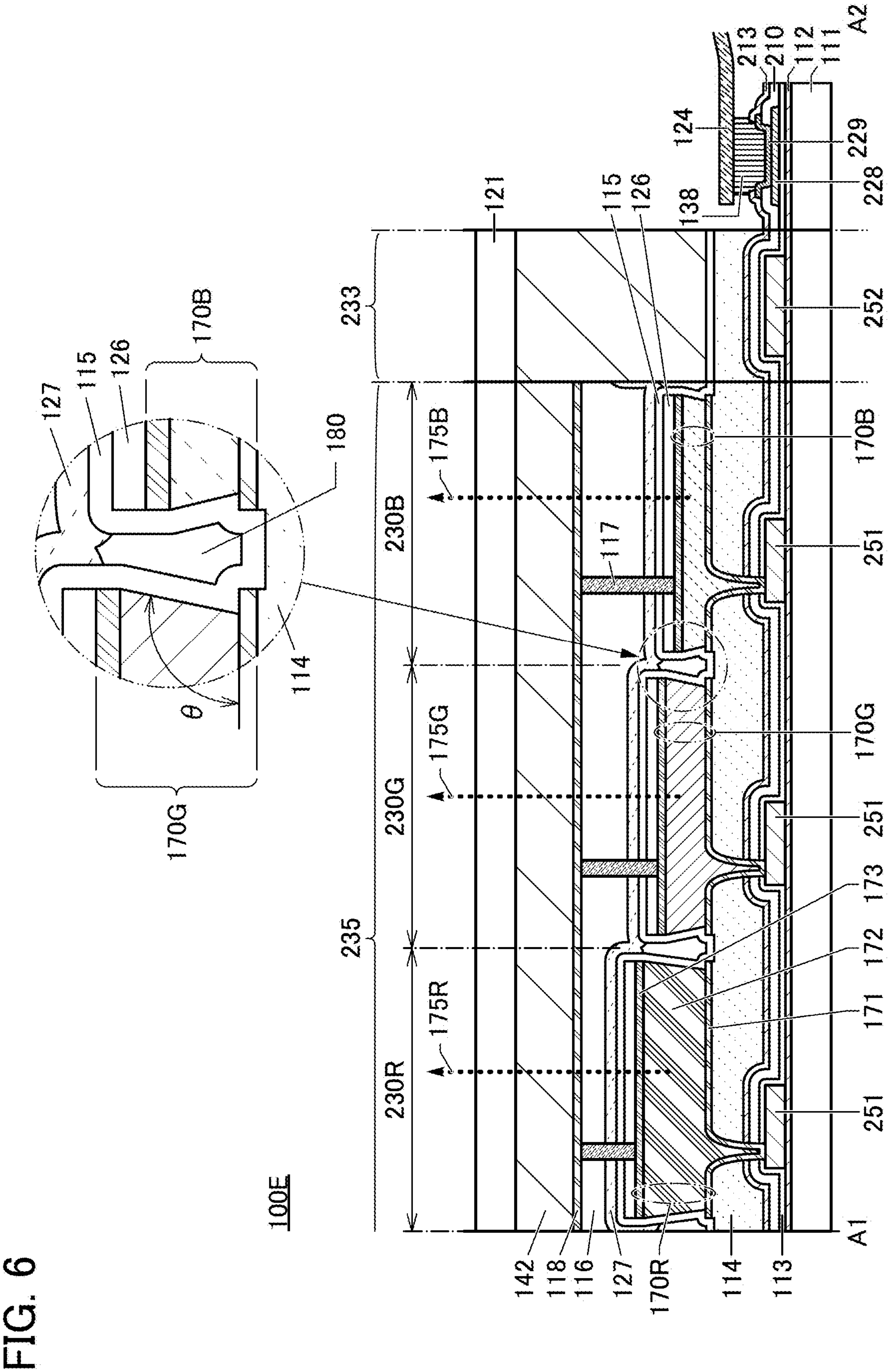
FIG. 6 is a diagram illustrating a structure example of a display apparatus.

FIG. 6 illustrates a cross section of a display apparatus 100E, which is a modification example of the display apparatus 100.

The display apparatus 100E includes an LDR 180 (LDR: Low Dielectric constant Region), which is a portion having a low dielectric constant, between adjacent two light-emitting elements 170. Specifically, the LDR 180 (also referred to as "first portion") is provided between adjacent two EL layers 172. The LDR 180 is adjacent to a side surface of the EL layer 172 with the insulating layer 115 therebetween. The LDR 180 and the insulating layer 115 are covered with an insulating layer 127.

In the display apparatus 100E, the side surface of the EL layer 172 preferably has an inverse tapered shape. Here, "the side surface of the EL layer 172 has an inverse tapered shape" means that a taper angle θ formed between the bottom surface of the EL layer 172 and the side surface of the EL layer 172 is larger than 90°.

The LDR 180, the inverse tapered shape of the side surface of the EL layer 172, and the like will be described later.

<<Example of Fabrication Method>>

An example of a fabrication method of the display apparatus 100 is described below with reference to drawings. In this embodiment, the display region 235 is focused on in the description of the fabrication method.

Note that insulating layers, semiconductor layer, conductive layers for forming electrodes and wirings, and the like that constitute the display apparatus can be formed by a sputtering method, a chemical vapor deposition (CVD) method, a vacuum evaporation method, a pulsed laser deposition (PLD) method, an atomic layer deposition (ALD) method, a plasma ALD (PEALD) method, or the like. As the CVD method, a plasma-enhanced chemical vapor deposition (PECVD) method or a thermal CVD method may be used. As the thermal CVD method, for example, a metal organic chemical vapor deposition (MOCVD: Metal Organic CVD) method may be used.

Alternatively, the insulating layers, the semiconductor layer, the conductive layers used for forming electrodes and wirings, and the like included in the display apparatus may be formed by a method such as spin coating, dipping, spray coating, ink-jetting, dispensing, screen printing, offset printing, slit coating, roll coating, curtain coating, and knife coating.

A PECVD method can provide a high-quality film at a relatively low temperature. With use of a deposition method that does not use plasma at the time of deposition, such as an MOCVD method, an ALD method, or a thermal CVD method, damage is not easily caused on a surface where the film is formed. For example, a wiring, an electrode, an element (a transistor, a capacitor, or the like), or the like included in a semiconductor device might be charged up by receiving charge from plasma. In this case, accumulated charge might break the wiring, the electrode, the element, or the like included in the semiconductor device. By contrast, in the case of a deposition method not using plasma, such plasma damage is not caused; thus, the yield of semiconductor devices can be increased. Moreover, since plasma damage during deposition is not caused, a film with few defects can be obtained.

Unlike a deposition in which particles ejected from a target or the like are deposited, a CVD method and an ALD method are deposition methods in which a film is formed by reaction at a surface of an object to be processed. Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening with a high aspect ratio, for example. Meanwhile, the ALD method has a comparatively low deposition rate, and thus is preferably used in combination with another deposition method with a high deposition rate, such as the CVD method, in some cases.

When a CVD method or an ALD method is used, the composition of a film to be obtained can be controlled with the flow rate ratio of source gases. For example, by the CVD method and the ALD method, a film with a certain composition can be formed depending on the flow rate ratio of the source gases. Moreover, for example, by the CVD method and the ALD method, a film whose composition is continuously changed can be formed by changing the flow rate ratio of the source gases during deposition. In the case of forming a film while changing the flow rate ratio of the source gases, as compared with the case of forming a film with use of a plurality of deposition chambers, the time taken for the deposition can be shortened because the time taken for transfer and pressure adjustment is omitted. Thus, the productivity of the semiconductor device can be increased in some cases.

Note that in the case of forming a film by an ALD method, a gas that does not contain chlorine is preferably used as a material gas.

Furthermore, in the case where an oxide semiconductor is formed by a sputtering method, a chamber of a sputtering apparatus is preferably evacuated to a high vacuum (to the degree of approximately $5\times10^{-7}$ Pa to $1\times10^{-4}$ Pa, for example) by an adsorption vacuum evacuation pump such as a cryopump so that water and the like acting as impurities for the oxide semiconductor film are removed as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa. The deposition temperature is preferably higher than or equal to RT and lower than or equal to 500° C., further preferably higher than or equal to RT and lower than or equal to 300° C., still further preferably higher than or equal to RT and lower than or equal to 200° C.

In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture or the like into the oxide semiconductor film can be minimized as much as possible.

In the case where the insulating layers, the conductive layers, the semiconductor layers, or the like are formed by a sputtering method using a sputtering gas containing oxygen, oxygen can be supplied to a layer over which these layers are formed. As the amount of oxygen contained in the sputtering gas increases, the amount of oxygen supplied to the layer over which these layers are formed tends to increase.

When the layers (thin films) that form the display apparatus are processed, a photolithography method or the like can be used for the processing. Alternatively, island-shaped layers may be formed by a deposition method using a blocking mask. Alternatively, a nanoimprinting method, a sandblasting method, a lift-off method, or the like may be used for the processing of the layers. As a photolithography method, a method in which a resist mask is formed over a layer (thin film) to be processed, part of the layer (thin film) is selected and removed by using the resist mask as a mask, and the resist mask is removed, and a method in which a photosensitive layer is formed, and then the layer is exposed to light and developed to be processed into a desired shape are given.

In the case of using light in the photolithography method, an i-line (a wavelength of 365 nm), a g-line (a wavelength of 436 nm), and an h-line (a wavelength of 405 nm), or combined light of them can be used for light exposure. Besides, ultraviolet light, KrF laser light, ArF laser light, or the like can also be used. Exposure may be performed by liquid immersion exposure technique. Furthermore, as the light used for the exposure, extreme ultra-violet (EUV) light, X-rays, or the like may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For removal (etching) of the layers (thin films), a dry etching method, a wet etching method, a sandblasting method, or the like can be used. The etching methods may be used in combination.

The display apparatus 100 is fabricated by combining an element substrate 151 (see FIG. 12C) and the substrate 121.

[Element Substrate 151]

An example of a fabrication method of the element substrate 151 is described.

[Step 1]

Figure 7A:
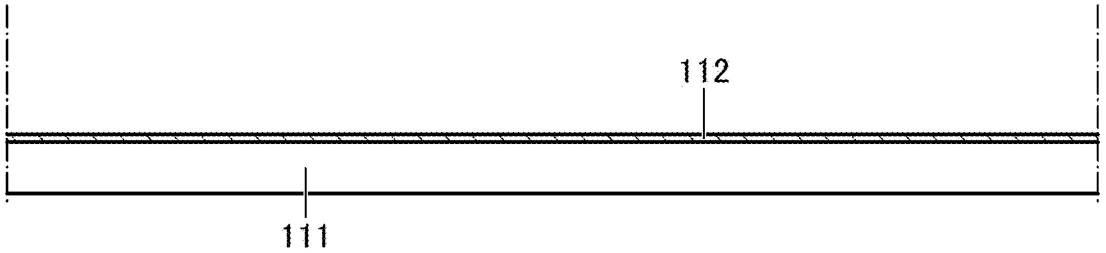
FIG. 7A to FIG. 7D are diagrams illustrating an example of a fabrication method of an element substrate.

The insulating layer 112 is formed over the substrate 111 (see FIG. 7A). The insulating layer 112 may be a stack of a plurality of insulating layers. As the insulating layer 112, an inorganic insulating film such as a silicon nitride film, a silicon oxynitride film, a silicon oxide film, a silicon nitride oxide film, an aluminum oxide film, or an aluminum nitride film can be used, for example. An inorganic insulating film such as a hafnium oxide film, an yttrium oxide film, a zirconium oxide film, a gallium oxide film, a tantalum oxide film, a magnesium oxide film, a lanthanum oxide film, a cerium oxide film, or a neodymium oxide film may also be used. A stack including two or more of the above insulating films may also be used. For the insulating layer 112, a material through which impurities such as hydrogen and water do not easily pass is preferably used.

An inorganic insulating film is preferably formed at high temperatures because the film can have higher density and a higher barrier property as the deposition temperature becomes higher. The substrate temperature at the time of depositing the inorganic insulating film is preferably higher than or equal to room temperature (25° C.) and lower than or equal to 350° C., further preferably higher than or equal to 100° C. and lower than or equal to 300° C.

[Step 2]

Figure 7B:
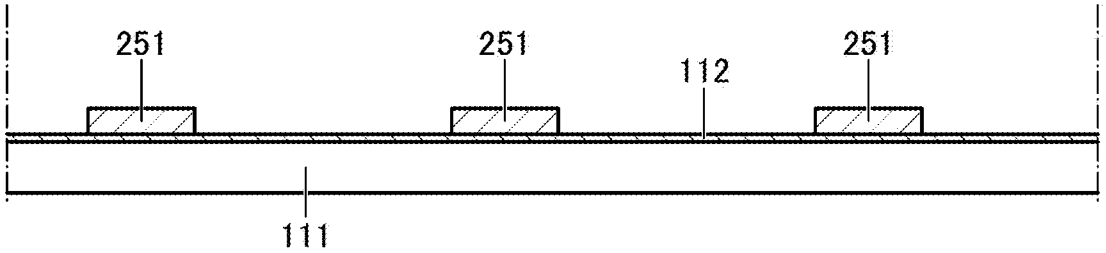

Next, the transistor 251 is formed over the insulating layer 112 (see FIG. 7B).

[Step 3]

Figure 7C:
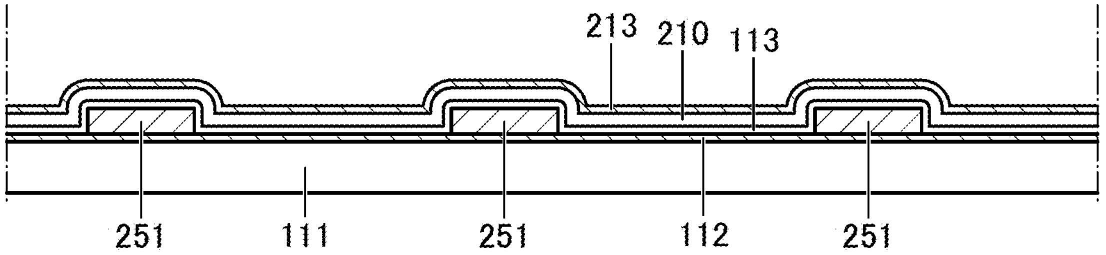

Next, the insulating layer 113, the insulating layer 210, and the insulating layer 213 are formed over the transistor 251 (see FIG. 7C). In the case where the transistor 251 is an OS transistor, the insulating layer 113 and the insulating layer 210 are each preferably an insulating layer from which oxygen is released by heating (hereinafter also referred to as "insulating layer containing excess oxygen").

Note that in this specification and the like, oxygen released from a layer by heating is also referred to as "excess oxygen". In the insulating layer containing excess oxygen, the amount of released oxygen converted into oxygen atoms is sometimes $1.0\times10^{18}$ atoms/$cm^3$ or more, $1.0\times10^{19}$ atoms/$cm^3$ or more, or $1.0\times10^{20}$ atoms/$cm^3$ or more in TDS analysis performed with heat treatment where the surface temperature of the insulating layer is higher than or equal to 100° C. and lower than or equal to 700° C., preferably higher than or equal to 100° C. and lower than or equal to 500° C.

As in the insulating layer 112, a material through which impurities such as hydrogen and water do not easily pass is preferably used for the insulating layer 213. In the case where the insulating layer 113 and the insulating layer 210 are insulating layers containing excess oxygen, the insulating layer 213 is preferably formed using an insulating material through which oxygen does not easily diffuse or pass.

In the case where the insulating layer 113 and the insulating layer 210 are insulating layers containing excess oxygen, heat treatment is performed with an insulating film through which oxygen does not easily diffuse or pass is stacked thereover, whereby oxygen can be efficiently supplied to an oxide semiconductor layer included in the OS transistor. As a result, oxygen vacancies in the oxide semiconductor layer can be filled and defects at the interface between the oxide semiconductor layer and the insulating layer can be repaired, leading to a reduction in defect levels. Accordingly, a transistor with extremely high reliability can be obtained. The use of such a transistor in a display apparatus can increase the reliability of the display apparatus.

[Step 4]

Figure 7D:
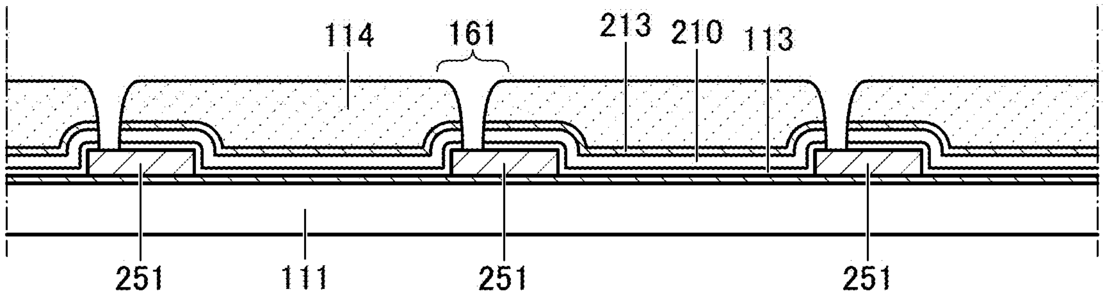

Next, the insulating layer 114 is formed (see FIG. 7D). The insulating layer 114 is a layer having a surface where the display element is to be formed later, and thus preferably functions as a planarization layer.

[Step 5]

Next, an opening 161 that reaches the transistor 251 is formed in the insulating layer 114, the insulating layer 213, and the insulating layer 210 (see FIG. 7D).

[Step 6]

Figure 8A:
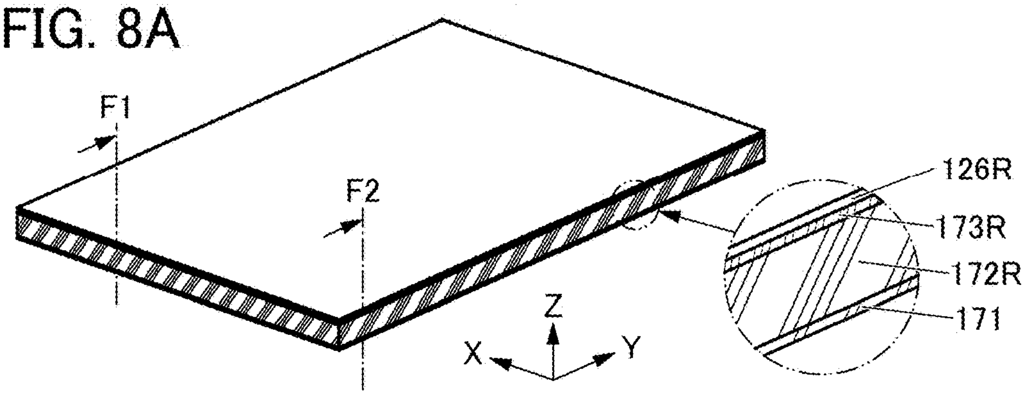
FIG. 8A to FIG. 8D are diagrams illustrating an example of a fabrication method of an element substrate.
Figure 8B:
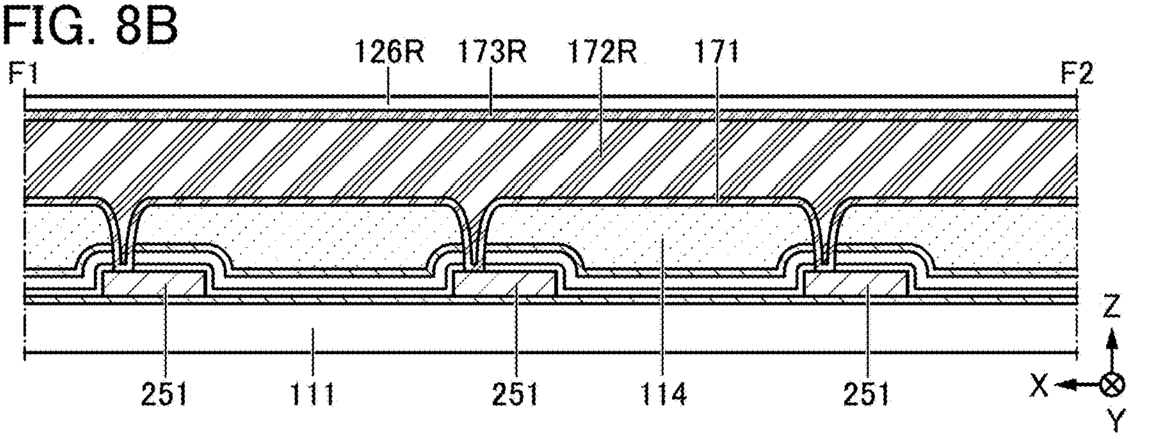

Next, the electrode 171 is formed over the insulating layer 114 (see FIG. 8A and FIG. 8B). FIG. 8A is a schematic perspective view illustrating a structure body provided above the insulating layer 114. For easy understanding of description disclosed in this embodiment, some components are omitted in FIG. 8A. For example, components positioned below the electrode 171 are omitted. The same applies to FIG. 8C, FIG. 9B, FIG. 11A, FIG. 12B, and FIG. 13B that are described later.

In the drawings and the like, arrows indicating the X direction, the Y direction, and the Z direction are illustrated in some cases. Note that in this specification and the like, "X direction" is a direction along the X axis, and the forward direction and the reverse direction are not distinguished from each other unless otherwise specified. The same applies to "Y direction" and "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases. In FIG. 8 and the like, a direction perpendicular to a surface of the substrate 111 is the Z direction.

FIG. 8B is a schematic cross-sectional view illustrating, in the Y direction, the XZ plane overlapping with a portion F1 and a portion F2 that are indicated by dashed-dotted lines in FIG. 8A. The electrode 171 is electrically connected to one of the source and the drain of the OS transistor.

Since the display apparatus 100 is a top-emission display apparatus, the electrode 171 is formed using a conductive material that reflects visible light. In the case where the electrode 171 is used as an anode, the electrode 171 has a stacked-layer structure of ITO and silver, for example. Alternatively, a stacked-layer structure in which silver is interposed between two layers of ITO can be employed, for example.

[Step 7]

Next, the EL layer 172R is formed. In this embodiment, the EL layer 172R is formed using organic EL. The EL layer 172R can be formed by a method such as an evaporation method, a coating method, a printing method, or a discharge method. Steps performed after the formation of the EL layer 172R are preferably performed such that the temperature applied to the EL layer 172R is lower than or equal to the upper temperature limit of the EL layer 172R.

[Step 8]

Next, the electrode 173R is formed. The electrode 173R is formed using a conductive material that transmits visible light. In the case where the electrode 173R is used as a cathode, the electrode 173R has a stacked-layer structure of lithium fluoride and ITO, for example.

[Step 9]

Next, a protective layer 126R is formed. The protective layer 126R is formed using a material that transmits visible light. For the protective layer 126R, a material such as silicon oxide, silicon nitride, aluminum oxide, or an oxide semiconductor can be used, for example. The protective layer 126R may have a single-layer structure or a stacked-layer structure. For example, the protective layer 126R may have a stacked-layer structure of aluminum oxide and silicon nitride, or a stacked-layer structure of an oxide semiconductor (e.g., IGZO) and aluminum oxide.

The protective layer 126R can be formed by, for example, a sputtering method, an ALD method (a thermal ALD method or a PEALD method), or a vacuum evaporation method. The protective layer 126R is preferably formed by a formation method that causes less damage to the EL layer therebelow. Accordingly, the protective layer 126R is preferably formed by an ALD method or a vacuum evaporation method rather than a sputtering method.

Note that the same applies to a protective layer 126G and a protective layer 126B to be described later as to the protective layer 126R.

[Step 10]

Figure 8C:
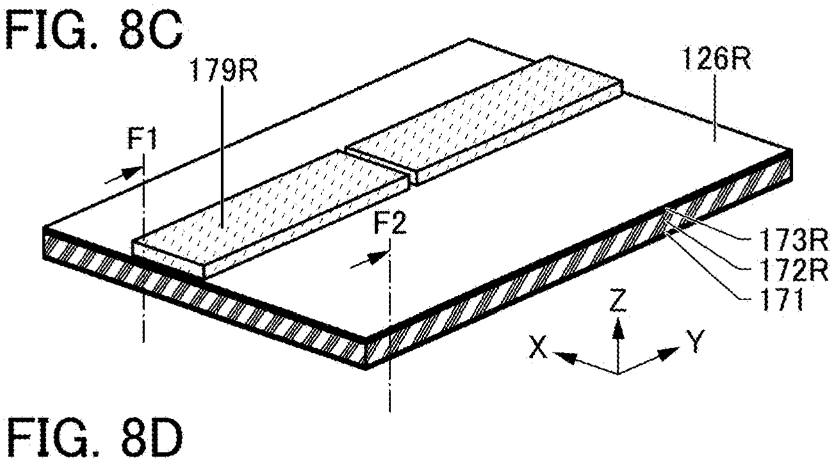
Figure 8D:
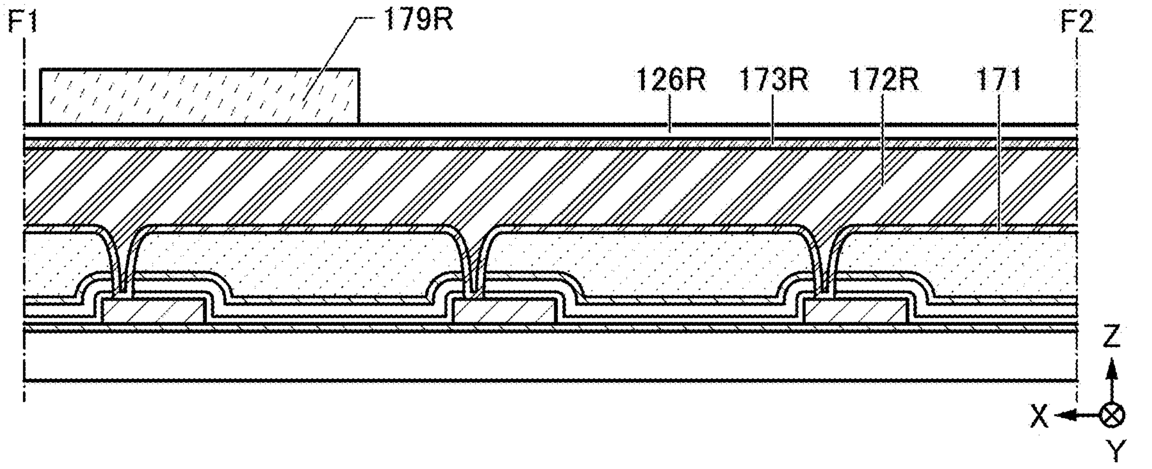

Next, a resist mask 179R is formed over the protective layer 126R (see FIG. 8C and FIG. 8D). FIG. 8C is a schematic perspective view illustrating a state where the resist mask 179R is formed over the electrode 173. FIG. 8D is a schematic cross-sectional view illustrating, in the Y direction, the XZ plane overlapping with the portion F1 and the portion F2 that are indicated by dashed-dotted lines in FIG. 8C.

[Step 11]

Figure 9A:
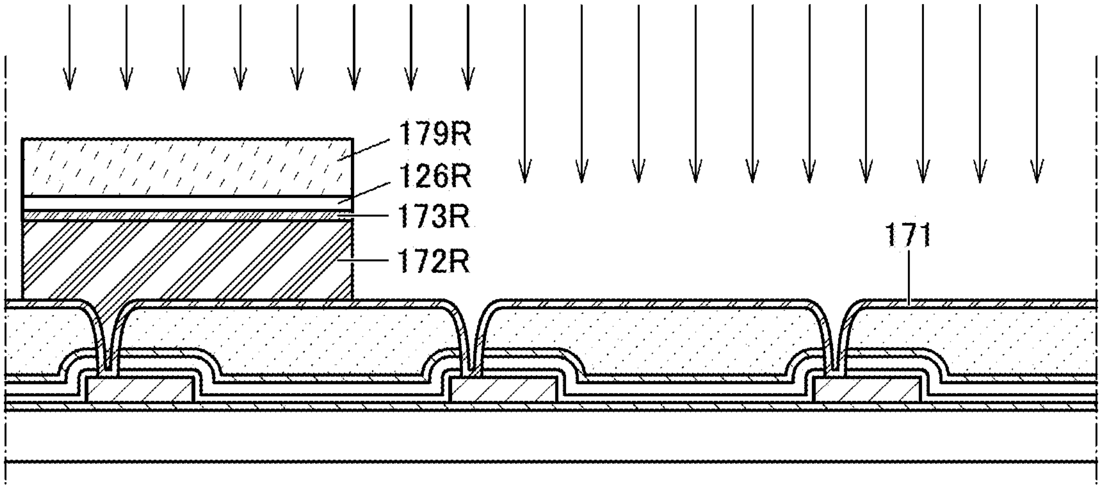
FIG. 9A to FIG. 9C are diagrams illustrating an example of a fabrication method of an element substrate.

Next, parts of the protective layer 126R, the electrode 173R, and the EL layer 172R are selectively removed with the use of the resist mask as a mask (see FIG. 9A). FIG. 9A is a schematic perspective view illustrating a state where etching treatment is performed. After the etching treatment, the resist mask 179R is removed. The resist mask 179R is removed by a dry etching method, a wet etching method, or the like. These etching methods may be used in combination.

[Step 12]

Figure 9B:
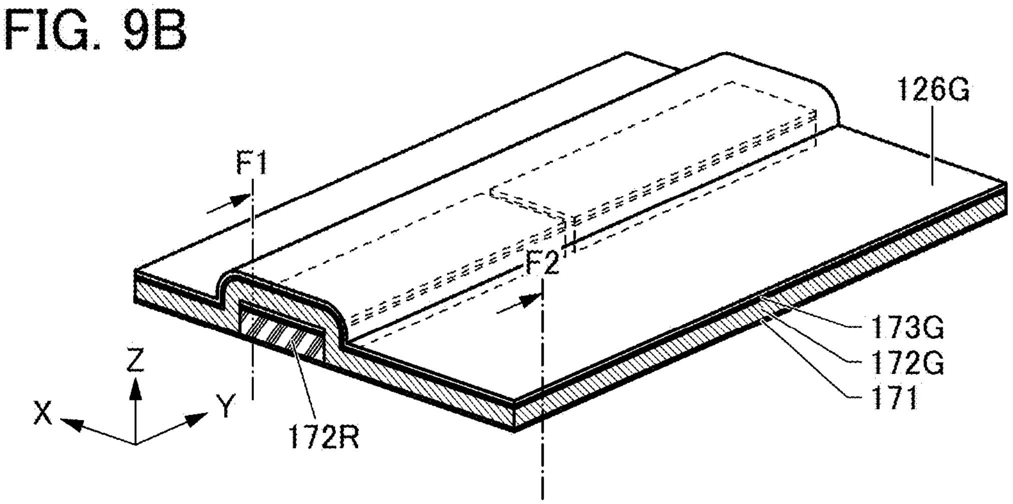
Figure 9C:
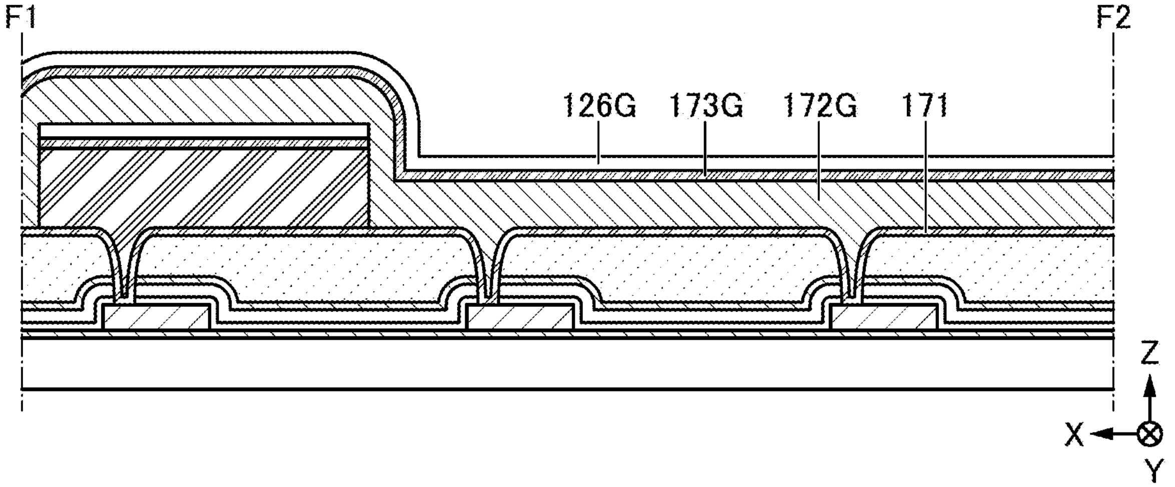

Next, the EL layer 172G is formed (see FIG. 9B and FIG. 9C). FIG. 9B is a schematic perspective view illustrating a structure body provided above the insulating layer 114. FIG. 9C is a schematic cross-sectional view illustrating, in the Y direction, the XZ plane overlapping with the portion F1 and the portion F2 that are indicated by dashed-dotted lines in FIG. 9B. In this embodiment, the EL layer 172G is formed using organic EL. The EL layer 172G can be formed by a method such as an evaporation method, a coating method, a printing method, or a discharge method. Steps performed after the formation of the EL layer 172G are preferably performed such that the temperature applied to the EL layer 172G is lower than or equal to the upper temperature limits of the EL layer 172R and the EL layer 172G.

[Step 13]

Next, the electrode 173G is formed. The electrode 173G is formed using a conductive material that transmits visible light. In the case where the electrode 173G is used as a cathode, the electrode 173G has a stacked-layer structure of lithium fluoride and ITO, for example.

[Step 14]

Next, the protective layer 126G is formed. The protective layer 126G is formed using a material that transmits visible light.

[Step 15]

Figure 10A:
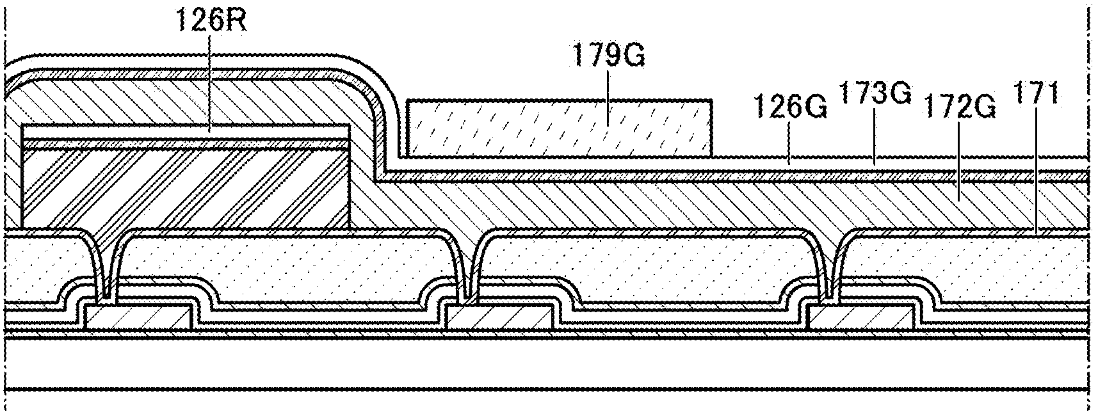
FIG. 10A to FIG. 10C are diagrams illustrating an example of a fabrication method of an element substrate.

Next, a resist mask 179G is formed over the protective layer 126G (see FIG. 10A).

[Step 16]

Figure 10B:
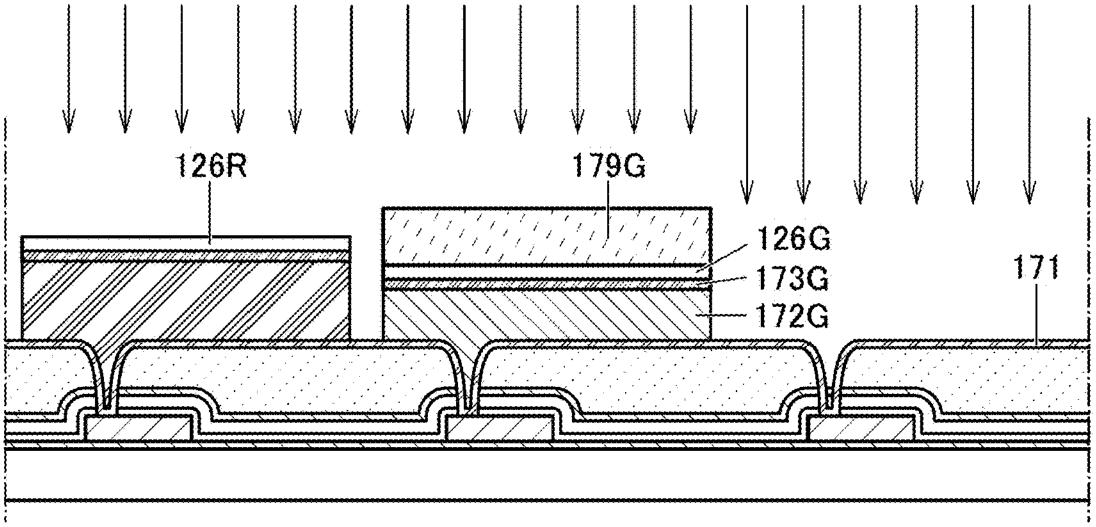

Next, parts of the protective layer 126G, the electrode 173G, and the EL layer 172G are selectively removed with the use of the resist mask as a mask (see FIG. 10B). FIG. 10B is a schematic perspective view illustrating a state where etching treatment is performed. At this time, the etching treatment is performed such that the electrode 173R and the EL layer 172R are not etched. For example, after the protective layer 126G is etched, etching treatment is performed under conditions were the electrode 173G and the EL layer 172G can be etched and the protective layer 126R is less likely to be etched. After the etching treatment, the resist mask 179G is removed (see FIG. 10C). The resist mask 179G is removed by a dry etching method, a wet etching method, or the like. These etching methods may be used in combination.

[Step 17]

Figure 11A:
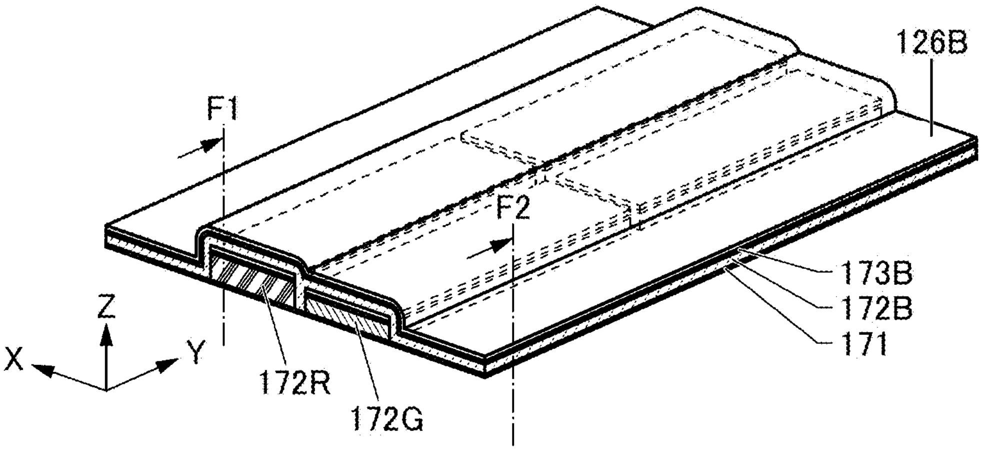
FIG. 11A to FIG. 11C are diagrams illustrating an example of a fabrication method of an element substrate.
Figure 11B:
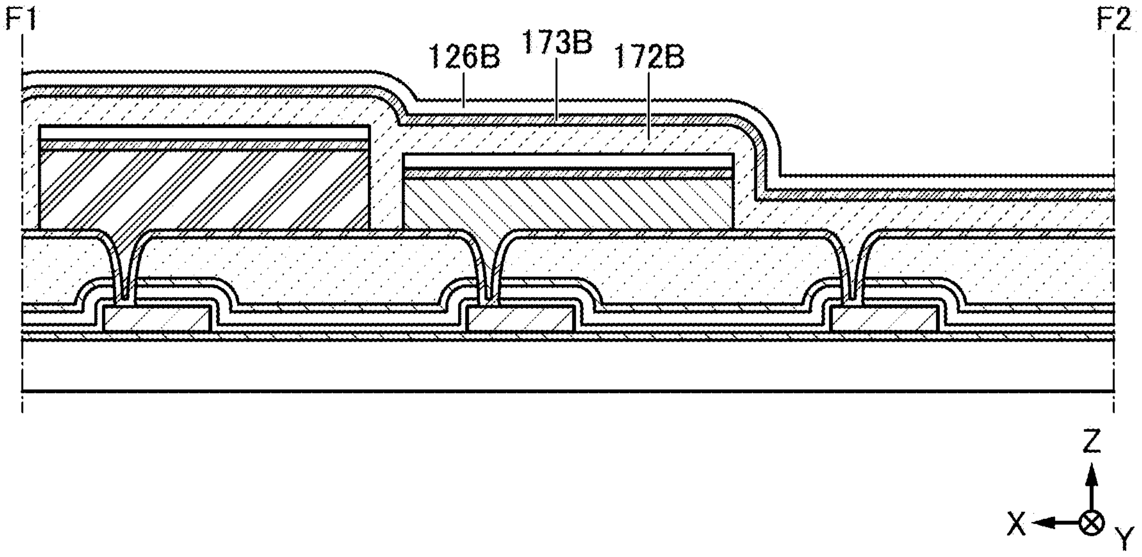
Figure 11C:
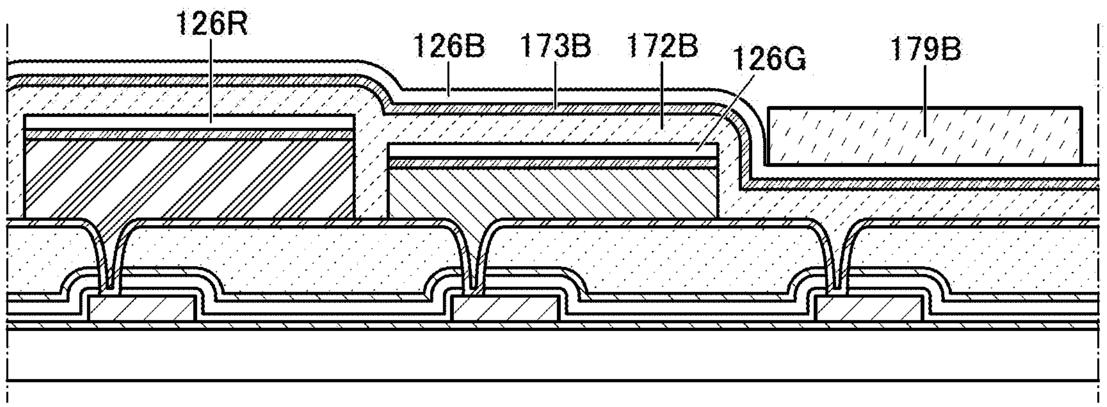

Next, the EL layer 172B is formed (see FIG. 11A and FIG. 11B). FIG. 11A is a schematic perspective view illustrating a structure body provided above the insulating layer 114. FIG. 11B is a schematic cross-sectional view illustrating, in the Y direction, the XZ plane overlapping with the portion F1 and the portion F2 that are indicated by dashed-dotted lines in FIG. 11A. In this embodiment, the EL layer 172B is formed using organic EL. The EL layer 172B can be formed by a method such as an evaporation method, a coating method, a printing method, or a discharge method. Steps performed after the formation of the EL layer 172B are preferably performed such that the temperature applied to the EL layer 172B is lower than or equal to the upper temperature limits of the EL layer 172R, the EL layer 172G, and the EL layer 172B.

[Step 18]

Next, the electrode 173B is formed. The electrode 173B is formed using a conductive material that transmits visible light. In the case where the electrode 173B is used as a cathode, the electrode 173B has a stacked-layer structure of lithium fluoride and ITO, for example.

[Step 19]

Next, the protective layer 126B is formed. The protective layer 126B is formed using a material that transmits visible light.

[Step 20]

Figure 10C:
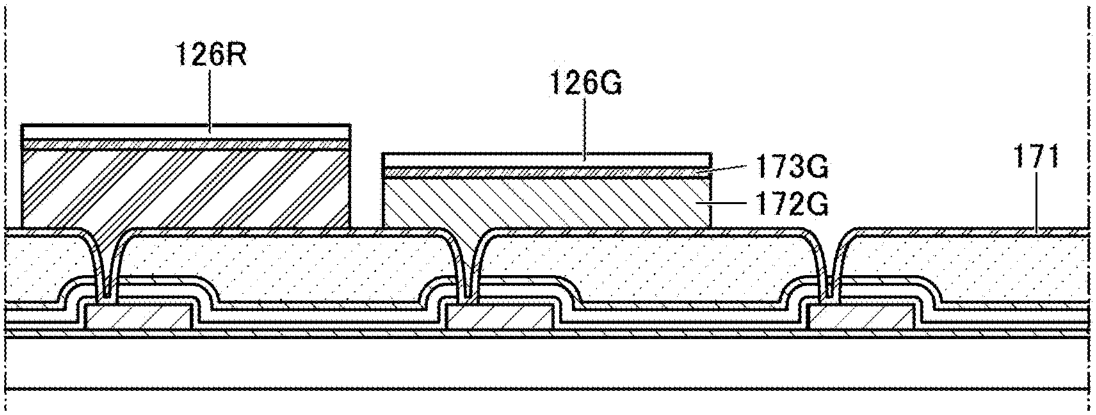

Next, a resist mask 179B is formed over the protective layer 126B (see FIG. 10C).

[Step 21]

Figure 12A:
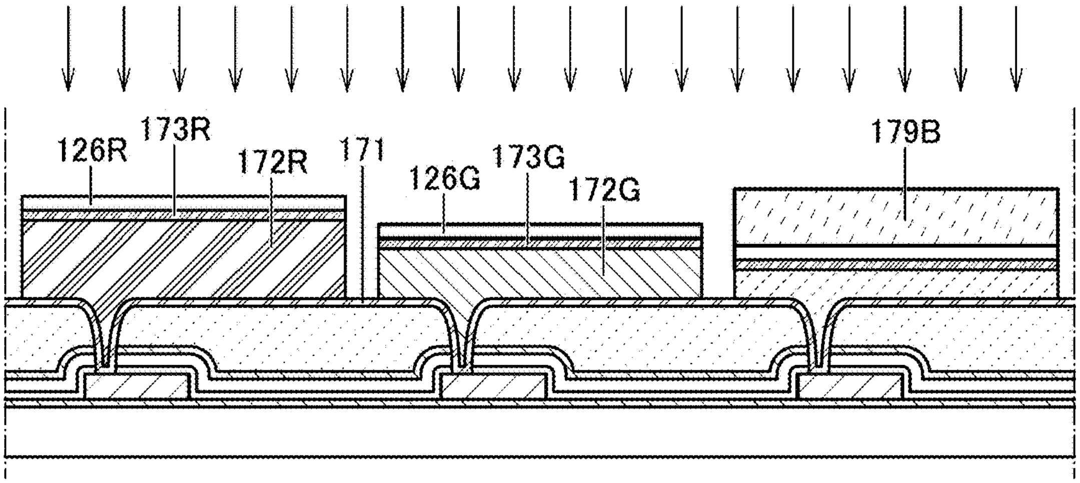
FIG. 12A to FIG. 12C are diagrams illustrating an example of a fabrication method of an element substrate.

Next, parts of the protective layer 126B, the electrode 173B, and the EL layer 172B are selectively removed with the use of the resist mask as a mask (see FIG. 12A). FIG. 12A is a schematic perspective view illustrating a state where etching treatment is performed. At this time, the etching treatment is performed such that the electrode 173R, the EL layer 172R, the electrode 173G, and the EL layer 172G are not etched. For example, after the protective layer 126B is etched, etching treatment is performed under conditions were the electrode 173B and the EL layer 172B can be etched and the protective layer 126R and the protective layer 126G are less likely to be etched. After the etching treatment, the resist mask 179B is removed. The resist mask 179B is removed by a dry etching method, a wet etching method, or the like. These etching methods may be used in combination.

[Step 22]

Figure 12B:
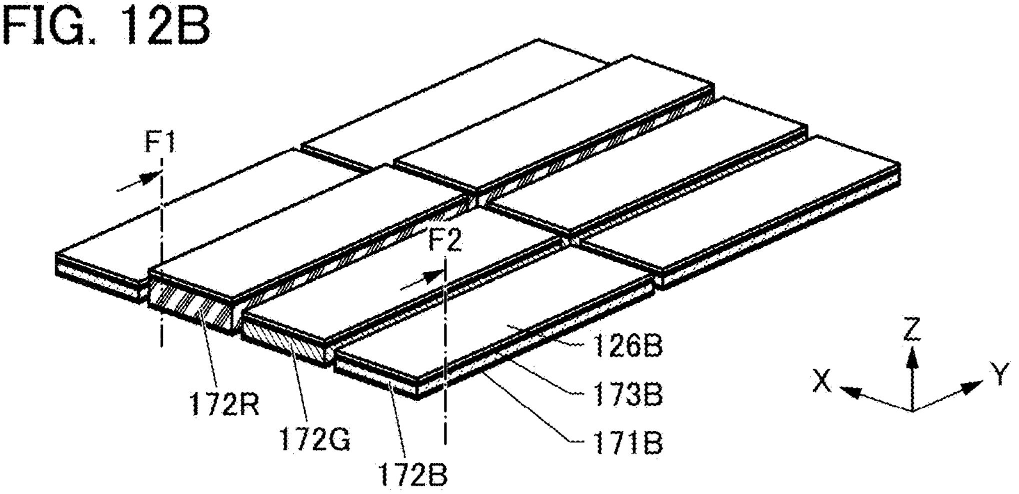
Figure 12C:
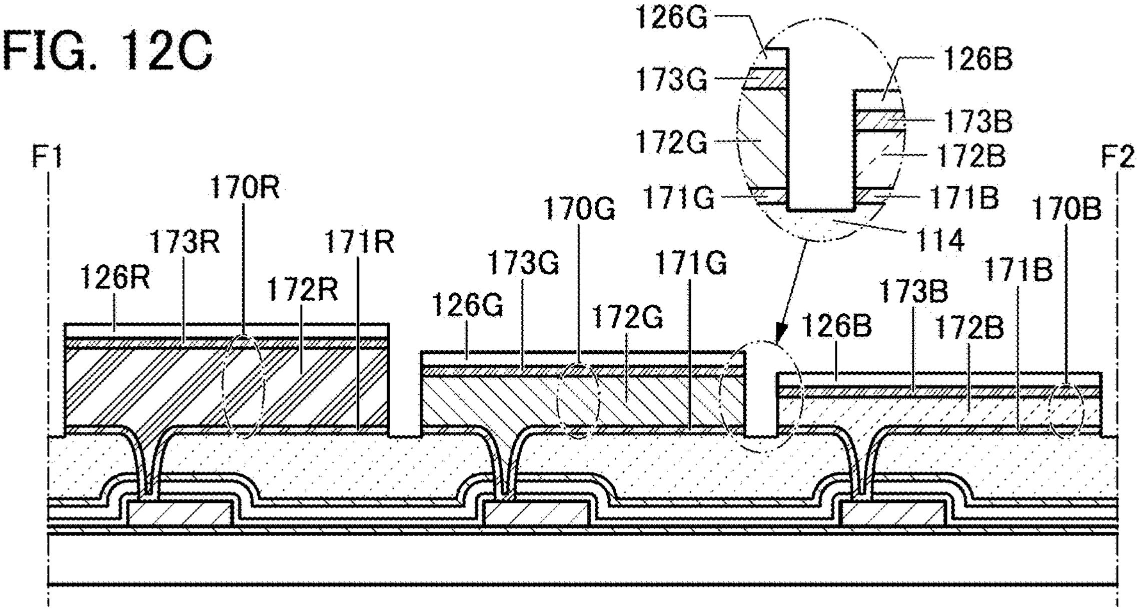

Next, part of the electrode 171 is selectively removed with the use of the protective layer 126 (the protective layer 126R, the protective layer 126G, and the protective layer 126B) as a mask. FIG. 12B is a schematic perspective view illustrating a structure body provided above the insulating layer 114. FIG. 12C is a schematic cross-sectional view illustrating, in the Y direction, the XZ plane overlapping with the portion F1 and the portion F2 that are indicated by dashed-dotted lines in FIG. 12B.

When part of the electrode 171 is selectively removed with the use of the protective layer 126 as a mask, the electrode 171R overlapping with the protective layer 126R, the electrode 171G overlapping with the protective layer 126G, and the electrode 171B overlapping with the protective layer 126B are formed. At the time of selective removal of part of the electrode 171, part of the insulating layer 114 is removed and a concave portion is formed in part of the insulating layer 114, in some cases. Note that Step 22 may be performed before the resist mask 179B is removed.

Owing to the above fabrication method, side surfaces of the electrode 171, the EL layer 172, and the electrode 173 can be substantially aligned with each other. The side surfaces of the electrode 171, the EL layer 172, and the electrode 173 are preferably substantially aligned with each other, in which case the coverage with an insulating layer and the like to be formed in a later step can be increased.

In this manner, the light-emitting element 170 (the light-emitting element 170R, the light-emitting element 170G, and the light-emitting element 170B) can be formed.

When the light-emitting element 170 is formed by etching treatment using the resist mask, electric interference between adjacent light-emitting layers can be prevented without use of a partition. Thus, formation of a partition is unnecessary and the productivity of the display apparatus can be increased. Since formation of a partition is unnecessary, an improvement in pixel aperture ratio, an increase in resolution, a reduction in size, and the like can be achieved.

According to one embodiment of the present invention, selective removal of parts of the electrode 171, the EL layer 172, and the electrode 173 with the use of the resist mask enables separate formation of light-emitting elements functioning as pixels. This allows fabrication of light-emitting elements without use of a metal mask or with use of a smaller number of metal masks, thereby increasing the productivity of the display apparatus.

For example, when the light-emitting element 170 is formed using a metal mask, because of the dimensional accuracy restriction, it is difficult to make the shortest distance between the light-emitting elements 170 less than or equal to 20 μm. According to one embodiment of the present invention, the shortest distance between adjacent light-emitting elements 170 can be less than or equal to 20 μm. Specifically, the distance between adjacent light-emitting elements 170 can be greater than or equal to 0.1 μm and less than or equal to 15 μm, preferably greater than or equal to 0.1 μm and less than or equal to 10 μm, further preferably greater than or equal to 0.1 μm and less than or equal to 5 μm. Thus, an improvement in pixel aperture ratio, an increase in resolution, a reduction in size, and the like can be achieved.

[Step 23]

Figure 13A:
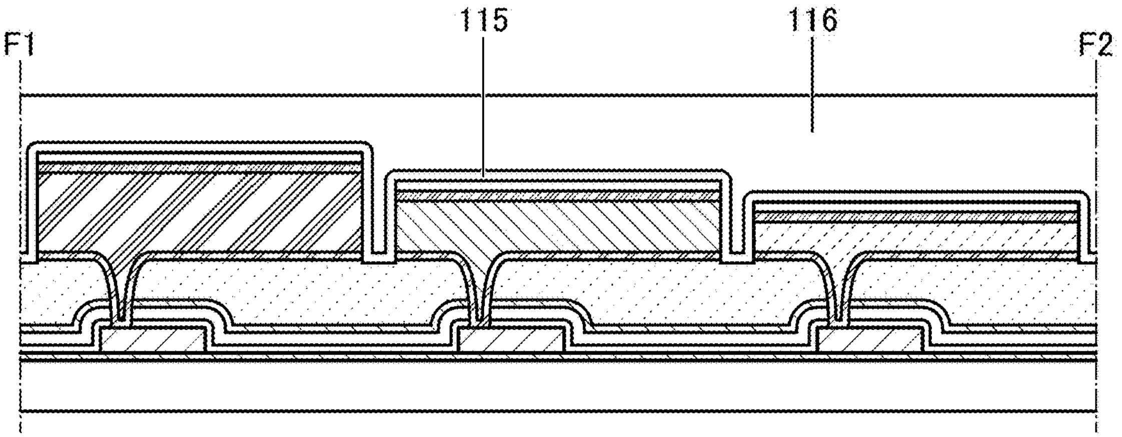
FIG. 13A to FIG. 13C are diagrams illustrating an example of a fabrication method of an element substrate.

Next, the insulating layer 115 covering the light-emitting element 170 is formed (see FIG. 13A). A material through which impurities such as water and hydrogen do not easily diffuse is preferably used for the insulating layer 115. Thus, the insulating layer 115 can function as a barrier film. Such a structure can effectively inhibit diffusion of the impurities into the light-emitting element 170 and the transistors from the outside, and can achieve a highly reliable display apparatus.

For the insulating layer 115, a single layer or a stacked layer containing aluminum oxide, aluminum nitride, silicon oxide, silicon nitride, hafnium oxide, zirconium oxide, or the like may be used, for example.

The insulating layer 115 is preferably formed by an ALD method, which provides good step coverage. When the insulating layer 115 is formed by an ALD method, the side surfaces of the electrode 171, the EL layer 172, and the electrode 173 can be covered with the insulating layer 115.

[Step 24]

Next, the insulating layer 116 is formed over the insulating layer 115. The insulating layer 116 preferably functions as a planarization layer.

[Step 25]

Next, the electrode 117 is formed to be embedded in the insulating layer 115 and the insulating layer 116. The electrode 117 is provided for each light-emitting element 170 and electrically connected to the electrode 173. The number of the electrodes 117 provided for each light-emitting element 170 is not limited to one. A plurality of electrodes 117 may be provided for one light-emitting element 170.

[Step 26]

Figure 13B:
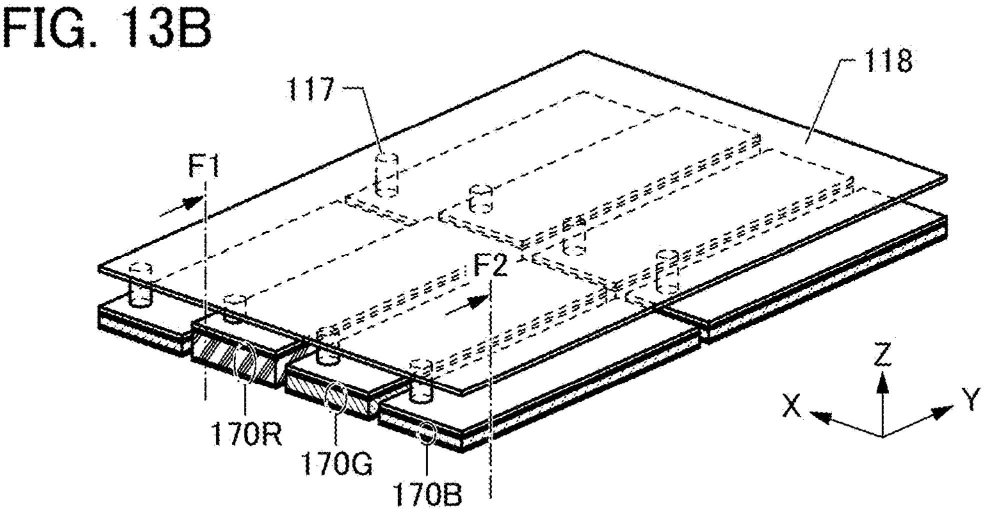
Figure 13C:
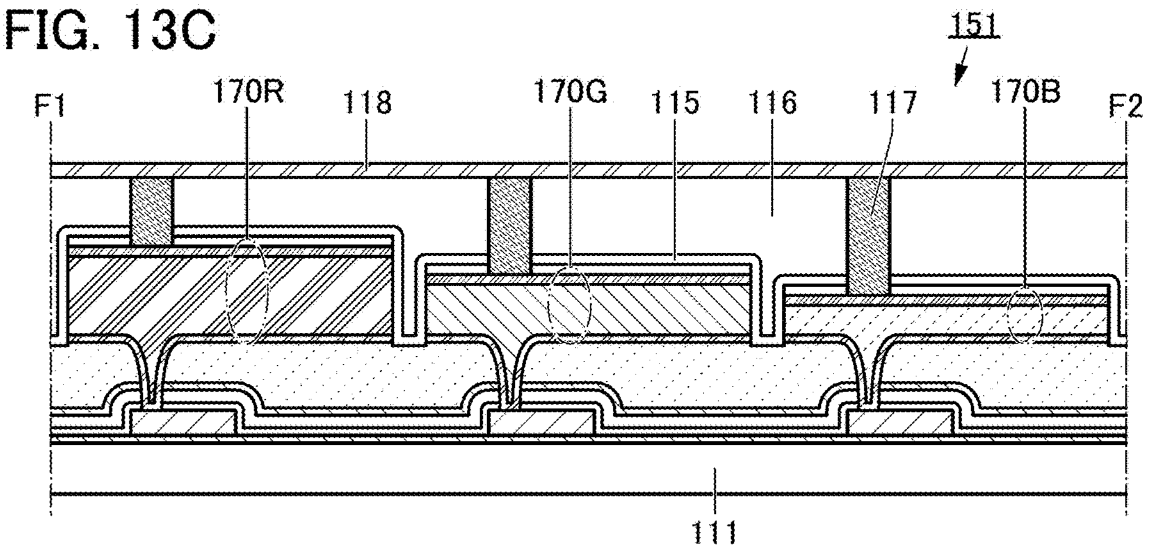

Next, the conductive layer 118 is formed over the insulating layer 116 and the electrode 117 (see FIG. 13B and FIG. 13C). FIG. 13B is a schematic perspective view illustrating a state where the conductive layer 118 is provided over the light-emitting element 170. FIG. 13C is a schematic cross-sectional view illustrating, in the Y direction, the XZ plane overlapping with the portion F1 and the portion F2 that are indicated by dashed-dotted lines in FIG. 13B.

The conductive layer 118 is electrically connected to the electrodes 173 included in a plurality of the light-emitting elements 170 and functions as a common electrode. By forming the conductive layer 118 using a conductive material with a light-transmitting property, the light 175 emitted by the light-emitting elements 170 can be extracted without being blocked. Accordingly, the conductive layer 118 can be provided to cover the light-emitting elements 170. That is, the conductive layer 118 can be provided to cover the entire display region 235.

The conductive layer 118 can function as a cathode auxiliary conductive layer. Providing the conductive layer 118 reduces a potential variation of the cathodes (the electrodes 173) in the entire display region 235 and enables uniform emission intensity to be obtained. Consequently, the display quality of the display apparatus can be improved.

In the above manner, the element substrate 151 can be fabricated.

Modification Example 1

Figure 14A:
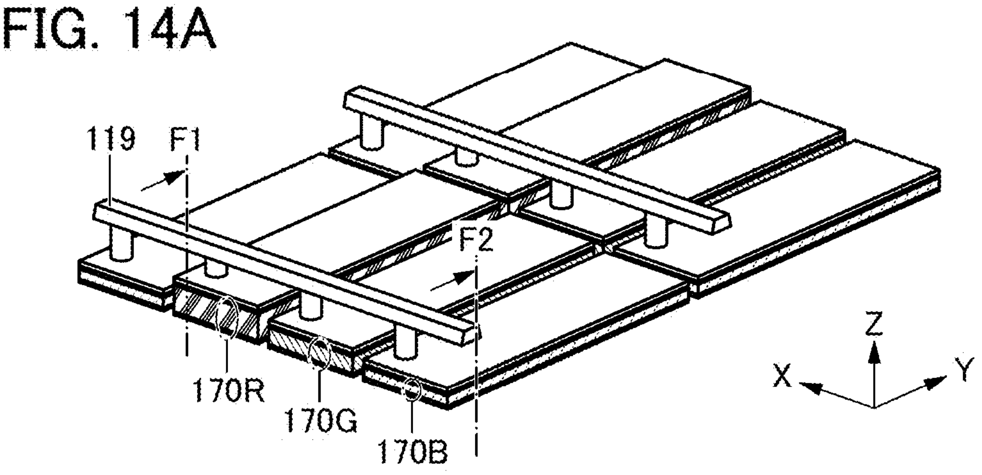
FIG. 14A and FIG. 14B are diagrams illustrating a modification example of an element substrate.
Figure 14B:
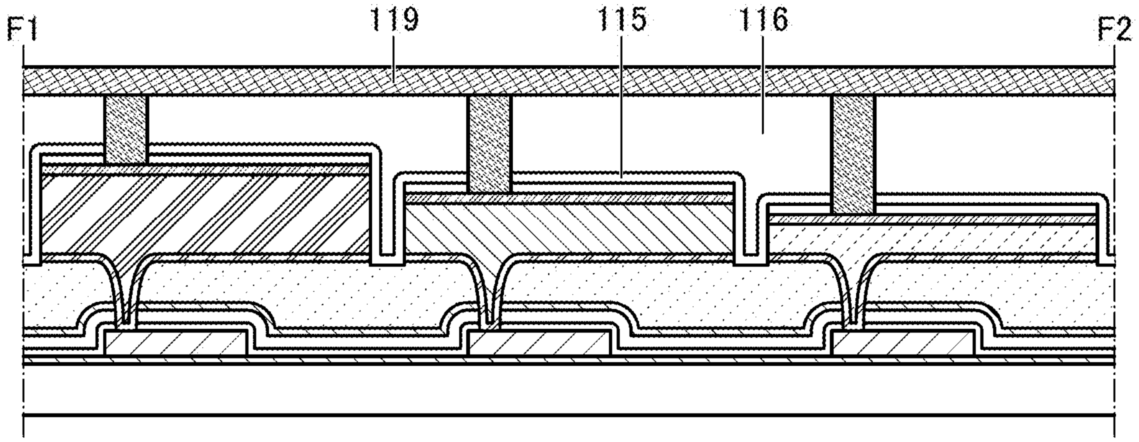

FIG. 14 illustrates a modification example of the element substrate 151. In the element substrate 151, a wiring 119 may be provided instead of the conductive layer 118 over the insulating layer 116 and the electrode 117. FIG. 14A is a schematic perspective view illustrating a state where the wiring 119 is provided over the light-emitting element 170. FIG. 14B is a schematic cross-sectional view illustrating, in the Y direction, the XZ plane overlapping with the portion F1 and the portion F2 that are indicated by dashed-dotted lines in FIG. 14A.

The wiring 119 can be formed using a conductive material with a light-transmitting property or a light-blocking property. In the case where the wiring 119 is formed using a material with a light-blocking property, it is preferred that the wiring 119 be positioned so that an overlapping area with the light-emitting element 170 is as small as possible. The wiring 119 can function as a cathode auxiliary wiring. When the cathodes of adjacent light-emitting elements are electrically connected to the wiring 119, a potential variation of the cathodes can be reduced. Consequently, the display quality of the display apparatus can be improved.

Although the wiring 119 extends in the X direction and is electrically connected to the electrodes 117 that are adjacent to each other in the X direction in FIG. 14, the wiring 119 may extend to the Y direction and may be electrically connected to the electrodes 117 that are adjacent to each other in the Y direction. The wiring 119 may be arranged in a net-like shape.

Modification Example 2

Figure 15A:
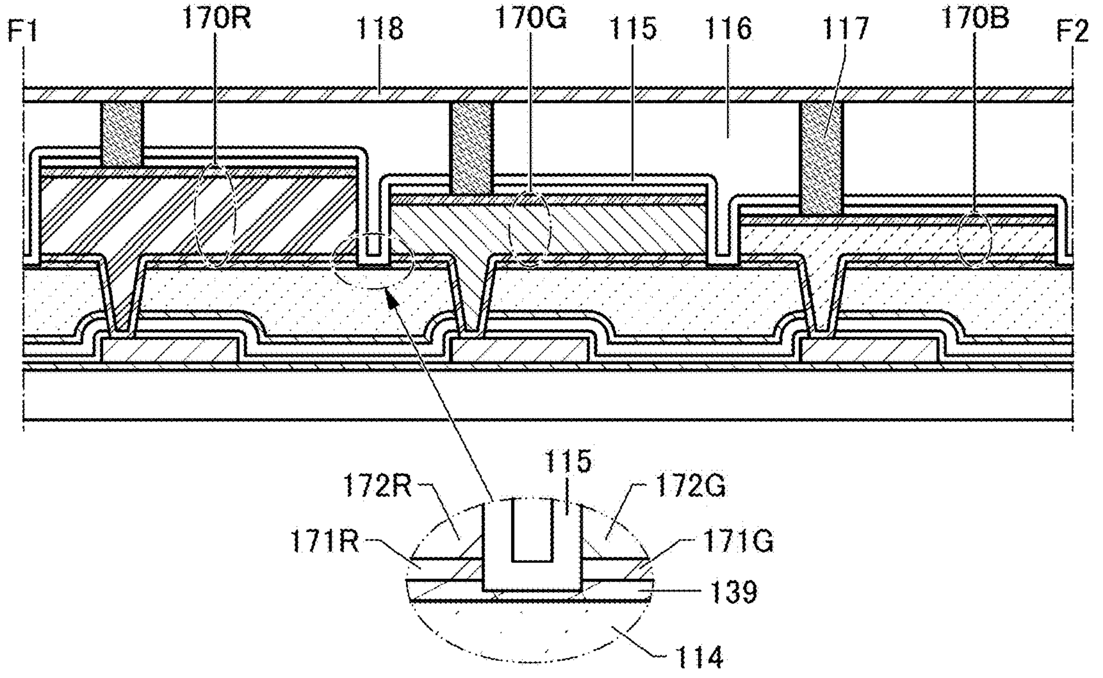
FIG. 15A to FIG. 15C are diagrams illustrating modification examples of an element substrate.

As illustrated in FIG. 15A, an insulating layer 139 may be provided between the insulating layer 114 and the electrode 171. For the insulating layer 139, a material which is less likely to be etched in Step 22 than the insulating layer 114 is used. The insulating layer 139 can function as an etching stopper for the etching of part of the electrode 171 in Step 22.

Particularly when Step 22 is performed by a dry etching method or mainly by a dry etching method, the insulating layer 139 is preferably provided. Providing the insulating layer 139 that has higher etching resistance than the insulating layer 114 can increase the process design flexibility of Step 22, thereby increasing the productivity and the reliability.

Modification Example 3

Figure 15B:
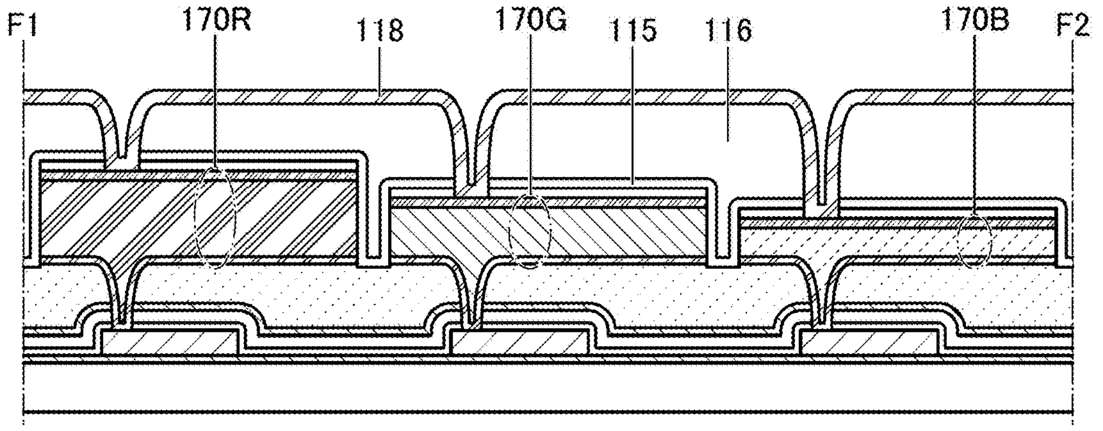

As illustrated in FIG. 15B, without providing the electrode 117, the conductive layer 118 and the electrode 173 may be electrically connected to each other. Not providing the electrode 117 can simplify the fabrication process and increase the productivity of the display apparatus.

Modification Example 4

Figure 15C:
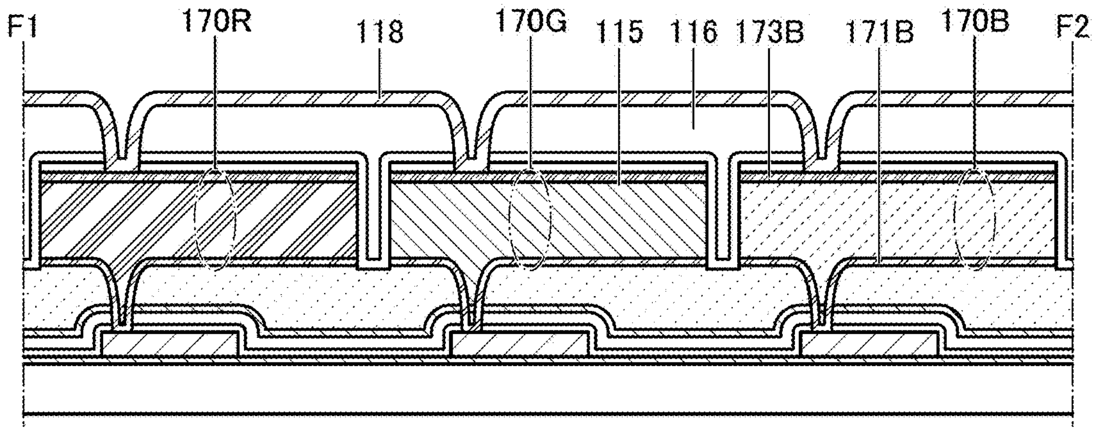

In the case where the light-emitting element 170 does not have a microcavity structure, the distance between the electrode 171 and the electrode 173 may be substantially the same in the light-emitting element 170R, the light-emitting element 170G, and the light-emitting element 170B as illustrated in FIG. 15C.

Modification Example 5

Figure 16A:
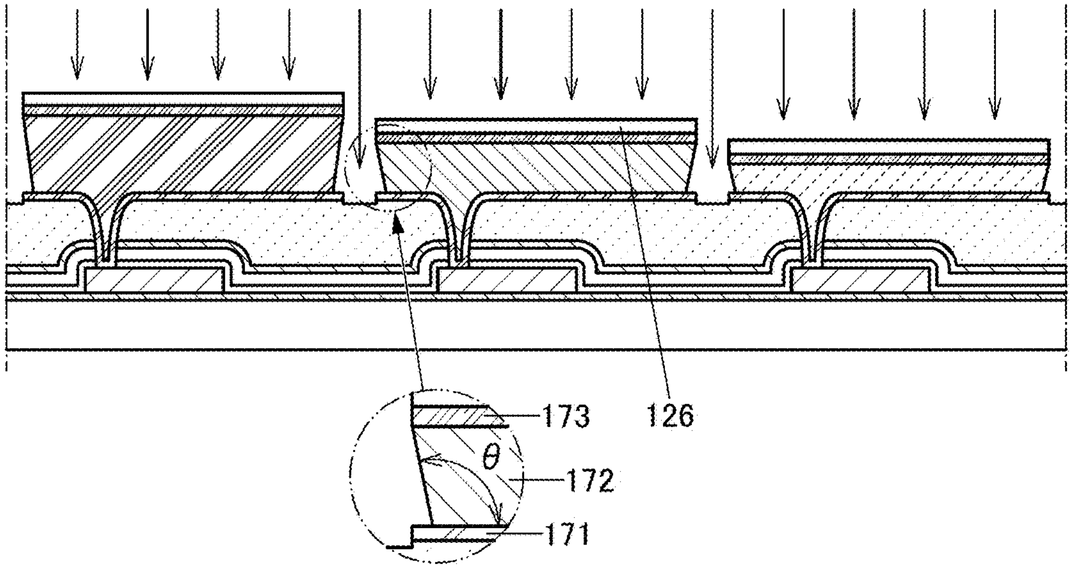
FIG. 16A to FIG. 16C are diagrams illustrating an example of a fabrication method of an element substrate.

Next, a fabrication method of the display apparatus 100E (see FIG. 6) in which the side surface of the EL layer 172 has an inverse tapered shape is described. After part of the electrode 171 is selectively removed in Step 22, etching conditions are changed and the side surface of the EL layer 172 is etched (see FIG. 16A). The etching of the side surface of the EL layer 172 is preferably performed by a dry etching method. The shape of the side surface of the EL layer 172 can be controlled by the dry etching conditions and the distance between adjacent light-emitting elements 170.

Figure 16B:
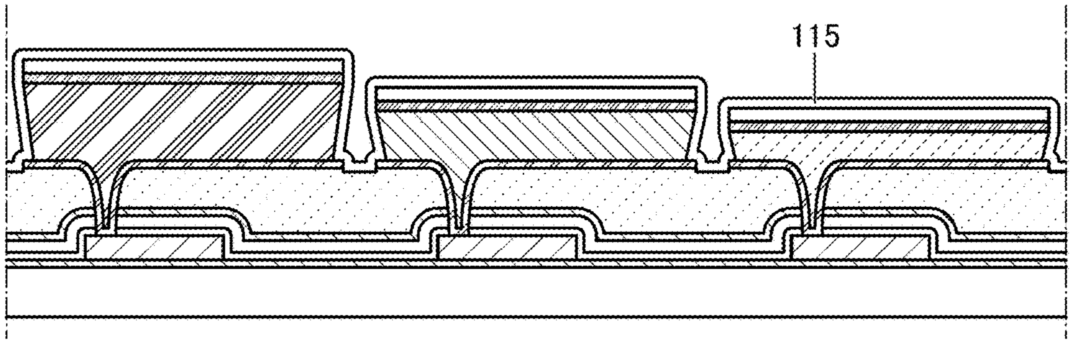

Subsequently, Step 23 is performed to form the insulating layer 115 that covers the side surfaces of the electrode 171, the EL layer 172, and the electrode 173 (see FIG. 16B).

Figure 16C:
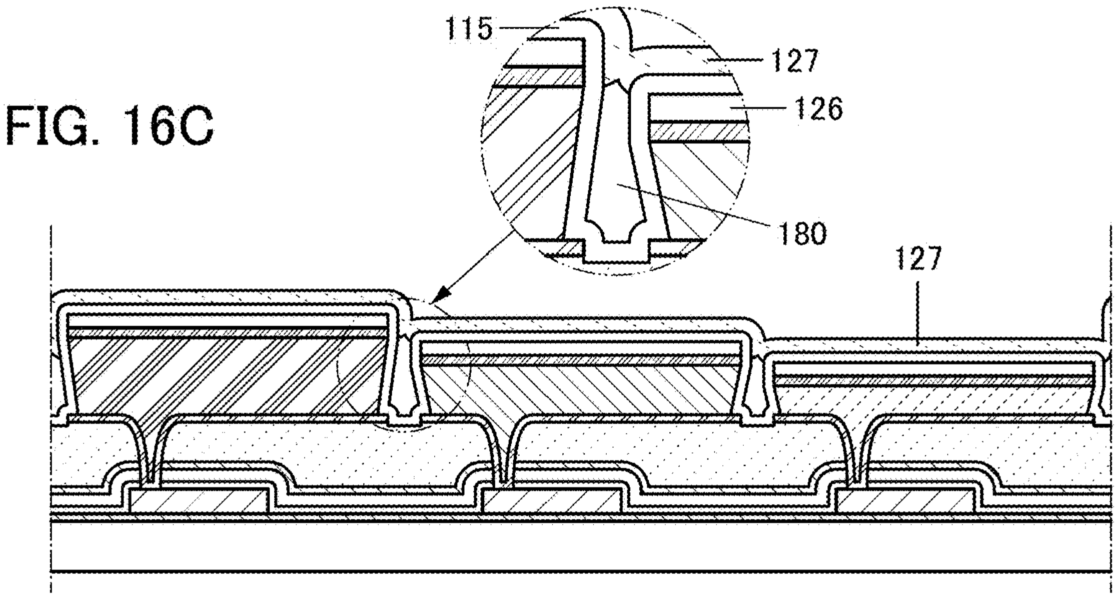

After the formation of the insulating layer 115, the insulating layer 127 is formed over the insulating layer 115 (see FIG. 16C). The insulating layer 127 is formed by a sputtering method, a CVD method, or the like, in a condition with poor coverage. A sputtering method is particularly preferable because deposition in a condition with poor coverage is easily conducted. For example, as the insulating layer 127, a silicon nitride layer is formed by a sputtering method. By the formation of the insulating layer 127, the LDR 180 is formed between adjacent two light-emitting elements 170.

The LDR 180 is a gap surrounded by the insulating layer 115 and the insulating layer 127. Thus, the dielectric constant of the LDR 180 can be 1 or close to 1. The LDR 180 contains some sort of gas in some cases. In the case where the insulating layer 127 is formed under reduced pressure, at least part of the LDR 180 is under reduced pressure in some cases. In the case where the insulating layer 127 is formed by a sputtering method, for example, an element contained in a sputtering gas might be contained. For example, a Group 18 element (rare gas (novel gas)), nitrogen, oxygen, or the like might be contained.

The LDR 180 may remain as a gap, or a structure body having a lower refractive index than the insulating layer 115 may be provided in the LDR 180. For example, the LDR 180 may be filled with a resin or the like containing fluorine. Providing a structure body in the LDR 180 can increase the mechanical strength of the element substrate 151.

Figure 17A:
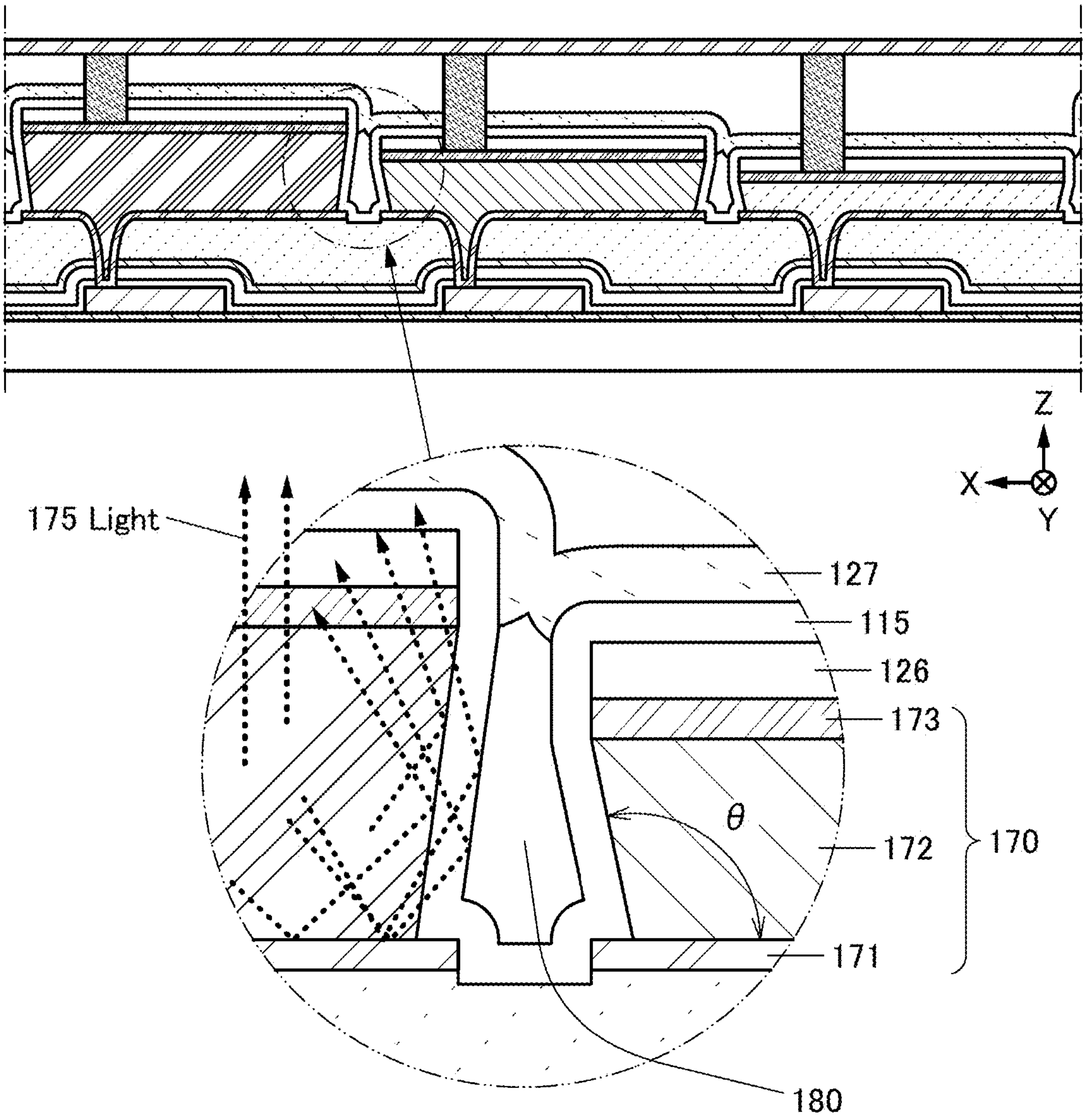
FIG. 17A to FIG. 17D are diagrams illustrating modification examples of an element substrate.

When the LDR 180 is provided on the side surface of the EL layer 172 with the insulating layer 115 therebetween, part of the light 175 generated by the EL layer 172 is reflected at the interface between the insulating layer 115 and the LDR 180 (see FIG. 17A). Note that another part of the light 175 might be reflected at the interface between the EL layer 172 and the insulating layer 115.

The side surface of the EL layer 172 having an inverse tapered shape allows part of the light 175 generated by the EL layer 172 to be reflected in the top surface direction. Thus, the extraction efficiency of the light 175 can be increased. Accordingly, the luminance of the display apparatus 100 can be increased.

The taper angle θ formed between the bottom surface of the EL layer 172 and the side surface of the EL layer 172 is preferably larger than 90° and smaller than or equal to 100°, further preferably larger than 90° and smaller than or equal to 120°, still further preferably larger than 90° and smaller than or equal to 135°.

Figure 17B:
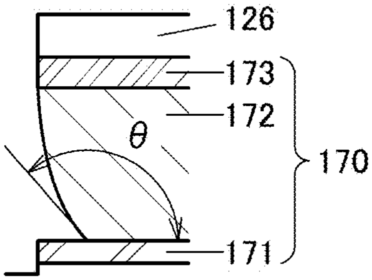
Figure 17C:
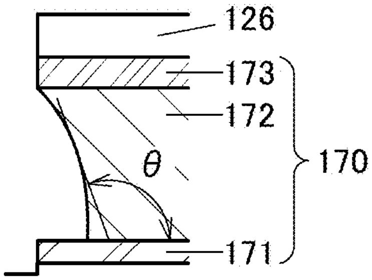
Figure 17D:
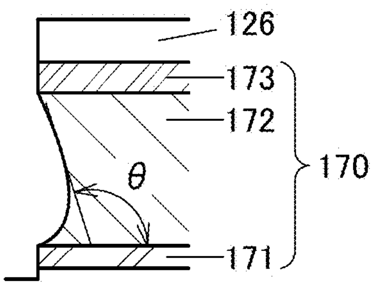

The side surface of the EL layer 172 may have a convex shape as illustrated in FIG. 17B, or may have a concave shape as illustrated in FIG. 17C or FIG. 17D. In the shapes illustrated in FIG. 17B and FIG. 17C, the area where the EL layer 172 and the electrode 173 are in contact with each other is larger than the area where the EL layer 172 and the electrode 171 are in contact with each other. In FIG. 17D, the area where the EL layer 172 and the electrode 171 are in contact with each other is the same as the area where the EL layer 172 and the electrode 173 are in contact with each other, and part of the side surface of the EL layer 172 is constricted. Thus, at least part of the side surface of the EL layer 172 needs to have an inverse tapered shape.

Specifically, it is preferred that, when the EL layer 172 is seen from the X direction or the Y direction, ⅓ or more of the side surface of the EL layer 172 have the taper angle θ in the above range. It is further preferred that, when the EL layer 172 is seen from the X direction or the Y direction, ½ or more of the side surface of the EL layer 172 have the taper angle θ in the above range.

This embodiment can be implemented in an appropriate combination with the structures described in the other embodiments and the like.

Embodiment 2

Figure 19A:
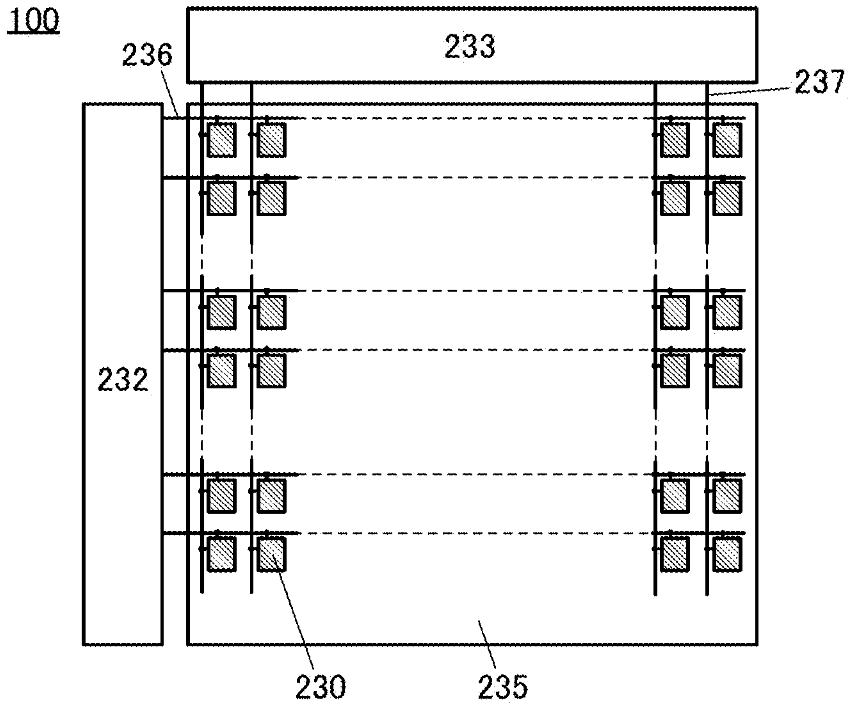
Figure 19A:
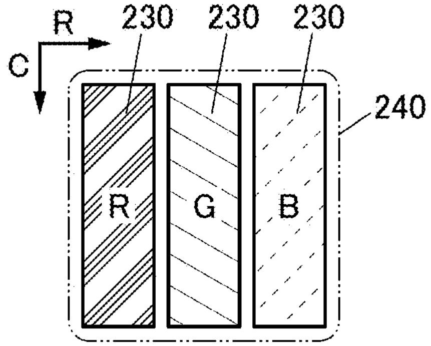
Figure 19A:
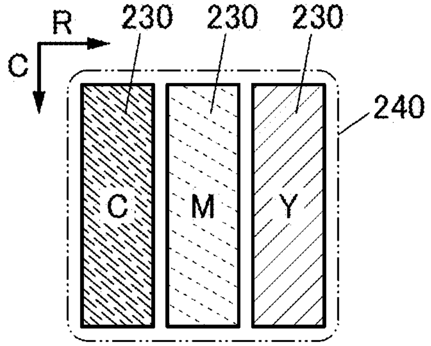
Figure 19A:
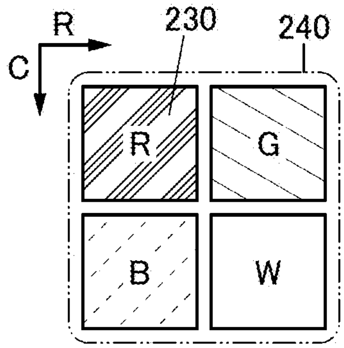
Figure 19A:
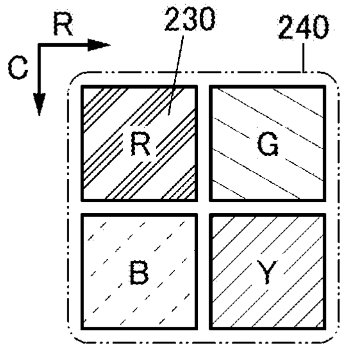
Figure 19A:
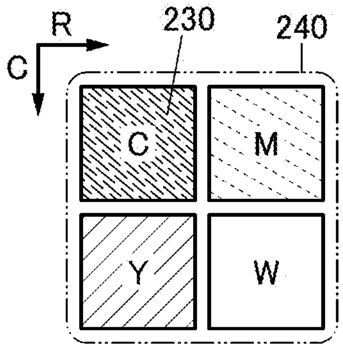

In this embodiment, specific structure examples of the display apparatus 100 of one embodiment of the present invention will be described. FIG. 19A is a block diagram illustrating the display apparatus 100. As described in Embodiment 1, the display apparatus 100 includes the display region 235, the peripheral circuit region 232, and the peripheral circuit region 233.

A circuit included in the peripheral circuit region 232 functions as, for example, a scan line driver circuit. A circuit included in the peripheral circuit region 232 functions as, for example, a signal line driver circuit. Note that some sort of circuit may be provided at a position facing the peripheral circuit region 232 with the display region 235 positioned therebetween. Some sort of circuit may be provided at a position facing the peripheral circuit region 233 with the display region 235 positioned therebetween. As described above, the circuits included in the peripheral circuit region 232 and the peripheral circuit region 233 are collectively referred to as a "peripheral driver circuit" in some cases.

Any of various circuits such as a shift register, a level shifter, an inverter, a latch, an analog switch, and a logic circuit can be used as the peripheral driver circuit. In the peripheral driver circuit, a transistor, a capacitor, and the like can be used. A transistor included in the peripheral driver circuit can be formed in the same steps as the transistors included in the pixels 230.

The display apparatus 100 includes m wirings 236 which are arranged substantially parallel to each other and whose potentials are controlled by the circuits included in the peripheral circuit region 232, and n wirings 237 which are arranged substantially parallel to each other and whose potentials are controlled by the circuits included in the peripheral circuit region 233.

The display region 235 includes a plurality of pixels 230 arranged in a matrix. Full-color display can be achieved by making the pixel 230 that controls red light, the pixel 230 that controls green light, and the pixel 230 that controls blue light collectively function as one pixel 240 and by controlling the amount of light (emission luminance) emitted from each pixel 230. Thus, the three pixels 230 each function as a subpixel. That is, three subpixels control the emission amount or the like of red light, green light, and blue light (see FIG. 19B1). The light colors controlled by the three subpixels are not limited to a combination of red (R), green (G), and blue (B) and may be cyan (C), magenta (M), and yellow (Y) (see FIG. 19B2).

Four subpixels may collectively function as one pixel. For example, a subpixel that controls white light may be added to the three subpixels that control red light, green light, and blue light (see FIG. 19B3). The addition of the subpixel that controls white light can increase the luminance of a display region. Alternatively, a subpixel that controls yellow light may be added to the three subpixels that control red light, green light, and blue light (see FIG. 19B4). Alternatively, a subpixel that controls white light may be added to the three subpixels that control cyan light, magenta light, and yellow light (see FIG. 19B5).

When the number of subpixels functioning as one pixel is increased and subpixels that control light of red, green, blue, cyan, magenta, yellow, and the like are used in an appropriate combination, the reproducibility of halftones can be increased. Thus, display quality can be increased.

The display apparatus according to one embodiment of the present invention can reproduce the color gamut of various standards. For example, the display apparatus according to one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display apparatuses used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

Using the pixels 240 arranged in a matrix of 1920×1080, the display apparatus 100 that can perform full color display with a resolution of what is called full high definition (also referred to as "2K resolution", "2K1K", "2K", or the like) can be obtained. For example, using the pixels 240 arranged in a matrix of 3840×2160, the display apparatus 100 that can perform full color display with a resolution of what is called ultra high definition (also referred to as "4K resolution", "4K2K", "4K", or the like) can be obtained. For example, using the pixels 240 arranged in a matrix of 7680×4320, the display apparatus 100 that can perform full color display with a resolution of what is called super high definition (also referred to as "8K resolution", "8K4K", "8K", or the like) can be obtained. By increasing the number of pixels 240, the display apparatus 100 that can perform full-color display with 16K or 32K resolution can also be obtained.

<Circuit Configuration Example of Pixel 230>

Figure 20A:
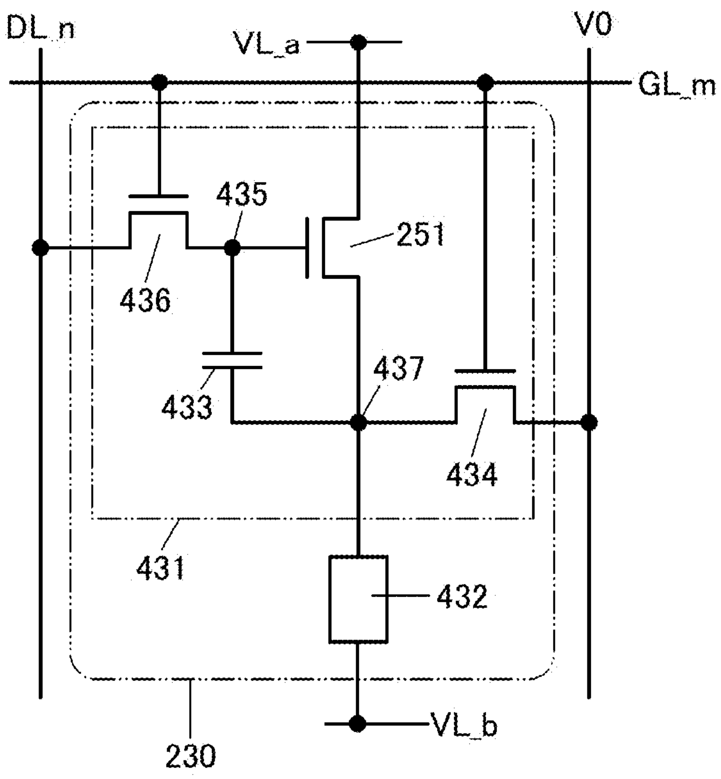
FIG. 20A to FIG. 20C are diagrams illustrating configuration examples of a pixel circuit.

FIG. 20A is a diagram illustrating a circuit configuration example of the pixel 230. The pixel 230 includes a pixel circuit 431 and a display element 432.

Each of the wirings 236 is electrically connected to n pixel circuits 431 in a given row among the pixel circuits 431 arranged in m rows and n columns in the display region 235. Each of the wirings 237 is electrically connected to m pixel circuits 431 arranged in a given column among the pixel circuits 431 arranged in m rows and n columns. Note that m and n are each an integer of 1 or more.

The pixel circuit 431 includes a transistor 436, a capacitor 433, the transistor 251, and a transistor 434. The pixel circuit 431 is electrically connected to the display element 432.

One of a source electrode and a drain electrode of the transistor 436 is electrically connected to a wiring to which a data signal (also referred to as "video signal") is supplied (hereinafter referred to as a signal line DL_n). A gate electrode of the transistor 436 is electrically connected to a wiring to which a gate signal is supplied (hereinafter referred to as a scan line GL_m). The signal line DL_n and the scan line GL_m correspond to the wiring 237 and the wiring 236, respectively.

The transistor 436 has a function of controlling writing of the data signal to a node 435.

One of a pair of electrodes of the capacitor 433 is electrically connected to the node 435, and the other is electrically connected to a node 437. The other of the source electrode and the drain electrode of the transistor 436 is electrically connected to the node 435.

The capacitor 433 has a function of a storage capacitor for storing data written to the node 435.

One of a source electrode and a drain electrode of the transistor 251 is electrically connected to a potential supply line VL_a, and the other is electrically connected to the node 437. Furthermore, a gate electrode of the transistor 251 is electrically connected to the node 435.

One of a source electrode and a drain electrode of the transistor 434 is electrically connected to a potential supply line V0, and the other is electrically connected to the node 437. Furthermore, a gate electrode of the transistor 434 is electrically connected to the scan line GL_m.

One of an anode and a cathode of the display element 432 is electrically connected to a potential supply line VL_b, and the other is electrically connected to the node 437.

As the display element 432, an organic electroluminescent element (also referred to as an organic EL element) or the like can be used, for example. Note that the display element 432 is not limited thereto; an inorganic EL element formed of an inorganic material may be used, for example. Note that "organic EL element" and "inorganic EL element" are collectively referred to as "EL element" in some cases.

The emission color of the EL element can be white, red, green, blue, cyan, magenta, yellow, or the like depending on the material contained in the EL element.

Examples of a method for achieving color display include a method in which the display element 432 whose emission color is white is combined with a coloring layer and a method in which the display element 432 with a different emission color is provided in each pixel. The former method is more productive than the latter method. By contrast, the latter method, which requires separate formation of the display element 432 pixel by pixel, is less productive than the former method. However, the latter method can provide higher color purity of the emission color than the former method. In the latter method, the color purity can be further increased when the display element 432 has a microcavity structure.

Either a low molecular compound or a high molecular compound can be used for the display element 432, and an inorganic compound may also be contained. The layers included in the display element 432 can each be formed by a method such as an evaporation method (including a vacuum evaporation method), a transfer method, a printing method, an inkjet method, a coating method, or the like.

The display element 432 may contain an inorganic compound such as quantum dots. For example, when used for the light-emitting layer, the quantum dots can function as a light-emitting material.

Note that as a power supply potential, a potential on the relatively high potential side or a potential on the relatively low potential side can be used, for example. A power supply potential on the high potential side is referred to as a high power supply potential (also referred to as "VDD"), and a power supply potential on the low potential side is referred to as a low power supply potential (also referred to as "VSS"). A ground potential can be used as the high power supply potential or the low power supply potential. For example, in the case where the high power supply potential is a ground potential, the low power supply potential is a potential lower than the ground potential, and in the case where the low power supply potential is a ground potential, the high power supply potential is a potential higher than the ground potential.

A high power supply potential VDD is supplied to one of the potential supply line VL_a and the potential supply line VL_b, and a low power supply potential VSS is supplied to the other, for example.

In the display apparatus including the pixel circuit 431, the pixel circuits 431 are sequentially selected row by row by the circuit included in the peripheral driver circuit, whereby the transistors 436 and the transistors 434 are brought into an on state and a data signal is written to the nodes 435.

When the transistors 436 and the transistors 434 are brought into an off state, the pixel circuits 431 in which the data has been written to the nodes 435 are brought into a holding state. Furthermore, the amount of current flowing between the source electrode and the drain electrode of the transistor 251 is controlled in accordance with the potential of the data written to the node 435. The display element 432 emits light with a luminance corresponding to the amount of current flow. This operation is sequentially performed row by row; thus, an image can be displayed.

Figure 20B:
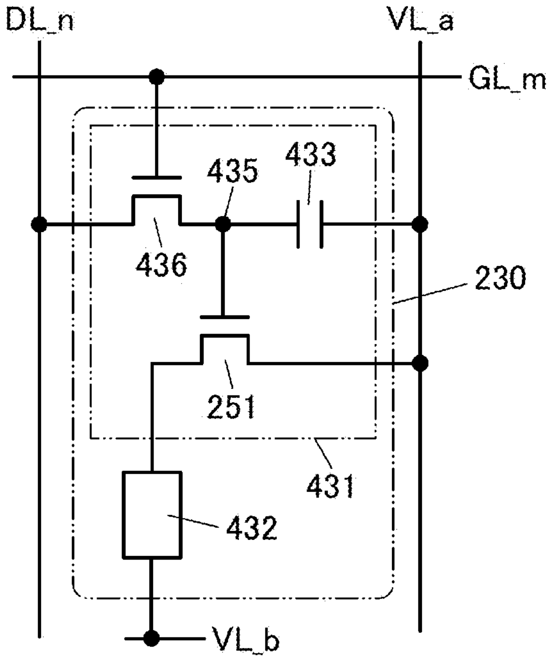

FIG. 20B illustrates a modification example of a circuit configuration of the pixel 230 illustrated in FIG. 20A. The circuit configuration illustrated in FIG. 20B is the circuit configuration illustrated in FIG. 20A from which the transistor 434 and the potential supply line V0 are removed. The rest of the configuration can be understood by referring to the description of the circuit configuration illustrated in FIG. 20A. Thus, in order to reduce repeated description, the detailed description of the circuit configuration illustrated in FIG. 20B is omitted.

Figure 20C:
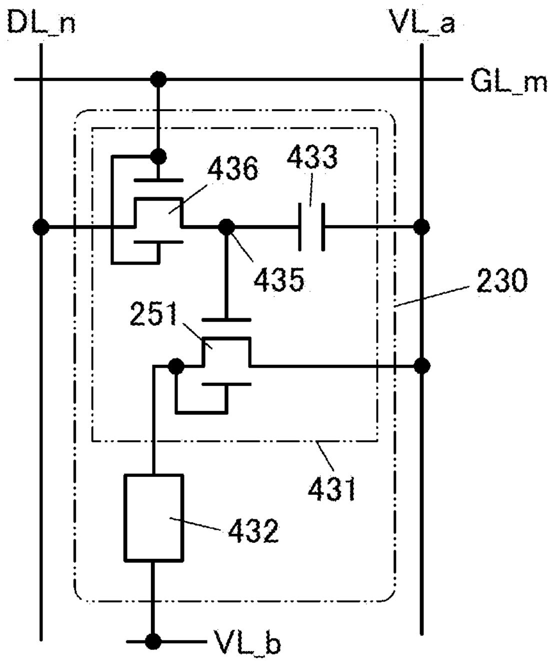

Some of or all of the transistors included in the pixel circuit 431 may each be a transistor having a back gate. For example, as illustrated in FIG. 20C, a transistor having a back gate may be used as the transistor 436 and its back gate and gate may be electrically connected to each other. As in the transistor 251 illustrated in FIG. 20C, the back gate and one of the source and the drain of the transistor may be electrically connected to each other.

This embodiment can be implemented in an appropriate combination with the structures described in the other embodiments and the like.

Embodiment 3

In this embodiment, a light-emitting element (also referred to as a light-emitting device) that can be used in the display apparatus of one embodiment of the present invention will be described.

<Structure Example of Light-Emitting Element>

Figure 21A:
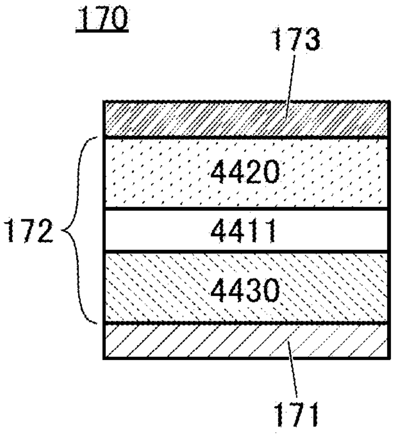
FIG. 21A to FIG. 21D are diagrams illustrating structure examples of a light-emitting element.

As illustrated in FIG. 21A, the light-emitting element 170 includes the EL layer 172 between a pair of electrodes (the electrode 171 and the electrode 173). The EL layer 172 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 21A is referred to as a single structure in this specification and the like.

Figure 21B:
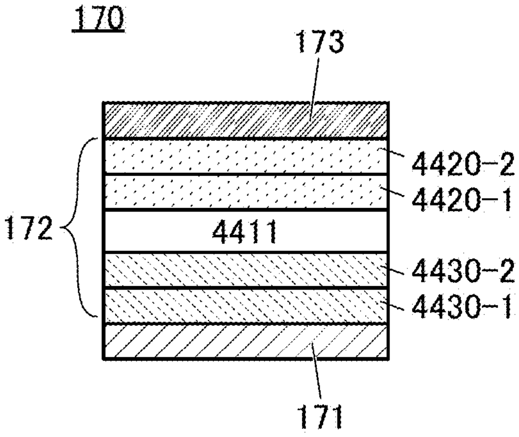

FIG. 21B is a modification example of the EL layer 172 included in the light-emitting element 170 illustrated in FIG. 21A. Specifically, the light-emitting element 170 illustrated in FIG. 21B includes a layer 4430-1 over the electrode 171, a layer 4430-2 over the layer 4430-1, the light-emitting layer 4411 over the layer 4430-2, a layer 4420-1 over the light-emitting layer 4411, a layer 4420-2 over the layer 4420-1, and the electrode 173 over the layer 4420-2. In the case where the electrode 171 serves as an anode and the electrode 173 serves as a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the electrode 171 serves as a cathode and the electrode 173 serves an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 21C:
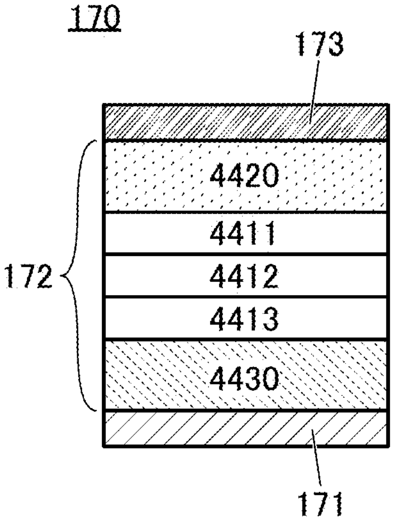

Note that the structure in which a plurality of light-emitting layers (light-emitting layers 4411, 4412, and 4413) is provided between the layer 4420 and the layer 4430 as illustrated in FIG. 21C is another example of the single structure.

Figure 21D:
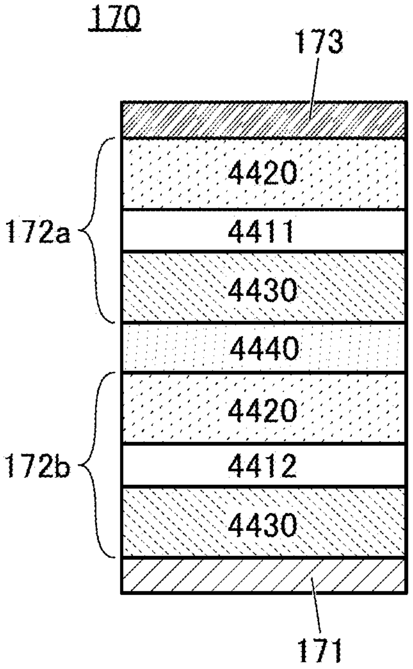

The structure in which a plurality of light-emitting units (an EL layer 172*a* and an EL layer 172*b*) are connected in series with an intermediate layer (charge-generation layer) 4440 therebetween as illustrated in FIG. 21D is referred to as a tandem structure or a stack structure in this specification and the like. Note that the tandem structure enables a light-emitting element capable of high luminance light emission.

The emission color of the light-emitting element can be red, green, blue, cyan, magenta, yellow, white, or the like depending on the material that constitutes the EL layer 172. Furthermore, the color purity can be further increased when the light-emitting element has a microcavity structure.

The light-emitting layer may contain two or more of light-emitting substances that emit light of R (red), G (green), B (blue), Y (yellow), O (orange), and the like. The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain the light-emitting element which emits white light as a whole. This can be applied to a light-emitting element including three or more light-emitting layers.

The light-emitting layer preferably contains two or more of light-emitting substances that emit light of R (red), G (green), B (blue), Y (yellow), O (orange), and the like. Alternatively, the light-emitting layer preferably contains two or more light-emitting substances that emit light containing two or more of spectral components of R, G, and B.

This embodiment can be implemented in an appropriate combination with the structures described in the other embodiments and the like.

Embodiment 4

In this embodiment, a structure example of a transistor that can be used in the display apparatus of one embodiment of the present invention will be described.

Structure Example 1 of Transistor

A transistor 70A will be described as a structure example of a transistor with reference to FIG. 22A to FIG. 22C.

Figure 22A:
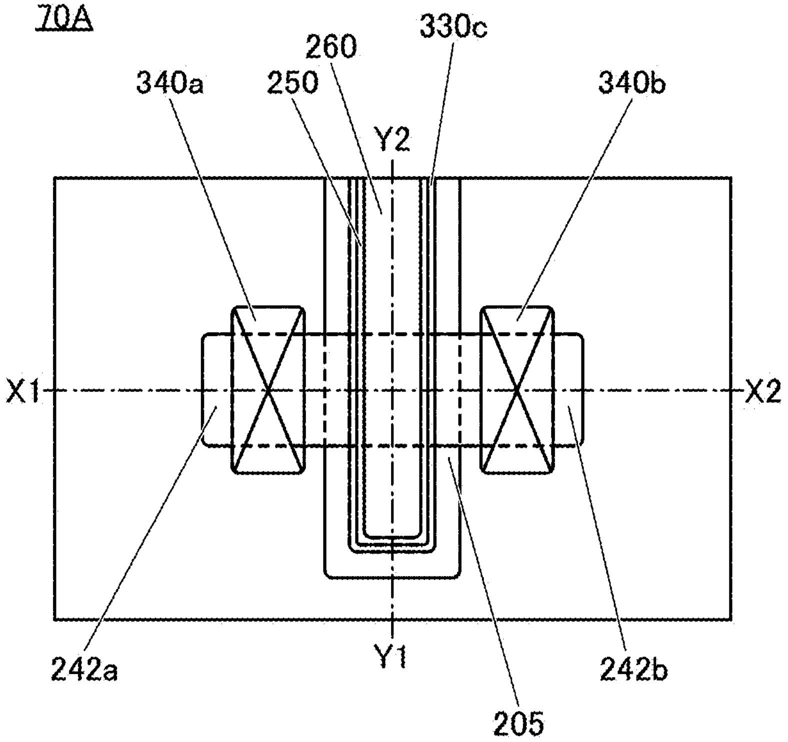
FIG. 22A to FIG. 22C are diagrams illustrating a structure example of a transistor.

FIG. 22A is a top view of the transistor 70A. FIG. 22B is a cross-sectional view of a portion indicated by dashed-dotted line X1-X2 in FIG. 22A and is a cross-sectional view of the transistor 70A in the channel length direction. FIG. 22C is a cross-sectional view of a portion indicated by dashed-dotted line Y1-Y2 in FIG. 22A and is a cross-sectional view of the transistor 70A in the channel width direction. Note that some components are omitted in the top view of FIG. 22A for clarity of the drawing.

Figure 22C:
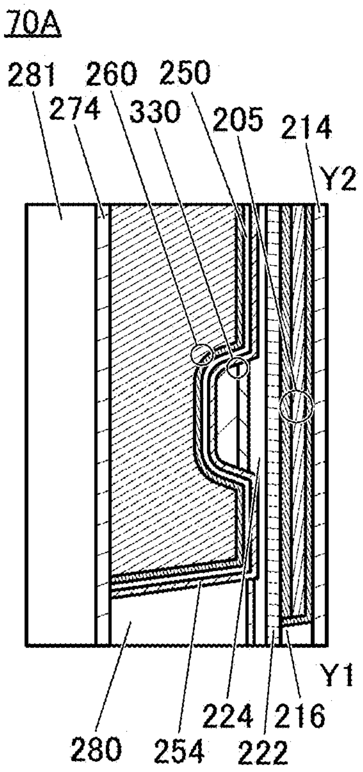
Figure 22B:
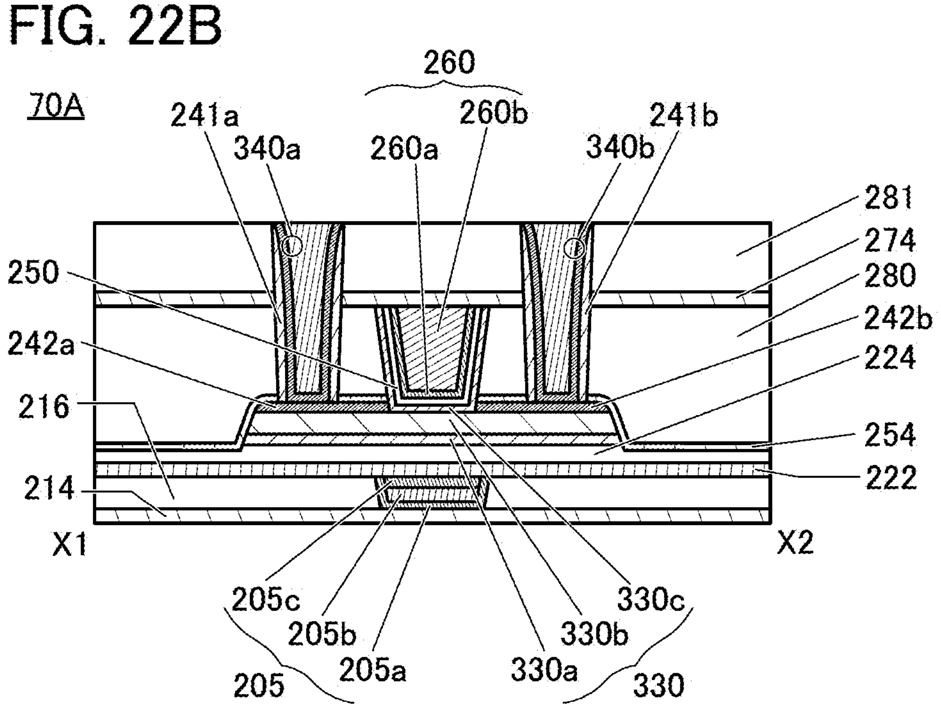

As illustrated in FIG. 22, the transistor 70A includes a metal oxide 330*a* placed over a substrate (not illustrated); a metal oxide 330*b* placed over the metal oxide 330*a*; a conductor 242*a* and a conductor 242*b* that are placed apart from each other over the metal oxide 330*b*; an insulator 280 that is placed over the conductor 242*a* and the conductor 242*b* and has an opening between the conductor 242*a* and the conductor 242*b*; a conductor 260 placed in the opening; an insulator 250 placed between the conductor 260 and each of the metal oxide 330*b*, the conductor 242*a*, the conductor 242*b*, and the insulator 280; and a metal oxide 330*c* placed between the insulator 250 and each of the metal oxide 330*b*, the conductor 242*a*, the conductor 242*b*, and the insulator 280. Here, as illustrated in FIG. 22B and FIG. 22C, preferably, the top surface of the conductor 260 is substantially aligned with the top surfaces of the insulator 250, an insulator 254, the metal oxide 330*c*, and the insulator 280. Hereinafter, the metal oxide 330*a*, the metal oxide 330*b*, and the metal oxide 330*c* may be collectively referred to as a metal oxide 330. The conductor 242*a* and the conductor 242*b* may be collectively referred to as a conductor 242.

In the transistor 70A illustrated in FIG. 22, the side surfaces of the conductor 242*a* and the conductor 242*b* on the conductor 260 side are substantially perpendicular. Note that the transistor 70A illustrated in FIG. 22 is not limited thereto, and the angle formed between the side surfaces and the bottom surfaces of the conductor 242*a* and the conductor 242*b* may be larger than or equal to 10° and smaller than or equal to 80°, preferably larger than or equal to 30° and smaller than or equal to 60°. The side surfaces of the conductor 242*a* and the conductor 242*b* that face each other may have a plurality of surfaces.

As illustrated in FIG. 22, the insulator 254 is preferably placed between the insulator 280 and each of an insulator 224, the metal oxide 330*a*, the metal oxide 330*b*, the conductor 242*a*, the conductor 242*b*, and the metal oxide 330*c*. Here, as illustrated in FIG. 22B and FIG. 22C, the insulator 254 is preferably in contact with the side surface of the metal oxide 330*c*, the top surface and the side surface of the conductor 242*a*, the top surface and the side surface of the conductor 242*b*, the side surfaces of the metal oxide 330*a* and the metal oxide 330*b*, and the top surface of the insulator 224.

In the transistor 70A, three layers of the metal oxide 330*a*, the metal oxide 330*b*, and the metal oxide 330*c* are stacked in and around the region where the channel is formed (hereinafter also referred to as channel formation region); however, the present invention is not limited thereto. For example, a two-layer structure of the metal oxide 330*b* and the metal oxide 330*c* or a stacked-layer structure of four or more layers may be employed. Although the conductor 260 is illustrated to have a stacked-layer structure of two layers in the transistor 70A, the present invention is not limited thereto. For example, the conductor 260 may have a single-layer structure or a stacked-layer structure of three or more layers. Furthermore, each of the metal oxide 330*a*, the metal oxide 330*b*, and the metal oxide 330*c* may have a stacked-layer structure of two or more layers.

For example, in the case where the metal oxide 330*c* has a stacked-layer structure including a first metal oxide and a second metal oxide over the first metal oxide, the first metal oxide preferably has a composition similar to that of the metal oxide 330*b* and the second metal oxide preferably has a composition similar to that of the metal oxide 330*a*.

Here, the conductor 260 functions as a gate electrode of the transistor, and the conductor 242*a* and the conductor 242*b* each function as a source electrode or a drain electrode. As described above, the conductor 260 is formed to be embedded in the opening of the insulator 280 and the region interposed between the conductor 242*a* and the conductor 242*b*. Here, the positions of the conductor 260, the conductor 242*a*, and the conductor 242*b* are selected in a self-aligned manner with respect to the opening of the insulator 280. In other words, in the transistor 70A, the gate electrode can be placed between the source electrode and the drain electrode in a self-aligned manner. Thus, the conductor 260 can be formed without an alignment margin, resulting in a reduction in the area occupied by the transistor 70A. Accordingly, the display apparatus can have higher resolution. In addition, the display apparatus can have a narrow bezel.

As illustrated in FIG. 22, the conductor 260 preferably includes a conductor 260*a* provided on the inner side of the insulator 250 and a conductor 260*b* provided to be embedded on the inner side of the conductor 260*a*.

The transistor 70A preferably includes an insulator 214 placed over the substrate (not illustrated); an insulator 216 placed over the insulator 214; a conductor 205 placed to be embedded in the insulator 216; an insulator 222 placed over the insulator 216 and the conductor 205; and the insulator 224 placed over the insulator 222. The metal oxide 330*a* is preferably placed over the insulator 224.

An insulator 274 and an insulator 281 functioning as interlayer films are preferably placed over the transistor 70A. Here, the insulator 274 is preferably placed in contact with the top surfaces of the conductor 260, the insulator 250, the insulator 254, the metal oxide 330*c*, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of oxygen atoms and oxygen molecules). For example, the insulator 222 and the insulator 254 preferably have a lower oxygen permeability than the insulator 224, the insulator 250, and the insulator 280.

Here, the insulator 224, the metal oxide 330, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 330, and the insulator 250 or excess oxygen into the insulator 224, the metal oxide 330*a*, the metal oxide 330*b*, and the insulator 250.

A conductor 340 (a conductor 340*a* and a conductor 340*b*) that is electrically connected to the transistor 70A and functions as a plug is preferably provided. Note that an insulator 241 (an insulator 241*a* and an insulator 241*b*) is provided in contact with the side surface of the conductor 340 functioning as a plug. In other words, the insulator 241 is provided in contact with the inner wall of an opening in the insulator 254, the insulator 280, the insulator 274, and the insulator 281. In addition, a structure may be employed in which a first conductor of the conductor 340 is provided in contact with the side surface of the insulator 241 and a second conductor of the conductor 340 is provided on the inner side of the first conductor. Here, the top surface of the conductor 340 and the top surface of the insulator 281 can be substantially level with each other. Although the transistor 70A has a structure in which the first conductor of the conductor 340 and the second conductor of the conductor 340 are stacked, the present invention is not limited thereto. For example, the conductor 340 may have a single-layer structure or a stacked-layer structure of three or more layers. In the case where a component has a stacked-layer structure, layers may be distinguished by ordinal numbers corresponding to the formation order.

In the transistor 70A, a metal oxide functioning as an oxide semiconductor (hereinafter also referred to as an oxide semiconductor) is preferably used as the metal oxide 330 including the channel formation region (the metal oxide 330*a*, the metal oxide 330*b*, and the metal oxide 330*c*). For example, it is preferable to use a metal oxide having a band gap of 2 eV or more, preferably 2.5 eV or more as the metal oxide to be the channel formation region of the metal oxide 330.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 22B, the metal oxide 330*b* in a region that does not overlap with the conductor 242 sometimes has a smaller thickness than the metal oxide 330*b* in a region that overlaps with the conductor 242. The thin region is formed when part of the top surface of the metal oxide 330*b* is removed at the time of forming the conductor 242*a* and the conductor 242*b*. When a conductive film to be the conductor 242 is deposited, a low-resistance region is sometimes formed on the top surface of the metal oxide 330*b* in the vicinity of the interface with the conductive film. Removing the low-resistance region positioned between the conductor 242*a* and the conductor 242*b* on the top surface of the metal oxide 330*b* in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 70A that can be used in the display apparatus of one embodiment of the present invention is described in detail.

The conductor 205 is placed to include a region that overlaps with the metal oxide 330 and the conductor 260. Furthermore, the conductor 205 is preferably provided to be embedded in the insulator 216.

The conductor 205 includes a conductor 205*a*, a conductor 205*b*, and a conductor 205*c*. The conductor 205*a* is provided in contact with the bottom surface and a side wall of the opening provided in the insulator 216. The conductor 205*b* is provided to be embedded in a recessed portion formed in the conductor 205*a*. Here, the top surface of the conductor 205*b* is lower in level than the top surface of the conductor 205*a* and the top surface of the insulator 216. The conductor 205*c* is provided in contact with the top surface of the conductor 205*b* and the side surface of the conductor 205*a*. Here, the top surface of the conductor 205*c* is substantially level with the top surface of the conductor 205*a* and the top surface of the insulator 216. That is, the conductor 205*b* is surrounded by the conductor 205*a* and the conductor 205*c*.

Here, for the conductor 205*a* and the conductor 205*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom and an oxygen molecule).

When the conductor 205*a* and the conductor 205*c* are formed using a conductive material having a function of inhibiting diffusion of hydrogen, impurities such as hydrogen contained in the conductor 205*b* can be inhibited from diffusing into the metal oxide 330 through the insulator 224 and the like. When the conductor 205*a* and the conductor 205*c* are formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205*a* is a single layer or a stacked layer using the above conductive materials. For example, titanium nitride is used for the conductor 205*a*.

For the conductor 205*b*, a conductive material containing tungsten, copper, or aluminum as its main component is preferably used. For example, tungsten is used for the conductor 205*b*.

Here, the conductor 260 sometimes functions as a first gate (also referred to as top gate) electrode. The conductor 205 sometimes functions as a second gate (also referred to as bottom gate) electrode. In that case, by changing a potential applied to the conductor 205 not in synchronization with but independently of a potential applied to the conductor 260, $V_{th}$ of the transistor 70A can be controlled. In particular, by applying a negative potential to the conductor 205, $V_{th}$ of the transistor 70A can be higher than 0 V and the off-state current can be made small. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 330. In particular, it is preferable that the conductor 205 extend beyond an end portion of the metal oxide 330 that intersects with the channel width direction, as illustrated in FIG. 22C. In other words, the conductor 205 and the conductor 260 preferably overlap with each other with the insulator placed therebetween, in a region outside the side surface of the metal oxide 330 in the channel width direction.

With the above structure, the channel formation region of the metal oxide 330 can be electrically surrounded by electric fields of the conductor 260 functioning as the first gate electrode and electric fields of the conductor 205 functioning as the second gate electrode.

Furthermore, as illustrated in FIG. 22C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water or hydrogen to the transistor 70A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities do not easily pass). Alternatively, it is preferable to use an insulating material having a function of inhibiting diffusion of oxygen (e.g., at least one of an oxygen atom and an oxygen molecule) (an insulating material through which the oxygen does not easily pass).

For example, aluminum oxide or silicon nitride is preferably used for the insulator 214. Accordingly, it is possible to inhibit diffusion of impurities such as water or hydrogen to the transistor 70A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 have a function of a gate insulator.

Here, the insulator 224 in contact with the metal oxide 330 preferably releases oxygen by heating. In this specification, oxygen that is released by heating is referred to as excess oxygen in some cases. For example, silicon oxide, silicon oxynitride, or the like is used as appropriate for the insulator 224. When an insulator containing oxygen is provided in contact with the metal oxide 330, oxygen vacancies in the metal oxide 330 can be reduced, leading to improved reliability of the transistor 70A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 22C, the insulator 224 is sometimes thinner in a region that overlaps with neither the insulator 254 nor the metal oxide 330*b* than in the other regions. In the insulator 224, the region that overlaps with neither the insulator 254 nor the metal oxide 330*b* preferably has a thickness with which the above oxygen can adequately diffuse.

Like the insulator 214 and the like, the insulator 222 preferably functions as a barrier insulating film that inhibits the entry of impurities such as water or hydrogen into the transistor 70A from the substrate side. The insulator 222 preferably has a lower hydrogen permeability than the insulator 224, for example. When the insulator 224, the metal oxide 330, the insulator 250, and the like are surrounded by the insulator 222, the insulator 254, and the insulator 274, the entry of impurities such as water or hydrogen into the transistor 70A from outside can be inhibited.

Furthermore, it is preferable that the insulator 222 have a function of inhibiting diffusion of oxygen (e.g., at least one of an oxygen atom and an oxygen molecule) (it is preferable that the oxygen do not easily pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 330 is less likely to diffuse to the substrate side. Moreover, the conductor 205 can be inhibited from reacting with oxygen contained in the insulator 224 or oxygen contained in the metal oxide 330.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 330 and entry of impurities such as hydrogen into the metal oxide 330 from the periphery of the transistor 70A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a so-called high-k material, such as aluminum oxide, hafnium oxide, tantalum oxide, zirconium oxide, lead zirconate titanate (PZT), strontium titanate ($SrTiO_3$), or (Ba, Sr)$TiO_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 330 includes the metal oxide 330*a*, the metal oxide 330*b* over the metal oxide 330*a*, and the metal oxide 330*c* over the metal oxide 330*b*. Including the metal oxide 330*a* under the metal oxide 330*b* makes it possible to inhibit diffusion of impurities into the metal oxide 330*b* from components formed below the metal oxide 330*a*. Moreover, including the metal oxide 330*c* over the metal oxide 330*b* makes it possible to inhibit diffusion of impurities into the metal oxide 330*b* from components formed above the metal oxide 330*c*.

Note that the metal oxide 330 preferably has a stacked-layer structure of a plurality of oxide layers that differ in the atomic ratio of metal atoms. For example, in the case where the metal oxide 330 contains at least indium (In) and the element M, the proportion of the number of atoms of the element M contained in the metal oxide 330*a* to the number of atoms of all elements that constitute the metal oxide 330*a* is preferably higher than the proportion of the number of atoms of the element M contained in the metal oxide 330*b* to the number of atoms of all elements that constitute the metal oxide 330*b*. In addition, the atomic ratio of the element M to In in the metal oxide 330*a* is preferably greater than the atomic ratio of the element M to In in the metal oxide 330*b*. Here, a metal oxide that can be used as the metal oxide 330*a* or the metal oxide 330*b* can be used as the metal oxide 330*c*.

The energy of the conduction band minimum of each of the metal oxide 330*a* and the metal oxide 330*c* is preferably higher than the energy of the conduction band minimum of the metal oxide 330*b*. In other words, the electron affinity of each of the metal oxide 330*a* and the metal oxide 330*c* is preferably smaller than the electron affinity of the metal oxide 330*b*. In this case, a metal oxide that can be used as the metal oxide 330*a* is preferably used as the metal oxide 330*c*. Specifically, the proportion of the number of atoms of the element M contained in the metal oxide 330*c* to the number of atoms of all elements that constitute the metal oxide 330*c* is preferably higher than the proportion of the number of atoms of the element M contained in the metal oxide 330*b* to the number of atoms of all elements that constitute the metal oxide 330*b*. In addition, the atomic ratio of the element M to In in the metal oxide 330*c* is preferably greater than the atomic ratio of the element M to In in the metal oxide 330*b*.

Here, the energy level of the conduction band minimum gently changes at junction portions between the metal oxide 330*a*, the metal oxide 330*b*, and the metal oxide 330*c*. In other words, the energy level of the conduction band minimum at junction portions between the metal oxide 330*a*, the metal oxide 330*b*, and the metal oxide 330*c* is continuously varied or are continuously connected. This can be achieved by decreasing the density of defect states in a mixed layer formed at the interface between the metal oxide 330*a* and the metal oxide 330*b* and the interface between the metal oxide 330*b* and the metal oxide 330*c*.

Specifically, when the metal oxide 330*a* and the metal oxide 330*b* or the metal oxide 330*b* and the metal oxide 330*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 330*a* and the metal oxide 330*c*, in the case where the metal oxide 330*b* is an In—Ga—Zn oxide. The metal oxide 330*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 330*c* may have a stacked-layer structure of an In—Ga—Zn oxide and an oxide that does not contain In.

Specifically, as the metal oxide 330*a*, a metal oxide with In:Ga:Zn=1:3:4 [atomic ratio] or 1:1:0.5 [atomic ratio] can be used. As the metal oxide 330*b*, a metal oxide with In:Ga:Zn=4:2:3 [atomic ratio] or 3:1:2 [atomic ratio] can be used. As the metal oxide 330*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 330*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 330*b* serves as a main carrier path. When the metal oxide 330*a* and the metal oxide 330*c* have the above structure, the density of defect states at the interface between the metal oxide 330*a* and the metal oxide 330*b* and the interface between the metal oxide 330*b* and the metal oxide 330*c* can be made low. This reduces the influence of interface scattering on carrier conduction, and the transistor 70A can have a high on-state current and high frequency characteristics. Note that in the case where the metal oxide 330*c* has a stacked-layer structure, not only the effect of reducing the density of defect states at the interface between the metal oxide 330*b* and the metal oxide 330*c*, but also the effect of inhibiting diffusion of the constituent element contained in the metal oxide 330*c* to the insulator 250 side can be expected. Specifically, the metal oxide 330*c* has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 330*c* having a stacked-layer structure allows a highly reliable display apparatus to be provided.

The conductor 242 (the conductor 242*a* and the conductor 242*b*) functioning as the source electrode and the drain electrode is provided over the metal oxide 330*b*. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 242 is provided in contact with the metal oxide 330, the oxygen concentration of the metal oxide 330 in the vicinity of the conductor 242 sometimes decreases. In addition, a metal compound layer that contains the metal contained in the conductor 242 and the component of the metal oxide 330 is sometimes formed in the metal oxide 330 in the vicinity of the conductor 242. In such cases, the carrier density of the region in the metal oxide 330 in the vicinity of the conductor 242 increases, and the region becomes a low-resistance region.

Here, the region between the conductor 242*a* and the conductor 242*b* is formed to overlap with the opening of the insulator 280. Accordingly, the conductor 260 can be formed in a self-aligned manner between the conductor 242*a* and the conductor 242*b*.

The insulator 250 functions as a gate insulator. The insulator 250 is preferably placed in contact with the top surface of the metal oxide 330*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 is illustrated to have a two-layer structure in FIG. 22, the conductor 260 may have a single-layer structure or a stacked-layer structure of three or more layers.

For the conductor 260*a*, it is preferable to use the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom and an oxygen molecule).

When the conductor 260*a* has a function of inhibiting diffusion of oxygen, it is possible to inhibit reduction of the conductivity due to oxidation of the conductor 260*b* by oxygen contained in the insulator 250. As a conductive material having a function of inhibiting oxygen diffusion, for example, tantalum, tantalum nitride, ruthenium, or ruthenium oxide is preferably used.

A conductive material containing tungsten, copper, or aluminum as its main component is preferably used for the conductor 260*b*. The conductor 260 also functions as a wiring and thus is preferably formed using a conductor having high conductivity. For example, a conductive material containing tungsten, copper, or aluminum as its main component can be used. The conductor 260*b* may have a stacked-layer structure, for example, a stacked-layer structure of titanium or titanium nitride and the above conductive material.

As illustrated in FIG. 22A and FIG. 22C, the side surface of the metal oxide 330 is covered with the conductor 260 in a region where the metal oxide 330*b* does not overlap with the conductor 242, that is, the channel formation region of the metal oxide 330. Accordingly, electric fields of the conductor 260 having a function of the first gate electrode are likely to act on the side surface of the metal oxide 330. Thus, the on-state current of the transistor 70A can be increased and the frequency characteristics can be improved.

The insulator 254, like the insulator 214 and the like, preferably functions as a barrier insulating film that inhibits the entry of impurities such as water or hydrogen into the transistor 70A from the insulator 280 side. The insulator 254 preferably has a lower hydrogen permeability than the insulator 224, for example. Furthermore, as illustrated in FIG. 22B and FIG. 22C, the insulator 254 is preferably in contact with the side surface of the metal oxide 330*c*, the top and side surfaces of the conductor 242*a*, the top and side surfaces of the conductor 242*b*, the side surfaces of the metal oxide 330*a* and the metal oxide 330*b*, and the top surface of the insulator 224. Such a structure can inhibit the entry of hydrogen contained in the insulator 280 into the metal oxide 330 through the top surfaces or side surfaces of the conductor 242*a*, the conductor 242*b*, the metal oxide 330*a*, the metal oxide 330*b*, and the insulator 224.

Furthermore, it is preferable that the insulator 254 have a function of inhibiting diffusion of oxygen (e.g., at least one of an oxygen atom and an oxygen molecule) (it is preferable that the oxygen do not easily pass through the insulator 254). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Thus, oxygen can be supplied from the region to the metal oxide 330 through the insulator 224. Here, with the insulator 254 having a function of inhibiting upward diffusion of oxygen, oxygen can be prevented from diffusing from the metal oxide 330 into the insulator 280. Moreover, with the insulator 222 having a function of inhibiting downward diffusion of oxygen, oxygen can be prevented from diffusing from the metal oxide 330 to the substrate side. In the above manner, oxygen is supplied to the channel formation region of the metal oxide 330. Accordingly, oxygen vacancies in the metal oxide 330 can be reduced, so that the transistor can be prevented from having normally-on characteristics.

As the insulator 254, an insulator containing an oxide of one or both of aluminum and hafnium is preferably deposited, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 330 are covered with the insulator 254 having a barrier property against hydrogen, whereby the insulator 280 is isolated from the insulator 224, the metal oxide 330, and the insulator 250 by the insulator 254. This can inhibit the entry of impurities such as hydrogen from outside of the transistor 70A, resulting in favorable electrical characteristics and high reliability of the transistor 70A.

The insulator 280 is provided over the insulator 224, the metal oxide 330, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 340*a* and the conductor 340*b* are placed in openings formed in the insulator 281, the insulator 274, the insulator 280, and the insulator 254. The conductor 340*a* and the conductor 340*b* are placed to face each other with the conductor 260 therebetween. Note that the levels of the top surfaces of the conductor 340*a* and the conductor 340*b* may be on the same plane as the top surface of the insulator 281.

The insulator 241*a* is provided in contact with the inner walls of the openings in the insulator 281, the insulator 274, the insulator 280, and the insulator 254, and the first conductor of the conductor 340*a* is formed in contact with the side surface of the insulator 241*a*. The conductor 242*a* is positioned on at least part of the bottom portion of the opening, and the conductor 340*a* is in contact with the conductor 242*a*. Similarly, the insulator 241*b* is provided in contact with the inner walls of the openings in the insulator 281, the insulator 274, the insulator 280, and the insulator 254, and the first conductor of the conductor 340*b* is formed in contact with the side surface of the insulator 241*b*. The conductor 242*b* is positioned on at least part of the bottom portion of the opening, and the conductor 340*b* is in contact with the conductor 242*b*.

The conductor 340*a* and the conductor 340*b* are preferably formed using a conductive material containing tungsten, copper, or aluminum as its main component. The conductor 340*a* and the conductor 340*b* may have a stacked-layer structure.

In the case where the conductor 340 has a stacked-layer structure, the aforementioned conductor having a function of inhibiting diffusion of impurities such as water or hydrogen is preferably used as the conductor in contact with the metal oxide 330*a*, the metal oxide 330*b*, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or a stacked layer. The use of the conductive material can inhibit oxygen added to the insulator 280 from being absorbed by the conductor 340*a* and the conductor 340*b*. Moreover, impurities such as water or hydrogen can be inhibited from entering the metal oxide 330 through the conductor 340*a* and the conductor 340*b* from a layer above the insulator 281.

As the insulator 241*a* and the insulator 241*b*, for example, the insulator that can be used as the insulator 254 or the like can be used. Since the insulator 241*a* and the insulator 241*b* are provided in contact with the insulator 254, impurities such as water or hydrogen in the insulator 280 or the like can be inhibited from entering the metal oxide 330 through the conductor 340*a* and the conductor 340*b*. Furthermore, oxygen contained in the insulator 280 can be inhibited from being absorbed by the conductor 340*a* and the conductor 340*b*.

Although not illustrated, a conductor functioning as a wiring may be placed in contact with the top surface of the conductor 340*a* and the top surface of the conductor 340*b*. For the conductor functioning as a wiring, a conductive material containing tungsten, copper, or aluminum as its main component is preferably used. Furthermore, the conductor may have a stacked-layer structure and may be a stack of titanium or a titanium nitride and the above conductive material, for example. Note that the conductor may be formed to be embedded in an opening provided in an insulator.

Structure Example 2 of Transistor

Figure 23A:
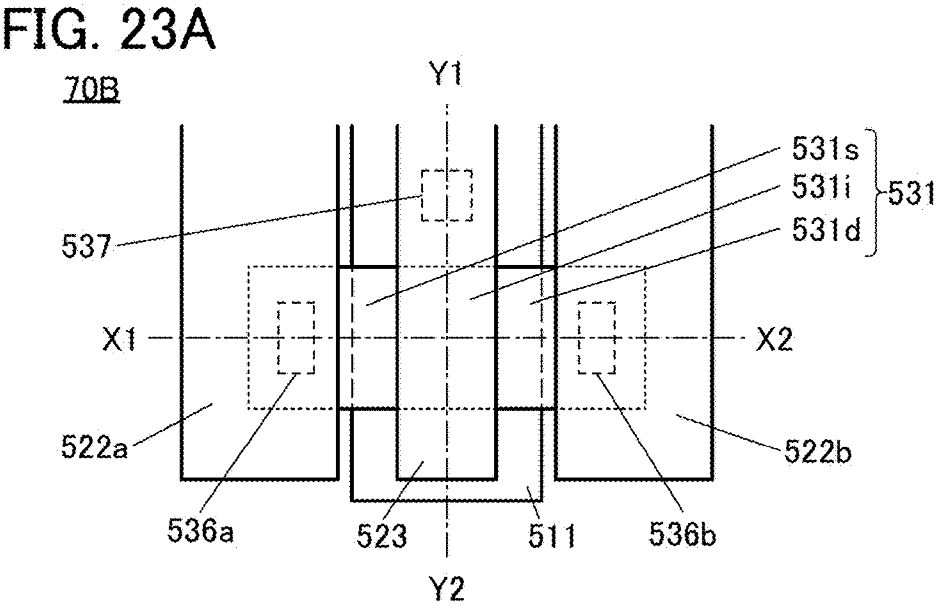
FIG. 23A to FIG. 23C are diagrams illustrating a structure example of a transistor.
Figure 23B:
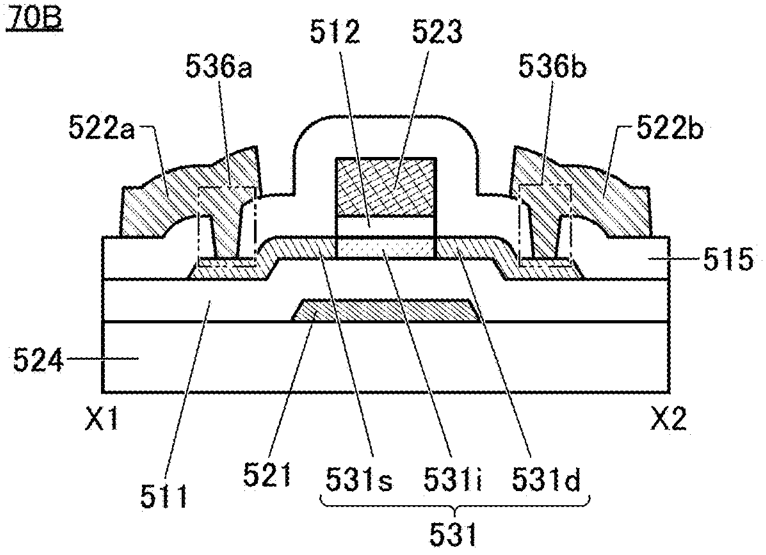

A transistor 70B will be described as a structure example of a transistor with reference to FIG. 23A, FIG. 23B, and FIG. 23C. FIG. 23A is a top view of the transistor 70B. FIG. 23B is a cross-sectional view of a portion indicated by dashed-dotted line X1-X2 in FIG. 23A, and FIG. 23C is a cross-sectional view of a portion indicated by dashed-dotted line Y1-Y2 in FIG. 23A.

Figure 23C:
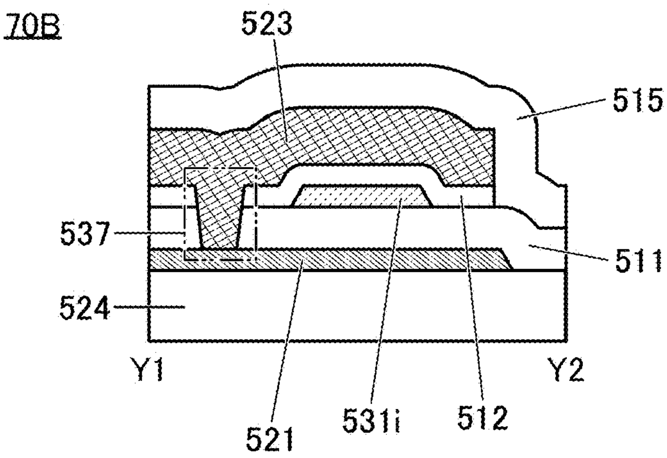

The transistor 70B illustrated in FIG. 23A, FIG. 23B, and FIG. 23C includes a conductive layer 521 over an insulating layer 524, an insulating layer 511 over the conductive layer 521 and the insulating layer 524, a semiconductor layer 531 over the insulating layer 511, an insulating layer 512 over the semiconductor layer 531, a conductive layer 523 over the insulating layer 512, and an insulating layer 515 over the insulating layer 511, the semiconductor layer 531, and the conductive layer 523. Note that the semiconductor layer 531 includes a channel formation region 531*i* overlapping with the conductive layer 523, a source region 531*s* in contact with the insulating layer 515, and a drain region 531*d* in contact with the insulating layer 515. For the semiconductor layer 531, an oxide semiconductor, which is one type of metal oxide, can be used, for example. Note that the semiconductor layer 531 may have a stacked-layer structure of two or more layers.

The insulating layer 515 contains nitrogen or hydrogen. The insulating layer 515 is in contact with the source region 531*s* and the drain region 531*d*, so that nitrogen or hydrogen in the insulating layer 515 is added to the source region 531*s* and the drain region 531*d*. The source region 531*s* and the drain region 531*d* each have a high carrier density when nitrogen or hydrogen is added thereto.

The transistor 70B may include a conductive layer 522*a* electrically connected to the source region 531*s* through an opening portion 536*a* provided in the insulating layer 515. The transistor 70B may further include a conductive layer 522*b* electrically connected to the drain region 531*d* through an opening portion 536*b* provided in the insulating layer 515.

The insulating layer 511 functions as a first gate insulating layer, and the insulating layer 512 functions as a second gate insulating layer. The insulating layer 515 functions as a protective insulating layer.

The insulating layer 512 includes an excess oxygen region. When the insulating layer 512 includes an excess oxygen region, excess oxygen can be supplied to the channel formation region 531*i* included in the semiconductor layer 531. As a result, excess oxygen can compensate for oxygen vacancies that might be formed in the channel formation region 531*i*, which can provide a highly reliable display apparatus.

Note that to supply excess oxygen to the semiconductor layer 531, excess oxygen may be supplied to the insulating layer 511 formed below the semiconductor layer 531. However, in that case, excess oxygen contained in the insulating layer 511 might also be supplied to the source region 531*s* and the drain region 531*d* included in the semiconductor layer 531. When excess oxygen is supplied to the source region 531*s* and the drain region 531*d*, the resistance of the source region 531*s* and the drain region 531*d* might be increased in some cases.

By contrast, in the structure in which the insulating layer 512 formed over the semiconductor layer 531 contains excess oxygen, excess oxygen can be selectively supplied only to the channel formation region 531*i*. Alternatively, the carrier densities of the source region 531*s* and the drain region 531*d* are selectively increased after excess oxygen is supplied to the channel formation region 531*i*, the source region 531*s*, and the drain region 531*d*, in which case an increase in the resistance of the source region 531*s* and the drain region 531*d* can be prevented.

Furthermore, each of the source region 531*s* and the drain region 531*d* included in the semiconductor layer 531 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and the Group 18 element. Typical examples of the Group 18 element include helium, neon, argon, krypton, and xenon. In the case where one or more of the elements that form oxygen vacancies are contained in the insulating layer 515, the one or more of the elements are diffused from the insulating layer 515 to the source region 531*s* and the drain region 531*d*, or added to the source region 531*s* and the drain region 531*d* by impurity addition treatment.

When an impurity element is added to the metal oxide, a bond between a metal element and oxygen in the metal oxide is cut, so that an oxygen vacancy is formed. Alternatively, when an impurity element is added to the metal oxide, oxygen bonded to a metal element in the metal oxide is bonded to the impurity element and the oxygen is released from the metal element, so that an oxygen vacancy is formed. As a result, the carrier density of the metal oxide is increased and thus the conductivity thereof becomes higher.

The conductive layer 521 functions as a first gate, the conductive layer 523 functions as a second gate, the conductive layer 522*a* functions as a source, and the conductive layer 522*b* functions as a drain.

As illustrated in FIG. 23C, an opening portion 537 is provided in the insulating layer 511 and the insulating layer 512. The conductive layer 521 is electrically connected to the conductive layer 523 through the opening portion 537. Thus, the conductive layer 521 and the conductive layer 523 are supplied with the same potential. Note that different potentials may be supplied to the conductive layer 521 and the conductive layer 523 without providing the opening portion 537. Alternatively, the conductive layer 521 may be used as a light-blocking film without providing the opening portion 537. For example, light emitted to the channel formation region 531*i* from the bottom can be suppressed when the conductive layer 521 is formed with a light-blocking material.

As illustrated in FIG. 23B and FIG. 23C, while facing the conductive layer 521 functioning as the first gate and the conductive layer 523 functioning as the second gate, the semiconductor layer 531 is positioned between the two conductive layers having functions as the gates.

Like the transistor 70A, the transistor 70B has an S-channel structure. With this structure, the semiconductor layer 531 included in the transistor 70B can be electrically surrounded by electric fields of the conductive layer 521 functioning as the first gate and the conductive layer 523 functioning as the second gate.

Since the transistor 70B has the S-channel structure, an electric field for inducing a channel can be effectively applied to the semiconductor layer 531 by the conductive layer 521 or the conductive layer 523. Thus, the current drive capability of the transistor 70B can be improved and high on-state current characteristics can be obtained. The transistor 70B can be miniaturized because the on-state current can be increased. Furthermore, since the transistor 70B has a structure in which the semiconductor layer 531 is surrounded by the conductive layer 521 and the conductive layer 523, the mechanical strength of the transistor 70B can be increased.

The transistor 70B may be called a TGSA (Top Gate Self Align) FET from the position of the conductive layer 523 relative to the semiconductor layer 531 or the formation method of the conductive layer 523.

Although the insulating layer 512 is provided only in a portion overlapping with the conductive layer 523 in the transistor 70B, the structure is not limited thereto, and the structure in which the insulating layer 512 covers the semiconductor layer 531 can be employed. Alternatively, a structure in which the conductive layer 521 is not provided can be employed.

An aluminum oxide layer may be provided between the insulating layer 512 and the conductive layer 523. When an aluminum oxide layer is provided, excess oxygen contained in the insulating layer 512 can be unlikely to be diffused to the conductive layer 523 side.

In the conductive layer 523, at least a region in contact with the insulating layer 512 is preferably formed using a material through which oxygen do not easily diffuse. Examples of such a material include aluminum and molybdenum. For example, the conductive layer 523 may have a stacked-layer structure of two layers in which aluminum is provided on the insulating layer 512 side and titanium is provided thereover. Alternatively, the conductive layer 523 may have a stacked-layer structure of three layers in which molybdenum is provided on the insulating layer 512 side and aluminum and titanium are provided thereover.

Structure Example 3 of Transistor

Figure 24A:
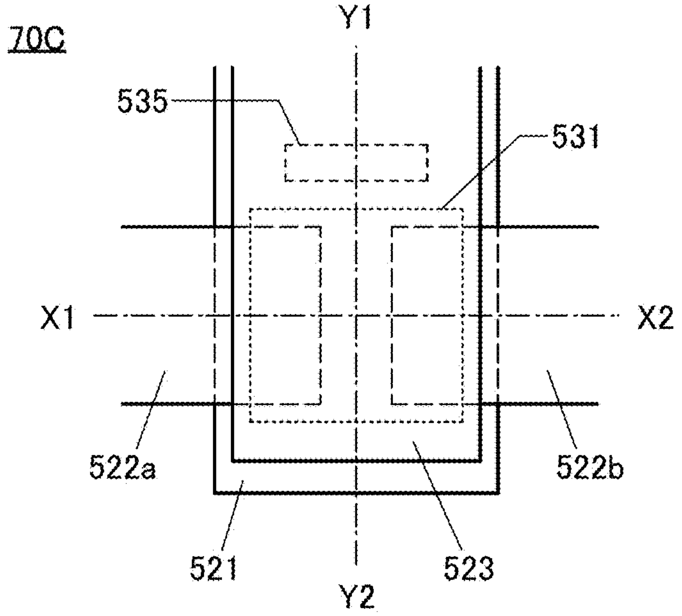
FIG. 24A to FIG. 24C are diagrams illustrating a structure example of a transistor.
Figure 24B:
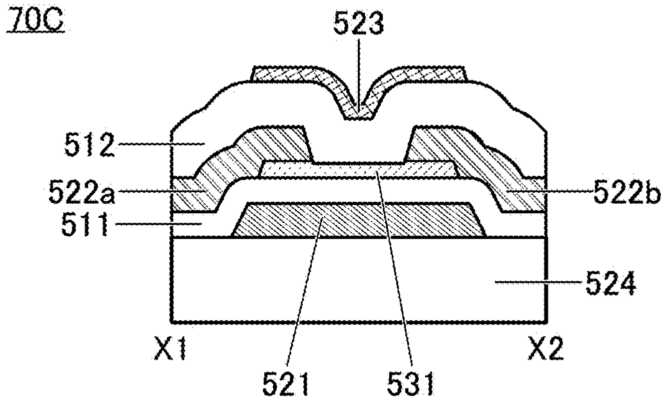
Figure 24C:
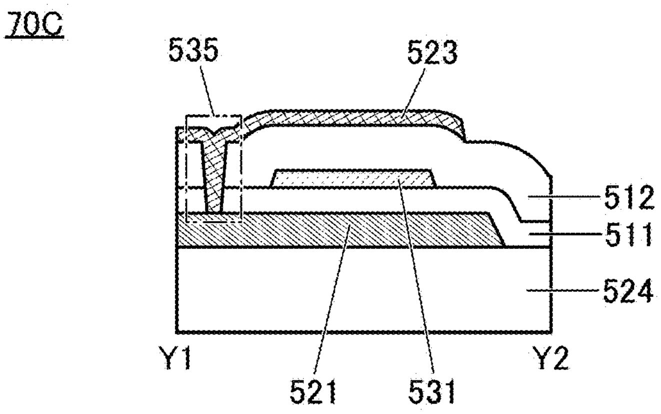

A transistor 70C will be described as a structure example of a transistor with reference to FIG. 24A, FIG. 24B, and FIG. 24C. FIG. 24A is a top view of the transistor 70C. FIG. 24B is a cross-sectional view of a portion indicated by dashed-dotted line X1-X2 in FIG. 24A, and FIG. 24C is a cross-sectional view of a portion indicated by dashed-dotted line Y1-Y2 in FIG. 24A. Note that in FIG. 24A, some components of the transistor 70C (e.g., an insulating layer functioning as a gate insulating layer) are not illustrated for easy understanding of the drawings. Note that the extending direction of dashed-dotted line X1-X2 may be referred to as a channel length direction, and the extending direction of dashed-dotted line Y1-Y2 may be referred to as a channel width direction.

The transistor 70C includes the conductive layer 521 over the insulating layer 524; the insulating layer 511 over the insulating layer 524 and the conductive layer 521; the semiconductor layer 531 over the insulating layer 511; the conductive layer 522*a* over the semiconductor layer 531 and the insulating layer 511; the conductive layer 522*b* over the semiconductor layer 531 and the insulating layer 511; the insulating layer 512 over the semiconductor layer 531, the conductive layer 522*a*, and the conductive layer 522*b*; and the conductive layer 523 over the insulating layer 512. Note that the insulating layer 524 may be a substrate.

For the semiconductor layer 531, a semiconductor material described in the above embodiment can be used, for example. For the semiconductor layer 531, an oxide semiconductor, which is one type of metal oxide, can be used, for example.

The insulating layer 511 and the insulating layer 512 have an opening portion 535. The conductive layer 523 is electrically connected to the conductive layer 521 through the opening portion 535.

Here, the insulating layer 511 functions as a first gate insulating layer of the transistor 70C, and the insulating layer 512 functions as a second gate insulating layer of the transistor 70C. In the transistor 70C, the conductive layer 521 functions as a first gate, the conductive layer 522*a* functions as one of a source and a drain, and the conductive layer 522*b* functions as the other of the source and the drain. In the transistor 70C, the conductive layer 523 functions as a second gate.

Note that the transistor 70C is what is called a channel-etched transistor, and has a dual-gate structure.

The transistor 70C can also have a structure in which the conductive layer 523 is not provided. In that case, the transistor 70C is what is called a channel-etched transistor, and has a bottom-gate structure.

As illustrated in FIG. 24B and FIG. 24C, the semiconductor layer 531 is positioned to face the conductive layer 521 and the conductive layer 523, and is sandwiched between two conductive layers functioning as the gates. The length of the conductive layer 523 in the channel length direction and the length of the conductive layer 523 in the channel width direction are longer than the length of the semiconductor layer 531 in the channel length direction and the length of the semiconductor layer 531 in the channel width direction, respectively, and the whole semiconductor layer 531 is covered with the conductive layer 523 with the insulating layer 512 therebetween.

In other words, the conductive layer 521 and the conductive layer 523 are connected to each other in the opening portion 535 provided in the insulating layer 511 and the insulating layer 512, and each have a region located outside a side end portion of the semiconductor layer 531.

With this structure, an S-channel structure in which the semiconductor layer 531 included in the transistor 70C is electrically surrounded by electric fields of the conductive layer 521 and the conductive layer 523 can be obtained.

Since the transistor 70C has the s-channel structure, an electric field for inducing a channel can be effectively applied to the semiconductor layer 531 by the conductive layer 521 functioning as the first gate; thus, the current drive capability of the transistor 70C can be improved and high on-state current characteristics can be obtained. The transistor 70C can be miniaturized because the on-state current can be increased.

Furthermore, since the transistor 70C has a structure in which the semiconductor layer 531 is surrounded by the conductive layer 521 functioning as the first gate and the conductive layer 523 functioning as the second gate, the mechanical strength of the transistor 70C can be increased.

Figure 25A:
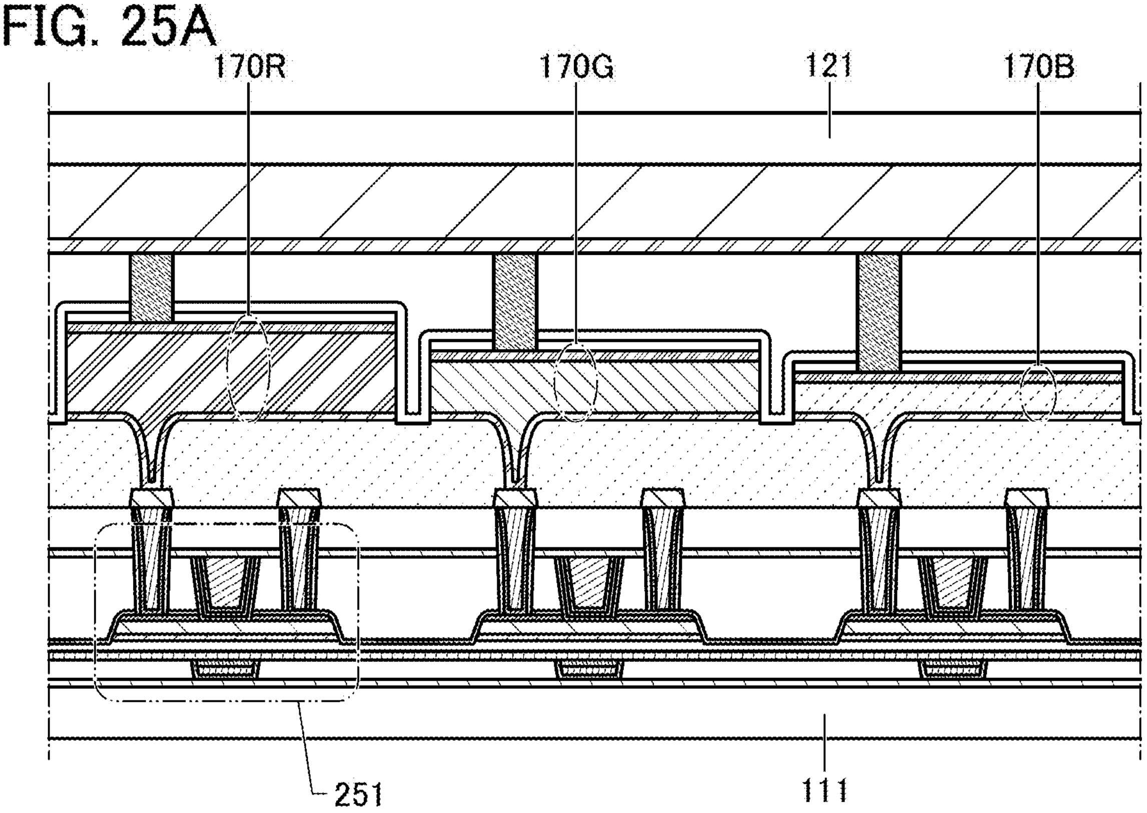
FIG. 25A and FIG. 25B are diagrams illustrating structure examples of a display apparatus.
Figure 25B:
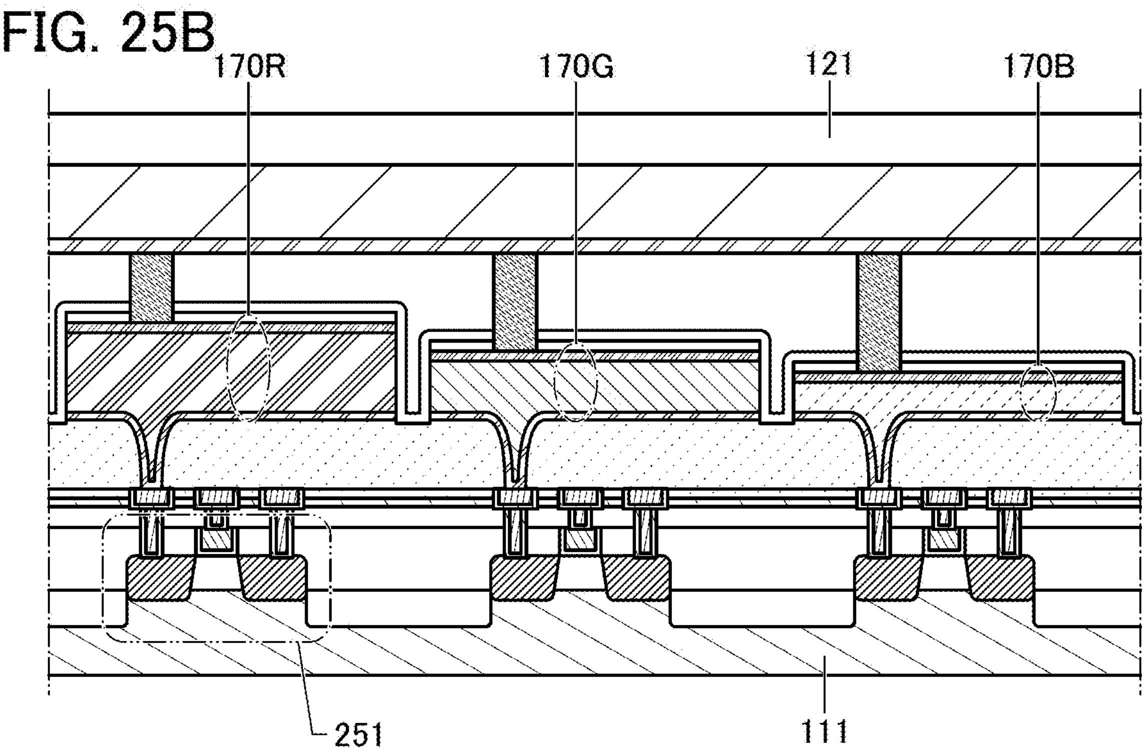

The transistor 70A can be used as the transistor 251, for example. FIG. 25A illustrates a cross-sectional structure example of the display apparatus 100 in which the transistor 70A is used as the transistor 251. Alternatively, a single crystal silicon transistor may be used as the transistor 251. FIG. 25B illustrates a cross-sectional structure example of the display apparatus 100 in which a single crystal silicon transistor is used as the transistor 251.

In the case where a single crystal silicon transistor is used as the transistor 251, single crystal silicon is used for the substrate 111. In the single crystal silicon transistor, part of the substrate 111 is used as a channel formation region. In the case where a single crystal silicon transistor is used as the transistor 251, an SOI substrate may be used as the substrate 111.

Figure 26:
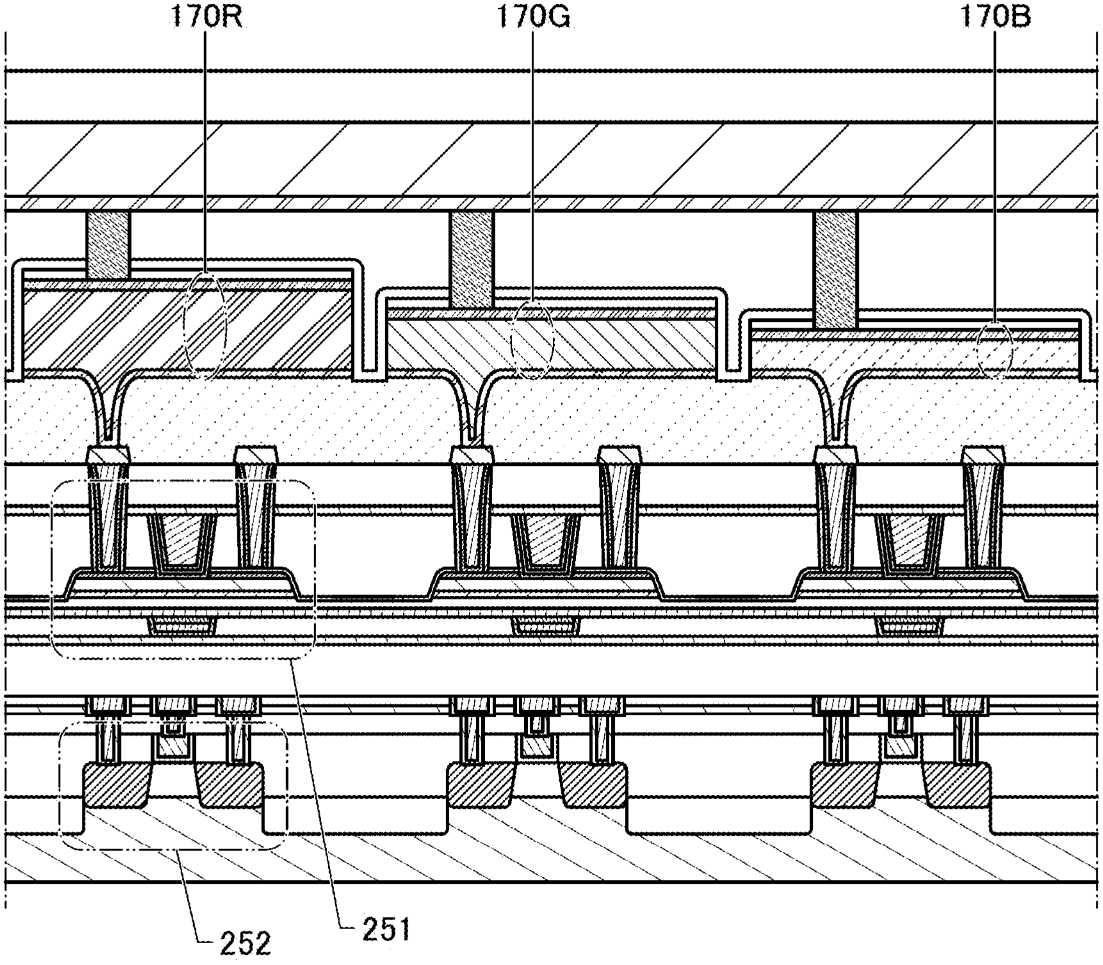
FIG. 26 is a diagram illustrating a structure example of a display apparatus.

One or both of the peripheral circuit region 232 and the peripheral circuit region 233 may be provided to overlap with the display region 235. For example, a single crystal silicon transistor may be used as the transistor 252 included in the peripheral circuit region, and the transistor 251 and the light-emitting element 170 included in the display region 235 may be provided over the single crystal silicon transistor, as illustrated in FIG. 26.

When the peripheral circuit region and the display region are provided to overlap with each other, a reduction in size of the display apparatus 100 can be realized. In the case where the display apparatus 100 has a fixed external dimension, the area of the display region can be large. Thus, the resolution of the display apparatus 100 can be increased. In the case where the pixel resolution is fixed, the area occupied by each pixel can be increased. Thus, the emission luminance of the display apparatus can be increased. Furthermore, the pixel aperture ratio can be increased. For example, the pixel aperture ratio can be greater than or equal to 40% and less than 100%, preferably greater than or equal to 50% and less than or equal to 95%, further preferably greater than or equal to 60% and less than or equal to 95%. Owing to an increase in aperture ratio of each pixel, the density of current supplied to the light-emitting element included in the pixel can be reduced. Thus, a load on the light-emitting element can be reduced, leading to an increase in the reliability of the display apparatus 100.

This embodiment can be implemented in an appropriate combination with the structures described in the other embodiments and the like.

Embodiment 5

In this embodiment, examples of an electronic device to which the display apparatus of one embodiment of the present invention can be applied will be described.

The display apparatus of one embodiment of the present invention can be used in a display portion of an electronic device. Thus, an electronic device with high display quality can be obtained. An electronic device with an extremely high resolution can be obtained. A highly reliable electronic device can be obtained.

Examples of electronic devices including the display apparatus or the like of one embodiment of the present invention include display apparatuses of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, car phones, cellular phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Other examples include industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from power storage units may also be included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention can be incorporated along a curved surface of an inside wall or an outside wall of a house or a building or the interior or the exterior of a car.

The electronic device of one embodiment of the present invention may include a secondary battery (battery), and it is preferable that the secondary battery be capable of being charged by contactless power transmission.

Examples of the secondary battery include a lithium ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, a video, data, and the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that functions of the electronic device of one embodiment of the present invention are not limited thereto, and the electronic devices can have a variety of functions.

The display apparatus of one embodiment of the present invention can display high-resolution images. Thus, the light-emitting apparatus of one embodiment of the present invention can be suitably used especially for a portable electronic device, a wearable electronic device (wearable device), an e-book reader, and the like. In addition, the display apparatus can be suitably used for a VR (Virtual Reality) device, an AR (Augmented Reality) device, and the like.

Figure 27A:
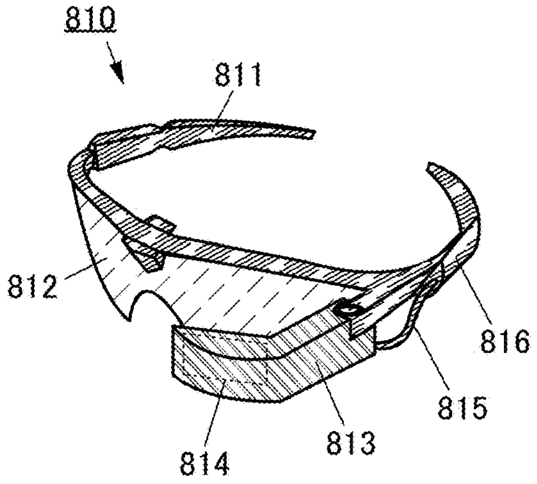
FIG. 27A to FIG. 27F are diagrams illustrating examples of electronic devices.

FIG. 27A illustrates an appearance of a head-mounted display 810. The head-mounted display 810 includes a mounting portion 811, a lens 812, a main body 813, a display portion 814, a cable 815, and the like. A battery 816 is incorporated in the mounting portion 811. The display apparatus of one embodiment of the present invention can be used in the display portion 814.

The cable 815 supplies electric power from the battery 816 to the main body 813. The main body 813 includes a wireless receiver or the like and can display received image information, such as image data, on the display portion 814. The movement of one or both of the eyeball and the eyelid of a user is captured by a camera provided in the main body 813 and then the sight line of the user are calculated using the information to utilize the sight line of the user as an input means.

A plurality of electrodes may be provided in the mounting portion 811 at positions in contact with the user. The main body 813 may have a function of recognizing the user's sight line by sensing current flowing through the electrodes in accordance with the movement of the user's eyeball. The main body 813 may have a function of sensing current flowing through the electrodes to monitor the user's pulse. The mounting portion 811 may include various sensors such as a temperature sensor, a pressure sensor, and an acceleration sensor and may have a function of displaying the user's biological information on the display portion 814. The main body 813 may sense the movement of the user's head or the like to change an image displayed on the display portion 814 in synchronization with the movement.

Figure 27B:
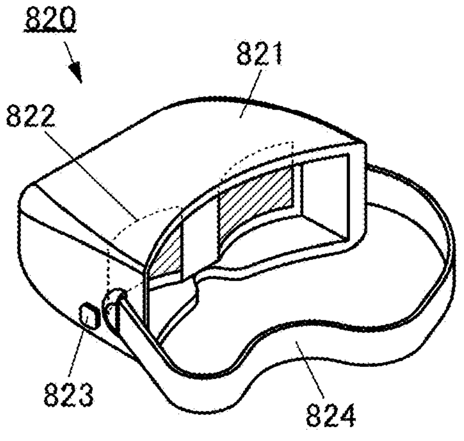

FIG. 27B illustrates an appearance of a head-mounted display 820. The head-mounted display 820 is a goggles-type information processing device.

The head-mounted display 820 includes a housing 821, an operation button 823, a fixing band 824, and two display portions 822. Since the head-mounted display 820 includes the two display portions 822, the user's eyes can see their respective display portions. This allows a high-definition image to be displayed even when three-dimensional display using parallax or the like is performed. In addition, the display portion 822 is curved around an arc with the user's eye as an approximate center. This keeps a certain distance between the user's eye and the display surface of the display portion, enabling the user to see a more natural image. Even when the luminance and chromaticity of light from the display portion is changed depending on the angle at which the user see it, since the user's eye is positioned in a normal direction of the display surface of the display portion, the influence of the change can be substantially ignorable and thus a more realistic image can be displayed.

The operation button 823 has a function of a power button or the like. A button other than the operation button 823 may be included.

The display apparatus of one embodiment of the present invention can be used in the display portion 822. The display apparatus of one embodiment of the present invention has an extremely high resolution; thus, the pixels are less likely to be perceived by a user and a more realistic image can be displayed.

Figure 27C:
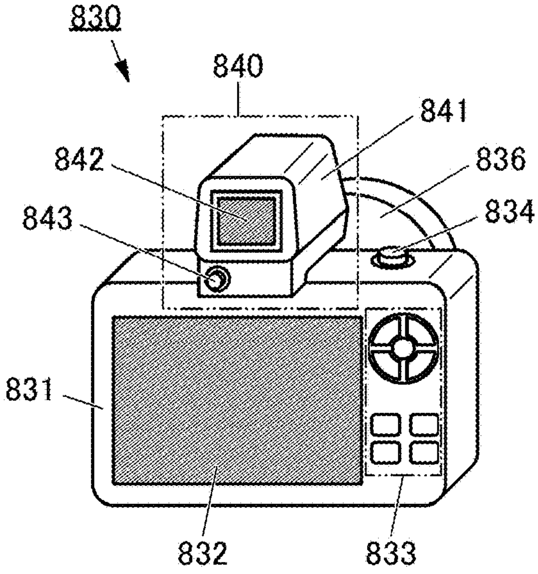

FIG. 27C illustrates an appearance of a camera 830 to which a finder 840 is attached.

The camera 830 includes a housing 831, a display portion 832, operation buttons 833, a shutter button 834, and the like. Furthermore, a detachable lens 836 is attached to the camera 830.

Although the lens 836 of the camera 830 here is detachable from the housing 831 for replacement, the lens 836 may be integrated with the housing.

The camera 830 can take images at the press of the shutter button 834. In addition, the display portion 832 has a function of a touch panel, and images can also be taken by the touch on the display portion 832.

The housing 831 of the camera 830 includes a mount including an electrode, so that the finder 840, a stroboscope, or the like can be connected to the housing.

The finder 840 includes a housing 841, a display portion 842, a button 843, and the like. The housing 841 includes a mount for engagement with the mount of the camera 830 so that the finder 840 can be attached to the camera 830. The mount includes an electrode, and a video or the like received from the camera 830 through the electrode can be displayed on the display portion 842.

The button 843 functions as a power button. The on/off state of the display portion 842 can be switched with the button 843.

The display apparatus of one embodiment of the present invention can be used in the display portion 832 of the camera 830 and the display portion 842 of the finder 840.

Although the camera 830 and the finder 840 are separate and detachable electronic devices in FIG. 27C, a finder including the display apparatus of one embodiment of the present invention may be built into the housing 831 of the camera 830.

Figure 27D:
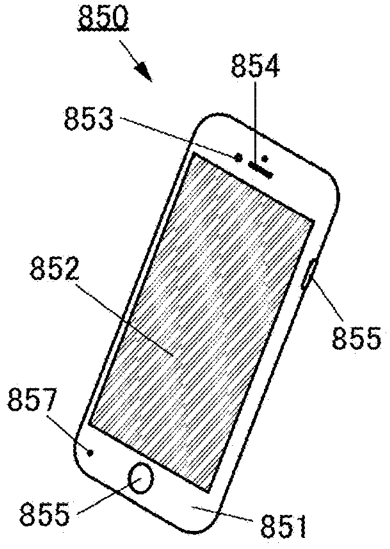

An information terminal 850 illustrated in FIG. 27D includes a housing 851, a display portion 852, a microphone 857, a speaker portion 854, a camera 853, an operation switch 855, and the like. The display apparatus of one embodiment of the present invention can be used in the display portion 852. The display portion 852 functions as a touch panel. The information terminal 850 also includes an antenna, a battery, and the like inside the housing 851. The information terminal 850 can be used as, for example, a smartphone, a mobile phone, a tablet information terminal, a tablet personal computer, an e-book reader, or the like.

Figure 27E:
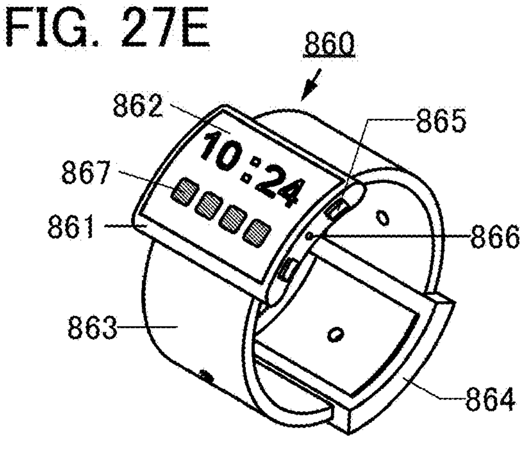

FIG. 27E illustrates an example of a watch-type information terminal. An information terminal 860 includes a housing 861, a display portion 862, a band 863, a buckle 864, an operation switch 865, an input/output terminal 866, and the like. In addition, the information terminal 860 includes an antenna, a battery, and the like inside the housing 861. The information terminal 860 is capable of executing a variety of applications such as mobile phone calls, e-mailing, viewing and editing texts, music reproduction, Internet communication, and a computer game.

In addition, the display portion 862 includes a touch sensor, and operation can be performed by touching the screen with a finger, a stylus, or the like. For example, with a touch on an icon 867 displayed on the display portion 862, an application can be started. The operation switches 865 can have a variety of functions such as time setting, power on/off operation, on/off operation of wireless communication, setting and cancellation of a silent mode, and setting and cancellation of a power saving mode. For example, the functions of the operation switches 865 can be set by the operation system incorporated in the information terminal 860.

The information terminal 860 can execute near field communication conformable to a communication standard. For example, mutual communication between the information terminal 860 and a headset capable of wireless communication enables hands-free calling. The information terminal 860 includes an input/output terminal 866, and can perform data transmission and reception with another information terminal through the input/output terminal 866. In addition, charging can be performed via the input/output terminal 866. Note that the charging operation may be performed by wireless power feeding without using the input/output terminal 866.

Figure 27F:
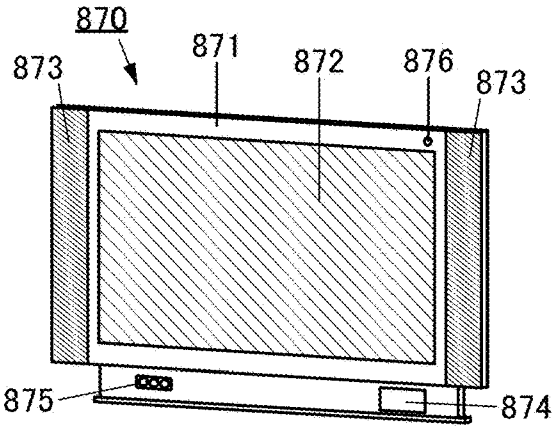

FIG. 27F is a perspective view illustrating a television device 870. The television device 870 includes a housing 871, a display portion 872, a speaker 873, an operation key 874 (including a power source switch or an operation switch), a connection terminal 875, a sensor 876 (having a function of measuring a distance, light, temperature, or the like), and the like. The display apparatus of one embodiment of the present invention can be used in the display portion 872. The display portion 872 of the television device 870 can include the display apparatus of, for example, 50 inches or more or 100 inches or more.

This embodiment can be implemented in an appropriate combination with the structures described in the other embodiments and the like.

REFERENCE NUMERALS

100: display apparatus, 111: substrate, 112: insulating layer, 113: insulating layer, 114: insulating layer, 115: insulating layer, 116: insulating layer, 117: electrode, 118: conductive layer, 119: wiring, 121: substrate, 122: insulating layer, 124: FPC, 126: protective layer, 131: coloring layer, 132: light-blocking layer, 133: insulating layer, 138: connection layer, 139: insulating layer, 142: adhesive layer, 151: element substrate, 161: opening, 170: light-emitting element This application is based on Japanese Patent Application Serial No. 2021-004491 filed on Jan. 14, 2021, and Japanese Patent Application Serial No. 2021-004502 filed on Jan. 14, 2021, the entire contents of each are hereby incorporated herein by reference.

The invention claimed is:

1. A light-emitting element comprising:
an anode;
an EL layer over the anode;
a cathode over the EL layer;
a first insulating layer over the cathode;
a first layer adjacent to a side surface of the EL layer and a top surface of the first insulating layer; and
a first portion adjacent to the side surface of the EL layer with the first layer provided therebetween,
wherein the first layer comprises a first region in contact with a top surface of the anode and a second region in contact with a side surface of the anode,
wherein an angle θ between a bottom surface and the side surface of the EL layer is larger than 90°,
wherein a refractive index of the first portion is lower than a refractive index of the first layer, and
wherein the first insulating layer comprises at least one of silicon oxide, silicon nitride oxide, aluminum oxide, and an oxide semiconductor.

2. The light-emitting element according to claim 1, wherein the angle θ is larger than 90° and smaller than or equal to 135°.

3. The light-emitting element according to claim 1, wherein the first portion comprises a Group 18 element, nitrogen, oxygen, or fluorine.

4. The light-emitting element according to claim 1, wherein the light-emitting element is configured to emit light from a cathode side.

5. A display apparatus comprising:
a plurality of light-emitting elements; and
a plurality of transistors,
wherein one of the plurality of light-emitting elements is the light-emitting element according to claim 1.

6. An electronic device comprising:
the display apparatus according to claim 5; and
at least one of an antenna, a battery, and a sensor.

7. A light-emitting element comprising:
an anode;
an EL layer over the anode;
a cathode over the EL layer;
a first insulating layer over the cathode;
a first layer adjacent to a side surface of the EL layer and a top surface of the first insulating layer;
a first portion adjacent to the side surface of the EL layer with the first layer provided therebetween; and
a substrate,
wherein the first layer comprises a first region in contact with a top surface of the anode and a second region in contact with a side surface of the anode,
wherein the substrate is provided with a second insulating layer, a coloring layer, a light-blocking layer, and a third insulating layer,
wherein an angle θ between a bottom surface and the side surface of the EL layer is larger than 90°,
wherein a refractive index of the first portion is lower than a refractive index of the first layer, and
wherein the first insulating layer comprises at least one of silicon oxide, silicon nitride oxide, aluminum oxide, and an oxide semiconductor.

* * * * *